(12) United States Patent
Bellman et al.

(10) Patent No.: US 11,630,244 B2
(45) Date of Patent: Apr. 18, 2023

(54) COATINGS OF NON-PLANAR SUBSTRATES AND METHODS FOR THE PRODUCTION THEREOF

(71) Applicant: CORNING INCORPORATED, Corning, NY (US)

(72) Inventors: Robert Alan Bellman, Ithaca, NY (US); Shandon Dee Hart, Elmira, NY (US); Karl William Koch, III, Elmira, NY (US); Carlo Anthony Kosik Williams, Painted Post, NY (US); Charles Andrew Paulson, Painted Post, NY (US); James Joseph Price, Corning, NY (US)

(73) Assignee: Corning Incorporated, Corning, NY (US)

( * ) Notice: Subject to any disclaimer, the term of this patent is extended or adjusted under 35 U.S.C. 154(b) by 336 days.

(21) Appl. No.: 17/018,624

(22) Filed: Sep. 11, 2020

(65) Prior Publication Data

US 2021/0003744 A1 Jan. 7, 2021

Related U.S. Application Data

(63) Continuation of application No. 15/646,288, filed on Jul. 11, 2017, now Pat. No. 10,802,179.
(Continued)

(51) Int. Cl.
*G02B 1/11* (2015.01)
*G02B 1/14* (2015.01)
(Continued)

(52) U.S. Cl.
CPC .......... *G02B 1/14* (2015.01); *B29D 11/00865* (2013.01); *C03C 17/3435* (2013.01);
(Continued)

(58) Field of Classification Search
CPC .. G02B 1/14; G02B 1/11; G02B 1/115; C03C 2217/734; C03C 2217/78; B32B 2307/408
See application file for complete search history.

(56) References Cited

U.S. PATENT DOCUMENTS

| 5,811,191 A | 9/1998 | Neuman |
| 7,426,328 B2 | 9/2008 | Zhou et al. |

(Continued)

FOREIGN PATENT DOCUMENTS

| CN | 105593705 A | 5/2016 |
| JP | 2016-519340 A | 6/2016 |

(Continued)

OTHER PUBLICATIONS

Japanese Patent Application No. 2019-500803, Office Action dated Jul. 8, 2021, 8 pages (4 pages of English Translation and 4 pages of Original Document), Japanese Patent Office.
(Continued)

*Primary Examiner* — Joanna Pleszczynska
(74) *Attorney, Agent, or Firm* — William J. Tucker

(57) ABSTRACT

A coated article is described herein that may comprise a substrate and an optical coating. The substrate may have a major surface comprising a first portion and a second portion. A first direction that is normal to the first portion of the major surface may not be equal to a second direction that is normal to the second portion of the major surface. The optical coating may be disposed on at least the first portion and the second portion of the major surface. The coated article may exhibit at the first portion of the substrate and at the second portion of the substrate hardness of about 8 GPa or greater at an indentation depth of about 50 nm or greater as measured on the anti-reflective surface by a Berkovich Indenter Hardness Test.

18 Claims, 21 Drawing Sheets

Related U.S. Application Data

(60) Provisional application No. 62/360,687, filed on Jul. 11, 2016.

(51) Int. Cl.

| | | |
|---|---|---|
| *G02B 1/115* | (2015.01) | |
| *C23C 14/08* | (2006.01) | |
| *C23C 14/10* | (2006.01) | |
| *G02B 5/28* | (2006.01) | |
| *C03C 21/00* | (2006.01) | |
| *C03C 17/34* | (2006.01) | |
| *C23C 14/22* | (2006.01) | |
| *B29D 11/00* | (2006.01) | |
| *C23C 14/00* | (2006.01) | |
| *C23C 14/34* | (2006.01) | |
| *C23C 14/35* | (2006.01) | |

(52) U.S. Cl.
CPC ........ *C03C 21/002* (2013.01); *C23C 14/0047* (2013.01); *C23C 14/0078* (2013.01); *C23C 14/08* (2013.01); *C23C 14/081* (2013.01); *C23C 14/082* (2013.01); *C23C 14/10* (2013.01); *C23C 14/225* (2013.01); *G02B 1/115* (2013.01); *G02B 5/28* (2013.01); *C03C 2217/734* (2013.01); *C03C 2217/78* (2013.01); *C03C 2217/91* (2013.01); *C23C 14/083* (2013.01); *C23C 14/34* (2013.01); *C23C 14/352* (2013.01)

(56) References Cited

U.S. PATENT DOCUMENTS

| | | | |
|---|---|---|---|
| 8,312,739 B2 | 11/2012 | Lee et al. | |
| 8,561,429 B2 | 10/2013 | Allan et al. | |
| 9,359,261 B2 | 6/2016 | Bellman et al. | |
| 9,588,263 B2 | 3/2017 | Gollier et al. | |
| 9,703,010 B2 | 7/2017 | Paulson et al. | |
| 9,703,011 B2 | 7/2017 | Adib et al. | |
| 2007/0285776 A1 | 12/2007 | Nakamura et al. | |
| 2010/0271699 A1 | 10/2010 | Chang et al. | |
| 2012/0212890 A1* | 8/2012 | Hoshino | H04M 1/0266 361/679.01 |
| 2013/0038939 A1* | 2/2013 | Walker, Jr. | G02B 5/0242 359/601 |
| 2014/0093711 A1 | 4/2014 | Paulson | |
| 2014/0113083 A1 | 4/2014 | Lee et al. | |
| 2014/0334006 A1 | 11/2014 | Adib et al. | |
| 2014/0335330 A1* | 11/2014 | Bellman | C04B 35/597 428/428 |
| 2014/0377522 A1 | 12/2014 | Koch et al. | |
| 2015/0322270 A1 | 11/2015 | Amin et al. | |
| 2015/0323705 A1 | 11/2015 | Hart et al. | |
| 2016/0083835 A1 | 3/2016 | Adib et al. | |
| 2017/0269266 A1 | 9/2017 | Adib et al. | |

FOREIGN PATENT DOCUMENTS

| | | |
|---|---|---|
| KR | 10-2015-0042123 A | 4/2015 |
| TW | 201520585 A | 6/2015 |
| TW | 201546480 A | 12/2015 |
| WO | 2014/182639 A1 | 11/2014 |
| WO | 2015/125929 A1 | 8/2015 |
| WO | 2015/171651 A1 | 11/2015 |
| WO | 2016/018490 A1 | 2/2016 |

OTHER PUBLICATIONS

Chinese Patent Application No. 201780043406.X, Office Action dated Feb. 20, 2021, 24 pages (English Translation Only); Chinese Patent Office.
English Translation of CN201780043406.X Office Action dated Jun. 10, 2020; 26 Pages; Chinese Patent Office.
Invitation to Pay Additional Fees; PCT/US2017/041328; dated Oct. 16, 2017; 9 Pages; European Patent Office.
Oliver et al; "An Improved Technique for Determining Hardness and Elastic Modulus Using Load and Displacement Sensing Indentation Experiments"; J. Mater. Res., vol. 7, No. 6, 1992, p. 1564-1583.
Oliver et al; "Measurement of Hardness and Elastic Modulus by Instrument Indentation: Advances in Understanding ANS Refinements to Methodology"; J. Mater. Res., vol. 19, No. 1, 2004, pp. 3-20.
Southwell, "Coating Design Using Very Thin High-and Low-Index Layers," Applied Optics, vol. 24, Issue 4, pp. 457, (1985).
Wikipedia "Samsung Galaxy Note Edge"; 4 Pages; Mar. 1, 2015.
Korean Patent Application No. 10-2019-7003621, Office Action, dated Oct. 21, 2021, 13 pages (7 pages of English Translation and 6 pages of Original Document), Korean Patent Office.
Taiwanese Patent Application No. 106123160, Office Action dated Mar. 9, 2021, 3 pages (English Translation Only); Taiwanese Patent Office.

* cited by examiner

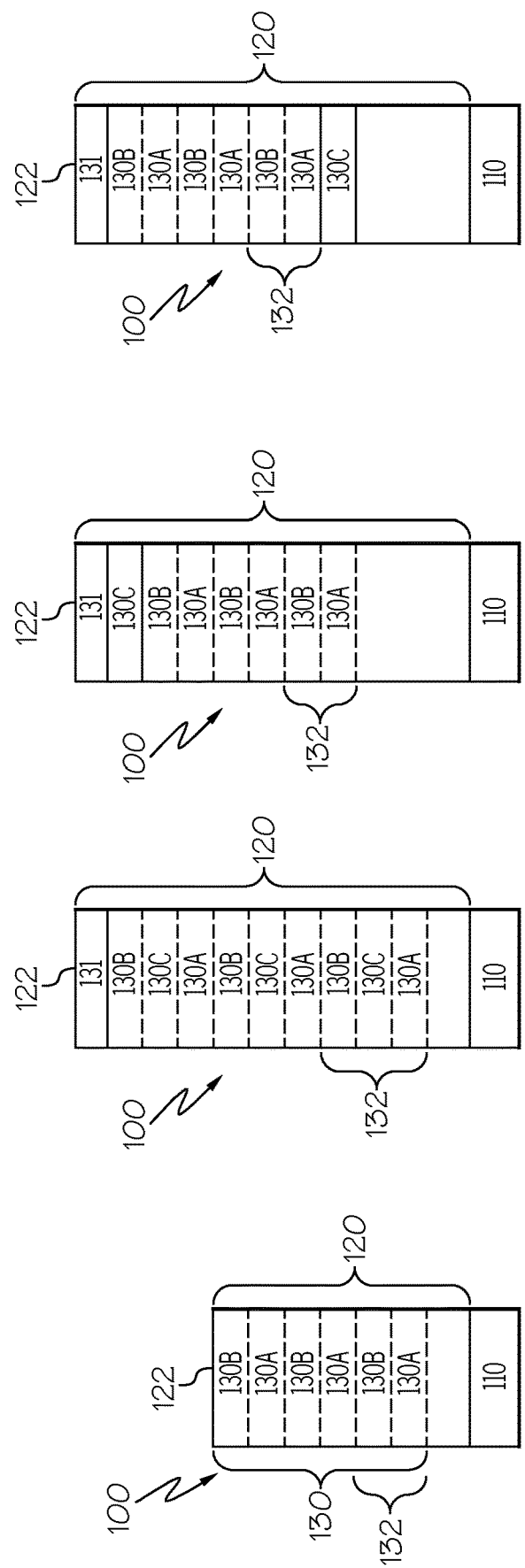

COATINGS OF NON-PLANAR SUBSTRATES AND METHODS FOR THE PRODUCTION THEREOF

CLAIM OF PRIORITY

This application is a continuation application of U.S. patent application Ser. No. 15/646,288, filed Jul. 11, 2017, now U.S. Pat. No. 10,802,179, which claims the benefit of priority to U.S. Provisional Application Ser. No. 62/360,687 filed on Jul. 11, 2016; the entire contents of each of these documents are hereby incorporated herein by reference for all purposes.

FIELD

This disclosure relates to durable and/or scratch-resistant articles and methods for making the same and, more particularly, to durable and/or scratch-resistant optical coatings on non-planar substrates.

TECHNICAL BACKGROUND

Cover articles are often used to protect critical devices within electronic products, to provide a user interface for input and/or display, and/or many other functions. Such products include mobile devices, such as smart phones, mp3 players, and computer tablets. Cover articles also include architectural articles, transportation articles (e.g., articles used in automotive applications, trains, aircraft, sea craft, etc.), appliance articles, or any article that requires some transparency, scratch-resistance, abrasion resistance, or a combination thereof. These applications often demand scratch-resistance and strong optical performance characteristics, in terms of maximum light transmittance and minimum reflectance. Furthermore, some cover applications require that the color exhibited or perceived, in reflection and/or transmission, does not change appreciably as the viewing angle is changed. In display applications, this is because, if the color in reflection or transmission changes with viewing angle to an appreciable degree, the user of the product will perceive a change in color or brightness of the display, which can diminish the perceived quality of the display. In other applications, changes in color may negatively impact the aesthetic requirements or other functional requirements.

The optical performance of cover articles can be improved by using various anti-reflective coatings; however known anti-reflective coatings are susceptible to wear or abrasion. Such abrasion can compromise any optical performance improvements achieved by the anti-reflective coating. For example, optical filters are often made from multilayer coatings having differing refractive indices and made from optically transparent dielectric material (e.g., oxides, nitrides, and fluorides). Most of the typical oxides used for such optical filters are wide band-gap materials, which do not have the requisite mechanical properties, such as hardness, for use in mobile devices, architectural articles, transportation articles or appliance articles. Nitrides and diamond-like coatings may exhibit high hardness values but such materials typically do not exhibit the transmittance needed for such applications.

Abrasion damage can include reciprocating sliding contact from counter face objects (e.g., fingers). In addition, abrasion damage can generate heat, which can degrade chemical bonds in the film materials and cause flaking and other types of damage to the cover glass. Since abrasion damage is often experienced over a longer term than the single events that cause scratches, the coating materials disposed experiencing abrasion damage can also oxidize, which further degrades the durability of the coating.

Known anti-reflective coatings are also susceptible to scratch damage and, often, even more susceptible to scratch damage than the underlying substrates on which such coatings are disposed. In some instances, a significant portion of such scratch damage includes microductile scratches, which typically include a single groove in a material having extended length and with depths in the range from about 100 nm to about 500 nm. Microductile scratches may be accompanied by other types of visible damage, such as sub-surface cracking, frictive cracking, chipping and/or wear. Evidence suggests that a majority of such scratches and other visible damage is caused by sharp contact that occurs in a single contact event. Once a significant scratch appears on the cover substrate, the appearance of the article is degraded since the scratch causes an increase in light scattering, which may cause significant reduction in brightness, clarity and contrast of images on the display. Significant scratches can also affect the accuracy and reliability of articles including touch sensitive displays. Single event scratch damage can be contrasted with abrasion damage. Single event scratch damage is not caused by multiple contact events, such as reciprocating sliding contact from hard counter face objects (e.g., sand, gravel and sandpaper), nor does it typically generate heat, which can degrade chemical bonds in the film materials and cause flaking and other types of damage. In addition, single event scratching typically does not cause oxidization or involve the same conditions that cause abrasion damage and therefore, the solutions often utilized to prevent abrasion damage may not also prevent scratches. Moreover, known scratch and abrasion damage solutions often compromise the optical properties.

Some electronics incorporate non-planar cover articles. For example, some smart phone touch screens may be non-planar, where at least a portion of the cover article is curved on its surface. With the incorporation of non-planar articles, optical performance of coatings on cover articles may be altered. For example, a coating will be viewed at two different angles on different portions of a substrate if the substrate is curved. Accordingly, there is a need for non-planar cover articles, and methods for their manufacture, which are abrasion resistant, scratch-resistant, and/or have improved optical performance.

SUMMARY

According to one embodiment, a coated article may comprise a substrate and an optical coating. The substrate may have a major surface comprising a first portion and a second portion. A first direction that is normal to the first portion of the major surface may not be equal to a second direction that is normal to the second portion of the major surface. The angle between the first direction and the second direction may be in a range of from about 10 degrees to about 180 degrees. The optical coating may be disposed on at least the first portion and the second portion of the major surface. The optical coating may from an anti-reflective surface. The coated article may exhibit at the first portion of the substrate and at the second portion of the substrate hardness of about 8 GPa or greater at an indentation depth of about 50 nm or greater as measured on the anti-reflective surface by a Berkovich Indenter Hardness Test. The coated article may exhibit a single side average light reflectance as measured at the anti-reflective surface at the first portion of the substrate of about 8% or less, wherein the single side average light reflectance of the first portion is measured at a first incident illumination angle relative to the first direction. The first incident illumination angle may comprise an angle in the range from about 0 degrees to about 60 degrees from the first direction. The coated article may exhibit a single-side average light reflectance as measured at the anti-reflective surface at the second portion of the substrate of about 8% or less, wherein the single side average light reflectance of the second portion is measured at a second incident illumination angle relative to the second direction. The second incident illumination angle may comprises an angle in the range from about 0 degrees to about 60 degrees from the second direction. The single side average light reflectance at the first portion and at the second portion may be measured over an optical wavelength regime in a range of from about 400 nm to about 800 nm.

According to another embodiment, a coated article may comprise a substrate and an optical coating. The substrate may have a major surface comprising a first portion and a second portion. A first direction that is normal to the first portion of the major surface may not be equal to a second direction that is normal to the second portion of the major surface. The angle between the first direction and the second direction may be in a range of from about 10 degrees to about 80 degrees. The optical coating may be disposed on at least the first portion and the second portion of the major surface. The optical coating may from an anti-reflective surface. The coated article may exhibit at the first portion of the substrate and at the second portion of the substrate hardness of about 8 GPa or greater at an indentation depth of about 50 nm or greater as measured on the anti-reflective surface by a Berkovich Indenter Hardness Test. The difference in reflected color of the coated article between the first portion of the substrate and the second portion of the substrate may be less than or equal to about 10 as measured by the reflectance color coordinates in the (L*, a*, b*) colorimetry system under an International Commission on Illumination illuminant. The difference in reflected color may be defined as $\sqrt{((a^*_{first\ portion} - a^*_{second\ portion})^2 + (b^*_{first\ portion} - b^*_{second\ portion})^2)}$. The reflected color at the first portion may be measured at a first incident illumination angle relative to the first direction, wherein the first incident illumination angle comprises an angle in the range from about 0 degrees to about 60 degrees from the first direction. The reflected color at the second portion may be measured at a second incident illumination angle relative to the second direction, wherein the second incident illumination angle comprises an angle in a range from about 0 degrees to about 60 degrees from the second direction.

According to another embodiment, a coated article may comprise a substrate and an optical coating. The substrate may have a major surface comprising a first portion and a second portion. A first direction that is normal to the first portion of the major surface may not be equal to a second direction that is normal to the second portion of the major surface. The angle between the first direction and the second direction may be in a range of from about 10 degrees to about 180 degrees. The optical coating may be disposed on at least the first portion and the second portion of the major surface. The optical coating may from an anti-reflective surface. The coated article may exhibit at the first portion of the substrate and at the second portion of the substrate hardness of about 8 GPa or greater at an indentation depth of about 50 nm or greater as measured on the anti-reflective surface by a Berkovich Indenter Hardness Test. The difference in reflected color of the coated article between the first portion of the substrate and the second portion of the substrate may be less than or equal to about 10 as measured by the reflectance color coordinates in the (L*, a*, b*) colorimetry system under an International Commission on Illumination illuminant. The difference in reflected color may be defined as $\sqrt{((a^*_{first\ portion} - a^*_{second\ portion})^2 + (b^*_{first\ portion} - b^*_{second\ portion})^2)}$. The reflected color at the first portion may be measured at a first incident illumination angle relative to the first direction, wherein the first incident illumination angle comprises an angle in the range from about 0 degrees to about 60 degrees from the first direction. The reflected color at the second portion may be measured at a second incident illumination angle, wherein the second incident illumination angle may be in a direction equal to the direction of the first incident illumination angle such that the reflected color at the first portion and at the second portion are measured in the same viewing direction.

According to another embodiment, a coated article may comprise an optical coating that may comprise a first gradient layer in contact with the substrate, a scratch-resistant layer over the first gradient layer, and a second gradient layer over the scratch-resistant layer which defines the anti-reflective surface. The refractive index of the first gradient layer at the substrate may be within 0.2 of the refractive index of the substrate. The refractive index of the first gradient layer at the scratch-resistant layer may be within 0.2 of the refractive index of the scratch-resistant layer. The refractive index of the second gradient layer at the scratch-resistant layer may be within 0.2 of the refractive index of the scratch-resistant layer. The refractive index of the second gradient layer at the anti-reflective surface may be from about 1.35 to about 1.7.

According to yet another embodiment, a coated article may comprise an optical coating that may comprise a first anti-reflective coating, a scratch-resistant layer over the first anti-reflective coating, and a second anti-reflective coating over the scratch-resistant layer which defines the anti-reflective surface. The first anti-reflective coating may comprise at least a low refractive index ("RI") layer and a high RI layer, and the second anti-reflective coating may comprise at least a low RI layer and a high RI layer.

According to yet another embodiment, a coated article may comprise an optical coating that may comprise a gradient layer in contact with the substrate, a scratch-resistant layer over the gradient layer, and an anti-reflective coating over the scratch-resistant layer which defines the anti-reflective surface. The refractive index of the gradient layer at the substrate may be within 0.2 of the refractive index of the substrate. The refractive index of the gradient layer at the scratch-resistant layer may be within 0.2 of the refractive index of the scratch-resistant layer. The anti-reflective coating may comprise at least a low RI layer and a high RI layer.

According to yet another embodiment, a coated article may comprise an optical coating that may comprise an anti-reflective coating in contact with the substrate, a scratch-resistant layer over the first gradient layer, and a gradient layer over the scratch-resistant layer which defines the anti-reflective surface. The anti-reflective coating may comprise at least a low RI layer and a high RI layer. The refractive index of the gradient layer at the scratch-resistant layer may be within 0.2 of the refractive index of the scratch-resistant layer. The refractive index of the second gradient layer at the anti-reflective surface may be from about 1.35 to about 1.7.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 2 is a cross-sectional side view of a coated article, according to one or more embodiments described herein;

FIG. 3 is a cross-sectional side view of a coated article, according to one or more embodiments described herein;

FIG. 4 is a cross-sectional side view of a coated article, according to one or more embodiments described herein;

FIG. 5 is a cross-sectional side view of a coated article, according to one or more embodiments described herein;

DETAILED DESCRIPTION

Figure 1:
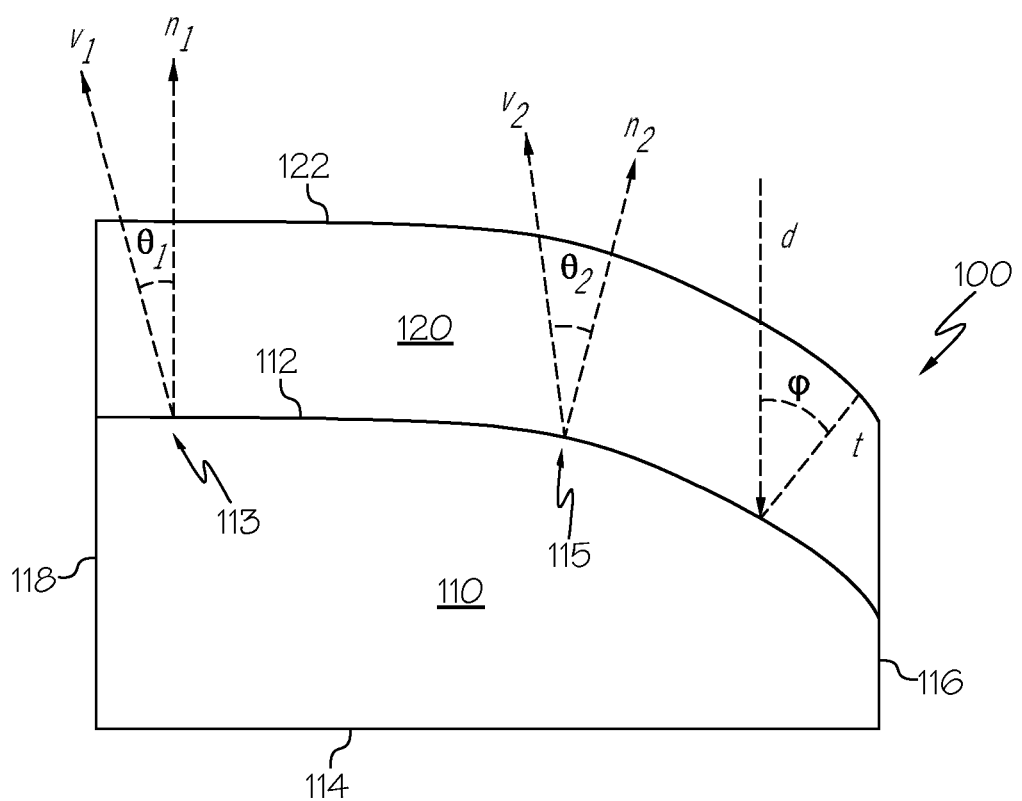
FIG. 1 is a cross-sectional side view of a coated article, according to one or more embodiments described herein.

Reference will now be made in detail to various embodiments of coated articles, examples of which are illustrated in the accompanying drawings. Referring to FIG. 1, a coated article 100, according to one or more embodiments disclosed herein, may include a non-planar substrate 110, and an optical coating 120 disposed on the substrate. The non-planar substrate 110 may include opposing major surfaces 112, 114 and opposing minor surfaces 116, 118. The optical coating 120 is shown in FIG. 1 as being disposed on a first opposing major surface 112; however, the optical coating 120 may be disposed on the second opposing major surface 114 and/or one or both of the opposing minor surfaces, in addition to or instead of being disposed on the first opposing major surface 112. The optical coating 120 forms an anti-reflective surface 122. The anti-reflective surface 122 forms an air-interface and generally defines the edge of the optical coating 120 as well as the edge of the overall coated article 100 The substrate 110 may be substantially transparent, as described herein.

According to the embodiments described herein, the substrate 110 is non-planar. As used herein, non-planar substrates refer to substrates where at least one of the major surfaces 112, 114 of the substrate 110 is not geometrically flat in shape. For example, as shown in FIG. 1, a portion of major surface 112 may comprise a curved geometry. The degree of curvature of a major surface 112 may vary. For example, embodiments may have a curvature measured by an approximate radius of about 1 mm to several meters (i.e., nearly planar), such as from about 3 mm to about 30 mm, or from about 5 mm to about 10 mm. In embodiments, the non-planar substrate may comprise planar portions, as shown in FIG. 1. For example, a touch screen for a portable electronic device may comprise a substantially planar surface at or near its center and curved (i.e., non-planar) portions around its edges. Examples of such substrates include the cover glass from an Apple iPhone 6 smartphone or a Samsung Galaxy S6 Edge smartphone. While some embodiments of non-planar substrates are depicted, it should be understood that non-planar substrates may take on a wide variety of shapes, such as curved sheets or even tubular sheets.

The non-planar substrate 110 comprises a major surface 112 which comprises at least two portions, a first portion 113 and a second portion 115, which are not flat relative to one another. A direction $n_1$ is normal to the first portion 113 of major surface 112 and a direction $n_2$ is normal to the second portion 115 of major surface 112. The direction $n_1$ normal to the first portion 113 and the direction $n_2$ normal to the second portion 115 are not the same. In embodiments, the angle between $n_1$ and $n_2$ may be at least about 5 degrees, at least about 10 degrees, at least about 15 degrees, at least about 20 degrees, at least about 25 degrees, at least about 30 degrees, at least about 35 degrees, at least about 40 degrees, at least about 45 degrees, at least about 50 degrees, at least about 55 degrees, at least about 60 degrees, at least about 70 degrees, at least about 80 degrees, at least about 90 degrees, at least about 120 degrees, at least about 150 degrees, or even least about 180 degrees (e.g., the angle between $n_1$ and $n_2$ may be 180 degrees for a tubular substrate. For example, the angle between $n_1$ and $n_2$ may be in a range from about 10 degrees to about 30 degrees, from about 10 degrees to about 45 degrees, from about 10 degrees to about 60 degrees, from about 10 degrees to about 75 degrees, from about 10 degrees to about 90 degrees, from about 10 degrees to about 120 degrees, from about 10 degrees to about 150 degrees, or from about 10 degrees to about 180 degrees. In additional embodiments, the angle between $n_1$ and $n_2$ may be in a range from about 10 degrees to about 80 degrees, from about 20 degrees to about 80 degrees, from about 30 degrees to about 80 degrees, from about 40 degrees to about 80 degrees, from about 50 degrees to about 80 degrees, from about 60 degrees to about 80 degrees, from about 70 degrees to about 80 degrees, from about 20 degrees to about 180 degrees, from about 30 degrees to about 180 degrees, from about 40 degrees to about 180 degrees, from about 50 degrees to about 180 degrees, from about 60 degrees to about 180 degrees, from about 70 degrees to about 150 degrees, or from about 80 degrees to about 180 degrees.

Light transmitted through or reflected by the coated article 100 may be measured in a viewing direction v (i.e., $v_1$ for $n_1$, and $v_2$ for $n_2$), as shown in FIG. 1, which may be non-normal to the major surface 112 of the substrate 110. The viewing direction may be referred to as an incident illumination angle as measured from the normal at each surface. For example, and as will be explained herein, reflected color, transmitted color, average light reflectance, average light transmission, photopic reflectance, and photopic transmission. The viewing direction v defines an incident illumination angle θ which is the angle between the direction normal to a substrate surface n and the viewing direction v (i.e., $θ_1$ is the incident illumination angle between normal direction $n_1$ and viewing direction $v_1$, and $θ_2$ is the incident illumination angle between normal direction $n_2$ and viewing direction $v_2$) It should be understood that while FIG. 1 depicts incident illumination angles that are not equal to 0 degrees, in some embodiments, the incident illumination angle may be equal to about 0 degrees such that the v is equal to n.

Optical properties of a portion of the coated article 100 may be different when varying the incident illumination angle θ.

Still referring to FIG. 1, in some embodiments, the thickness of the optical coating 120, as measured in the direction normal to the substrate major surface 112, may differ between portions of the optical coating 120 disposed over the first portion 113 and the second portion 115 of the substrate 110. For example, the optical coating 120 may be deposited onto the non-planar substrate 110 by a vacuum deposition technique such as, for example, chemical vapor deposition (e.g., plasma enhanced chemical vapor deposition (PECVD), low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition. Liquid-based methods may also be used such as spraying, dipping, spin coating, or slot coating (for example, using sol-gel materials). Generally, vapor deposition techniques may include a variety of vacuum deposition methods which can be used to produce thin films. For example, physical vapor deposition uses a physical process (such as heating or sputtering) to produce a vapor of material, which is then deposited on the object which is coated. Such vapor deposition methods may utilize a "line-of-sight" deposition scheme, where deposited materials move in a uniform direction during deposition onto the substrate regardless of the angle between the deposition direction and the angle normal to the substrate surface.

Referring to FIG. 1, arrow d shows a line-of-sight deposition direction. The deposition direction d in FIG. 1 is normal to major surface 114 of the substrate 110, such as may be common in a system where the substrate rests on major surface 114 during deposition of the optical coating 120. The arrow of line d points in the direction of the line-of-sight deposition. Line t shows the direction normal to the major surface 112 of the substrate 110. The normal thickness of the optical coating 120, as measured in the direction normal to the major surface 112 is represented by the length of line t. The deposition angle φ is defined as the angle between the deposition direction d and the direction normal to the major surface d. If the optical coating 120 is deposited with a theoretical line-of-sight deposition, the thickness of a portion of the optical coating 120 can be determined as the cosine of φ. Thus, as φ increases, the thickness of the optical coating 120 decreases. While the actual thickness of optical coatings 120 deposited by vapor deposition may be different from that determined by the scalar of cosine φ, it provides an estimate useful for modeling optical coating designs which may have good performance when applied onto non-planar substrates 110. Additionally, while $n_1$ and d are in the same direction in FIG. 1, they need not be in the same direction in all embodiments.

It should be understood that throughout this disclosure, unless specified otherwise, thickness of the optical coating 120 is measured in the normal direction n.

According to embodiments, as described herein, various portions of the coated article 100 may have optical characteristics such as light reflectivity, light transmittance, reflective color, and/or transmitted color, which appear similar to one another. For example, the optical characteristics at the first portion 113 may be similar to those at the second portion 115 when each is viewed in a direction about normal to the substrate 110 at the respective portion 113, 115 (i.e., $\theta_1$ is equal to about 0 and $\theta_2$ is equal to about 0). In other embodiments, the optical characteristics at the first portion 113 may be similar to those at the second portion 115 when each is viewed at an incident illumination angle in a specified range relative normal at the respective portion 113, 115 (e.g., $\theta_1$ is from about 0 degrees to about 60 degrees and $\theta_2$ is from about 0 degrees to about 60 degrees). In additional embodiments, the optical characteristics at the first portion 113 may be similar to those at the second portion 115 when each is viewed in about the same direction (e.g., the angle between $_{v1}$ and $_{v2}$ is about equal to 0 degrees).

The optical coating 120 includes at least one layer of at least one material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments a layer may include one or more contiguous and uninterrupted layers and/or one or more discontinuous and interrupted layers (i.e., a layer having different materials formed adjacent to one another). A layer or sub-layers may be formed by any known method in the art, including discrete deposition or continuous deposition processes. In one or more embodiments, the layer may be formed using only continuous deposition processes, or, alternatively, only discrete deposition processes.

The thickness of the optical coating 120 may be about 1 μm or greater in the direction of deposition while still providing an article that exhibits the optical performance described herein. In some examples, the optical coating thickness in the direction of deposition may be in the range from about 1 μm to about 20 μm (e.g., from about 1 μm to about 10 μm, or from about 1 μm to about 5 μm).

As used herein, the term "dispose" includes coating, depositing and/or forming a material onto a surface using any known method in the art. The disposed material may constitute a layer, as defined herein. The phrase "disposed on" includes the instance of forming a material onto a surface such that the material is in direct contact with the surface and also includes the instance where the material is formed on a surface, with one or more intervening material(s) is between the disposed material and the surface. The intervening material(s) may constitute a layer, as defined herein. Additionally, it should be understood that while FIGS. 2-8 schematically depict planar substrates, FIGS. 2-8 should be considered as having non-planar substrates such as shown in FIG. 1, and are depicted as planar to simplify the conceptual teachings of the respective figures.

As shown in FIG. 2, the optical coating 120 may include an anti-reflective coating 130, which may include a plurality of layers (130A, 130B). In one or more embodiments, the anti-reflective coating 130 may include a period 132 comprising two or more layers. In one or more embodiments, the two or more layers may be characterized as having different refractive indices from each another. In one embodiment, the period 132 includes a first low RI layer 130A and a second high RI layer 130B. The difference in the refractive index of the first low RI layer and the second high RI layer may be about 0.01 or greater, about 0.05 or greater, about 0.1 or greater, or even about 0.2 or greater.

As shown in FIG. 2, the anti-reflective coating 130 may include a plurality of periods 132. A single period 132 may include a first low RI layer 130A and a second high RI layer 130B, such that when a plurality of periods 132 are provided, the first low RI layer 130A (designated for illustration as "L") and the second high RI layer 130B (designated for illustration as "H") alternate in the following sequence of layers: L/H/L/H or H/L/H/L, such that the first low RI layer 130A and the second high RI layer 130B appear to alternate along the physical thickness of the optical coating 120. In the example in FIG. 2, the anti-reflective coating 130 includes three periods 132. In some embodiments, the anti-reflective coating 130 may include up to 25 periods 132. For example, the anti-reflective coating 130 may include from about 2 to about 20 periods 132, from about 2 to about 15 periods 132, from about 2 to about 10 periods 132, from about 2 to about 12 periods 132, from about 3 to about 8 periods 132, or from about 3 to about 6 periods 132.

In the embodiment shown in FIG. 3, the anti-reflective coating 130 may include an additional capping layer 131, which may include a lower refractive index material than the second high RI layer 130B. In some embodiments, the period 132 may include one or more third layers 130C, as shown in FIG. 3. The third layer(s) 130C may have a low RI, a high RI or a medium RI. In some embodiments, the third layer(s) 130C may have the same RI as the first low RI layer 130A or the second high RI layer 130B. In other embodiments, the third layer(s) 130C may have a medium RI that is between the RI of the first low RI layer 130A and the RI of the second high RI layer 130B. Alternatively, the third layer(s) 130C may have a refractive index greater than the second high RI layer 130B. The third layer 130C may be provided in the optical coating 120 in the following exemplary configurations: $L_{third\ layer}$/H/L/H/L; $H_{third\ layer}$/L/H/L/H; L/H/L/H/$L_{third\ layer}$; H/L/H/L/H/$H_{third\ layer}$; $L_{third\ layer}$/H/L/H/L/$H_{third\ layer}$; $H_{third\ layer}$/L/H/L/H/L/$L_{third\ layer}$; $L_{third\ layer}$/L/H/L/H; $H_{third\ layer}$/H/L/H/L; H/L/H/L/$L_{third\ layer}$; L/H/L/H/$H_{third\ layer}$; $L_{third\ layer}$/L/H/L/H/$H_{third\ layer}$; $H_{third\ layer}$//H/L/H/L/$L_{third\ layer}$; L/M$_{third\ layer}$/H/L/M/H; H/M/L/H/M/L; M/L/H/L/M; as well as other combinations. In these configurations, "L" without any subscript refers to the first low RI layer and "H" without any subscript refers to the second high RI layer. Reference to "$L_{third\ sub-layer}$" refers to a third layer having a low RI, "$H_{third\ sub-layer}$" refers to a third layer having a high RI and "M" refers to a third layer having a medium RI, all relative to the first layer and the second layer.

As used herein, the terms "low RI", "high RI" and "medium RI" refer to the relative values for the RI to another (e.g., low RI<medium RI<high RI). In one or more embodiments, the term "low RI" when used with the first low RI layer or with the third layer, includes a range from about 1.3 to about 1.7 or 1.75. In one or more embodiments, the term "high RI" when used with the second high RI layer or with the third layer, includes a range from about 1.7 to about 2.5 (e.g., about 1.85 or greater). In some embodiments, the term "medium RI" when used with the third layer, includes a range from about 1.55 to about 1.8. In some instances, the ranges for low RI, high RI, and medium RI may overlap; however, in most instances, the layers of the anti-reflective coating 130 have the general relationship regarding RI of: low RI<medium RI<high RI.

Figure 6:
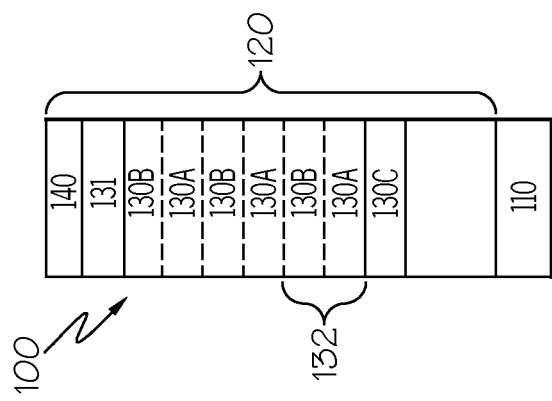
FIG. 6 is a cross-sectional side view of a coated article, according to one or more embodiments described herein.

The third layer(s) 130C may be provided as a separate layer from a period 132 and may be disposed between the period 132 or plurality of periods 132 and the capping layer 131, as shown in FIG. 4. The third layer(s) may also be provided as a separate layer from a period 132 and may be disposed between the substrate 110 and the plurality of periods 132, as shown in FIG. 5. The third layer(s) 130C may be used in addition to an additional coating 140 instead of the capping layer 131 or in addition to the capping layer 131, as shown in FIG. 6.

Materials suitable for use in the anti-reflective coating 130 include: $SiO_2$, $Al_2O_3$, $GeO_2$, SiO, $AlO_xN_y$, AlN, $SiN_x$, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, other materials cited below as suitable for use in a scratch-resistant layer, and other materials known in the art. Some examples of suitable materials for use in the first low RI layer include $SiO_2$, $Al_2O_3$, $GeO_2$, SiO, $AlO_xN_y$, $SiO_xN_y$, $Si_uAl_vO_xN_y$, MgO, $MgAl_2O_4$, $MgF_2$, $BaF_2$, $CaF_2$, $DyF_3$, $YbF_3$, $YF_3$, and $CeF_3$. The nitrogen content of the materials for use in the first low RI layer may be minimized (e.g., in materials such as $Al_2O_3$ and $MgAl_2O_4$). Some examples of suitable materials for use in the second high RI layer include $Si_uAl_vO_xN_y$, $Ta_2O_5$, $Nb_2O_5$, AlN, $Si_3N_4$, $AlO_xN_y$, $SiO_xN_y$, $SiN_x$, $SiN_x$:$H_y$, $HfO_2$, $TiO_2$, $ZrO_2$, $Y_2O_3$, $Al_2O_3$, $MoO_3$ and diamond-like carbon. In examples, the high RI layer may also be a high hardness layer or a scratch-resistant layer, and the high RI materials listed above may also comprise high hardness or scratch resistance. The oxygen content of the materials for the second high RI layer and/or the scratch-resistant layer may be minimized, especially in $SiN_x$ or $AlN_x$ materials. $AlO_xN_y$ materials may be considered to be oxygen-doped $AlN_x$, that is they may have an $AlN_x$ crystal structure (e.g. wurtzite) and need not have an AlON crystal structure. Exemplary $AlO_xN_y$ high RI materials may comprise from about 0 atom % to about 20 atom % oxygen, or from about 5 atom % to about 15 atom % oxygen, while including 30 atom % to about 50 atom % nitrogen. Exemplary $Si_uAl_vO_xN_y$ high RI materials may comprise from about 10 atom % to about 30 atom % or from about 15 atom % to about 25 atom % silicon, from about 20 atom % to about 40 atom % or from about 25 atom % to about 35 atom % aluminum, from about 0 atom % to about 20 atom % or from about 1 atom % to about 20 atom % oxygen, and from about 30 atom % to about 50 atom % nitrogen. The foregoing materials may be hydrogenated up to about 30% by weight. Where a material having a medium refractive index is desired, some embodiments may utilize AlN and/or $SiO_xN_y$. The hardness of the second high RI layer and/or the scratch-resistant layer may be characterized specifically. In some embodiments, the maximum hardness of the second high RI layer and/or a scratch-resistant layer, as measured by the Berkovich Indenter Hardness Test, may be about 8 GPa or greater, about 10 GPa or greater, about 12 GPa or greater, about 15 GPa or greater, about 18 GPa or greater, or about 20 GPa or greater. In some cases, the second high RI layer material may be deposited as a single layer and may be characterized as a scratch-resistant layer, and this single layer may have a thickness between about 500 and 2000 nm for repeatable hardness determination.

In one or more embodiments, at least one of the layer(s) of the anti-reflective coating 130 may include a specific optical thickness range. As used herein, the term "optical thickness" is determined by the sum of the physical thickness and the refractive index of a layer. In one or more embodiments, at least one of the layers of the anti-reflective coating 130 may include an optical thickness in the range from about 2 nm to about 200 nm, from about 10 nm to about 100 nm, from about 15 nm to about 100 nm, from about 15 to about 500 nm, or from about 15 to about 5000 nm. In some embodiments, all of the layers in the anti-reflective coating 130 may each have an optical thickness in the range from about 2 nm to about 200 nm, from about 10 nm to about 100 nm, from about 15 nm to about 100 nm, from about 15 to about 500 nm, or from about 15 to about 5000 nm. In some cases, at least one layer of the anti-reflective coating 130 has an optical thickness of about 50 nm or greater. In some cases, each of the first low RI layers have an optical thickness in the range from about 2 nm to about 200 nm, from about 10 nm to about 100 nm, from about 15 nm to about 100 nm, from about 15 to about 500 nm, or from about 15 to about 5000 nm. In other cases, each of the second high RI layers have an optical thickness in the range from about 2 nm to about 200 nm, from about 10 nm to about 100 nm, from about 15 nm to about 100 nm, from about 15 to about 500 nm, or from about 15 to about 5000 nm. In yet other cases, each of the third layers have an optical thickness in the range from about 2 nm to about 200 nm, from about 10 nm to about 100 nm, from about 15 nm to about 100 nm, from about 15 to about 500 nm, or from about 15 to about 5000 nm.

In some embodiments, the top-most air-side layer may comprise a high RI layer that also exhibits high hardness. In some embodiments, an additional coating 140 may be disposed on top of this top-most air-side high RI layer (e.g., the additional coating may include a low-friction coating, an oleophobic coating, or an easy-to-clean coating). The addition of a low RI layer having a very low thickness (e.g., about 10 nm or less, about 5 nm or less or about 2 nm or less) has minimal influence on the optical performance, when added to the top-most air-side layer comprising a high RI layer. The low RI layer having a very low thickness may include $SiO_2$, an oleophobic or low-friction layer, or a combination of $SiO_2$ and an oleophobic material. Exemplary low-friction layers may include diamond-like carbon, such materials (or one or more layers of the optical coating) may exhibit a coefficient of friction less than 0.4, less than 0.3, less than 0.2, or even less than 0.1.

In one or more embodiments, the anti-reflective coating 130 may have a physical thickness of about 800 nm or less. The anti-reflective coating 130 may have a physical thickness in the range from about 10 nm to about 800 nm, from about 50 nm to about 800 nm, from about 100 nm to about 800 nm, from about 150 nm to about 800 nm, from about 200 nm to about 800 nm, from about 10 nm to about 750 nm, from about 10 nm to about 700 nm, from about 10 nm to about 650 nm, from about 10 nm to about 600 nm, from about 10 nm to about 550 nm, from about 10 nm to about 500 nm, from about 10 nm to about 450 nm, from about 10 nm to about 400 nm, from about 10 nm to about 350 nm, from about 10 nm to about 300 nm, from about 50 to about 300, and all ranges and sub-ranges therebetween.

In one or more embodiments, the combined physical thickness of the second high RI layer(s) may be characterized. For example, in some embodiments, the combined thickness of the second high RI layer(s) may be about 100 nm or greater, about 150 nm or greater, about 200 nm or greater, or even about 500 nm or greater. The combined thickness is the calculated combination of the thicknesses of the individual high RI layer(s) in the anti-reflective coating 130, even when there are intervening low RI layer(s) or other layer(s). In some embodiments, the combined physical thickness of the second high RI layer(s), which may also comprise a high-hardness material (e.g., a nitride or an oxynitride material), may be greater than 30% of the total physical thickness of the anti-reflective coating. For example, the combined physical thickness of the second high RI layer(s) may be about 40% or greater, about 50% or greater, about 60% or greater, about 70% or greater, about 75% or greater, or even about 80% or greater, of the total physical thickness of the anti-reflective coating. Additionally or alternatively, the amount of the high refractive index material, which may also be a high-hardness material, included in the optical coating may be characterized as a percentage of the physical thickness of the upper most (i.e., user side or side of the optical coating opposite the substrate) 500 nm of the article or optical coating 120. Expressed as a percentage of the upper most 500 nm of the article or optical coating, the combined physical thickness of the second high RI layer(s) (or the thickness of the high refractive index material) may be about 50% or greater, about 60% or greater, about 70% or greater, about 80% or greater, or even about 90% or greater. In some embodiments, greater proportions of hard and high-index material within the anti-reflective coating can also simultaneously be made to also exhibit low reflectance, low color, and high abrasion resistance as further described elsewhere herein. In one or more embodiments, the second high RI layers may include a material having a refractive index greater than about 1.85 and the first low RI layers may include a material having a refractive index less than about 1.75. In some embodiments, the second high RI layers may include a nitride or an oxynitride material. In some instances, the combined thickness of all the first low RI layers in the optical coating (or in the layers that are disposed on the thickest second high RI layer of the optical coating) may be about 200 nm or less (e.g., about 150 nm or less, about 100 nm or less, about 75 nm or less, or about 50 nm or less).

The coated article 100 may include one or more additional coatings 140 disposed on the anti-reflective coating, as shown in FIG. 6. In one or more embodiments, the additional coating may include an easy-to-clean coating. An example of a suitable an easy-to-clean coating is described in U.S. patent application Ser. No. 13/690,904, entitled "PROCESS FOR MAKING OF GLASS ARTICLES WITH OPTICAL AND EASY-TO-CLEAN COATINGS," filed on Nov. 30, 2012, which is incorporated herein in its entirety by reference. The easy-to-clean coating may have a thickness in the range from about 5 nm to about 50 nm and may include known materials such as fluorinated silanes. The easy-to-clean coating may alternately or additionally comprise a low-friction coating or surface treatment. Exemplary low-friction coating materials may include diamond-like carbon, silanes (e.g. fluorosilanes), phosphonates, alkenes, and alkynes. In some embodiments, the easy-to-clean coating may have a thickness in the range from about 1 nm to about 40 nm, from about 1 nm to about 30 nm, from about 1 nm to about 25 nm, from about 1 nm to about 20 nm, from about 1 nm to about 15 nm, from about 1 nm to about 10 nm, from about 5 nm to about 50 nm, from about 10 nm to about 50 nm, from about 15 nm to about 50 nm, from about 7 nm to about 20 nm, from about 7 nm to about 15 nm, from about 7 nm to about 12 nm or from about 7 nm to about 10 nm, and all ranges and sub-ranges therebetween.

The additional coating 140 may include a scratch-resistant layer or layers. In some embodiments, the additional coating 140 includes a combination of easy-to-clean material and scratch-resistant material. In one example, the combination includes an easy-to-clean material and diamond-like carbon. Such additional coatings 140 may have a thickness in the range from about 5 nm to about 20 nm. The constituents of the additional coating 140 may be provided in separate layers. For example, the diamond-like carbon may be disposed as a first layer and the easy-to clean can be disposed as a second layer on the first layer of diamond-like carbon. The thicknesses of the first layer and the second layer may be in the ranges provided above for the additional coating. For example, the first layer of diamond-like carbon may have a thickness of about 1 nm to about 20 nm or from about 4 nm to about 15 nm (or more specifically about 10 nm) and the second layer of easy-to-clean may have a thickness of about 1 nm to about 10 nm (or more specifically about 6 nm). The diamond-like coating may include tetrahedral amorphous carbon (Ta—C), Ta—C:H, and/or a-C—H.

Figure 7:
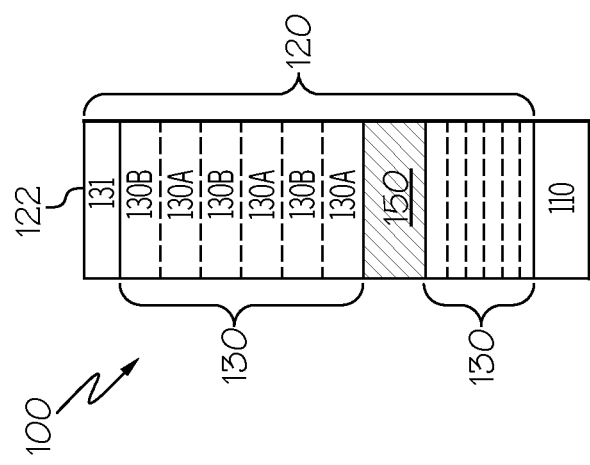
FIG. 7 is a cross-sectional side view of a coated article, according to one or more embodiments described herein.

As mentioned herein, the optical coating 120 may include a scratch-resistant layer 150, which may be disposed between the anti-reflective coating 130 and the substrate 110. In some embodiment, the scratch-resistant layer 150 is disposed between the layers of the anti-reflective coating 130 (such as 150 as shown in FIG. 7). The two sections of the anti-reflective coating (i.e., a first section disposed between the scratch-resistant layer 150 and the substrate 110, and a second section disposed on the scratch-resistant layer) may have a different thickness from one another or may have essentially the same thickness as one another. The layers of the two sections of the anti-reflective coating 130 may be the same in composition, order, thickness and/or arrangement as one another or may differ from one another.

Exemplary materials used in the scratch-resistant layer 150 (or the scratch-resistant layer used as an additional coating 140) may include an inorganic carbide, nitride, oxide, diamond-like material, or combination of these. Examples of suitable materials for the scratch-resistant layer 150 include metal oxides, metal nitrides, metal oxynitride, metal carbides, metal oxycarbides, and/or combinations thereof. Exemplary metals include B, Al, Si, Ti, V, Cr, Y, Zr, Nb, Mo, Sn, Hf, Ta and W. Specific examples of materials that may be utilized in the scratch-resistant layer 150 or coating may include $Al_2O_3$, AlN, $AlO_xN_y$, $Si_3N_4$, $SiO_xN_y$, $Si_uAl_vO_xN_y$, diamond, diamond-like carbon, $Si_xC_y$, $Si_xO_yC_z$, $ZrO_2$, $TiO_xN_y$, and combinations thereof. The scratch-resistant layer 150 may also comprise nanocomposite materials, or materials with a controlled microstructure to improve hardness, toughness, or abrasion/wear resistance. For example the scratch-resistant layer 150 may comprise nanocrystallites in the size range from about 5 nm to about 30 nm. In embodiments, the scratch-resistant layer 150 may comprise transformation-toughened zirconia, partially stabilized zirconia, or zirconia-toughened alumina. In embodiments, the scratch-resistant layer 150 exhibits a fracture toughness value greater than about 1 MPa$\sqrt{}$m and simultaneously exhibits a hardness value greater than about 8 GPa.

The scratch-resistant layer 150 may include a single layer (as shown in FIG. 7), or multiple sub-layers or single layers that exhibit a refractive index gradient. Where multiple layers are used, such layers form a scratch-resistant coating. For example, a scratch-resistant layer 150 may include a compositional gradient of $Si_uAl_vO_xN_y$ where the concentration of any one or more of Si, Al, O and N are varied to increase or decrease the refractive index. The refractive index gradient may also be formed using porosity. Such gradients are more fully described in U.S. patent application Ser. No. 14/262,224, entitled "Scratch-Resistant Articles with a Gradient Layer", filed on Apr. 28, 2014, which is hereby incorporated by reference in its entirety.

Figure 8:
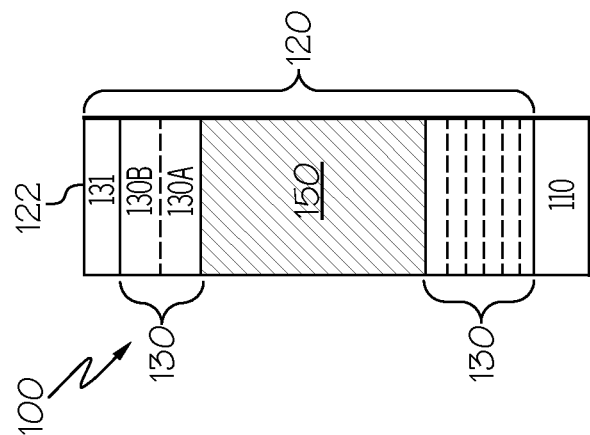
FIG. 8 is a cross-sectional side view of a coated article, according to one or more embodiments described herein.

In one embodiment, depicted in FIG. 8, the optical coating 120 may comprise a scratch-resistant layer 150 that is integrated as a high RI layer, and one or more low RI layers 130A and high RI layers 130B may be positioned over the scratch-resistant layer 150, with an optional capping layer 131 positioned over the low RI layers 130A and high RI layers 130B, where the capping layer 131 comprises a low RI material. The scratch-resistant layer 150 may be alternately defined as the thickest hard layer or the thickest high RI layer in the overall optical coating 120 or in the overall coated article 100. Without being bound by theory, it is believed that the coated article 100 may exhibit increased hardness at indentation depths when a relatively thin amount of material is deposited over the scratch-resistant layer 150. However, the inclusion of low RI and high RI layers over the scratch-resistant layer 150 may enhance the optical properties of the coated article 100. In some embodiments, relatively few layers (e.g., only 1, 2, 3, 4, or 5 layers) may positioned over the scratch-resistant layer 150 and these layers may each be relatively thin (e.g. less than 100 nm, less than 75 nm, less than 50 nm, or even less than 25 nm).

In embodiments, the layers deposited over the scratch-resistant layer 150 (i.e., on the air side of the scratch-resistant layer 150) may have a total thickness (i.e., in combination) of less than or equal to about 1000 nm, less than or equal to about 500 nm, less than or equal to about 450 nm, less than or equal to about 400 nm, less than or equal to about 350 nm, less than or equal to about 300 nm, less than or equal to about 250 nm, less than or equal to about 225 nm, less than or equal to about 200 nm, less than or equal to about 175 nm, less than or equal to about 150 nm, less than or equal to about 125 nm, less than or equal to about 100 nm, less than or equal to about 90 nm, less than or equal to about 80 nm, less than or equal to about 70 nm, less than or equal to about 60 nm, or even less than or equal to about 50 nm.

In embodiments, the total thickness of low RI layer(s) (the sum of thickness of all low RI layers, even if they are not in contact) that are positioned over the scratch-resistant layer 150 (i.e., on the air side of the scratch-resistant layer 150) may be less than or equal to about 500 nm, less than or equal to about 450 nm, less than or equal to about 400 nm, less than or equal to about 350 nm, less than or equal to about 300 nm, less than or equal to about 250 nm, less than or equal to about 225 nm, less than or equal to about 200 nm, less than or equal to about 175 nm, less than or equal to about 150 nm, less than or equal to about 125 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, or even less than or equal to about 10 nm.

Figure 25:
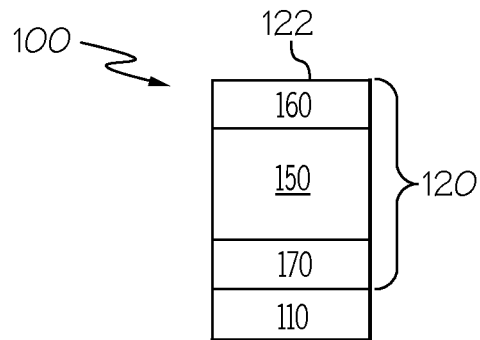
FIG. 25 is a cross-sectional side view of an article, according to one or more embodiments described herein.
Figure 26:
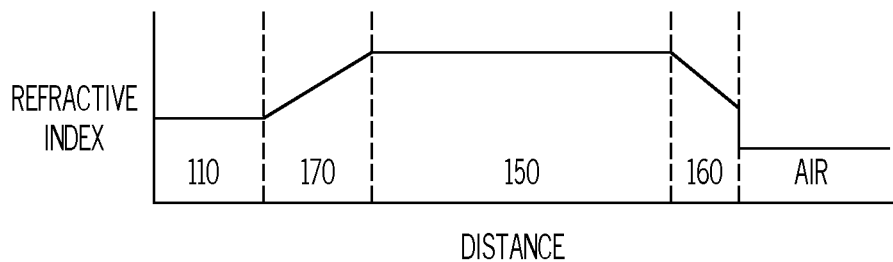
FIG. 26 schematically depicts a refractive index profile for a coated article with gradient layers, according to one or more embodiments described herein.

In one or more embodiments, the optical coating 120 may comprise one or more gradient layers, which each may comprise a compositional gradient along their respective thicknesses, as shown in FIG. 25. In one embodiment, the optical coating 120 may comprise a lower gradient layer 170, a scratch-resistant layer 150 (as described above), and an upper gradient layer 160. The lower gradient layer 170 may be positioned in direct contact with the substrate 110. The scratch-resistant layer 150 may be over the lower gradient layer 170, and the upper gradient layer may be in direct contact and over the scratch-resistant layer 150. The scratch-resistant layer 150 may comprise one or more relatively hard materials with high refractive indices, such as $SiN_x$, SiAlON, SiON, etc. In embodiments, the thickness of the scratch-resistant layer 150 may be from about 200 nm to several microns, such as is described with reference to the scratch-resistant layer 150 in other embodiments. The lower gradient layer 170 may have a refractive index which varies from about the refractive index of the substrate (which may be relatively low) in portions which contact the substrate 110 to the refractive index of the scratch-resistant layer 150 (which may be relatively high) in portions that contact the scratch-resistant layer 150. The lower gradient layer 170 may have a thickness of from about 10 nm to several microns, such as 50 nm to 1000 nm, 100 nm to 1000 nm, or 500 nm to 1000 nm. The upper gradient layer 160 may have a refractive index which varies from about the refractive index of the scratch-resistant layer 150 (which may be relatively high) at portions which contact the scratch-resistant layer 150 to a relatively low refractive index at the air interface at the anti-reflective surface 122. The uppermost portion of the upper gradient layer 160 (at the anti-reflective surface 122) may comprise materials with a refractive index of 1.38 to 1.55, such as, but not limited to, silicate glass, silica, phosphorous glass, or magnesium fluoride. The uppermost portion of the upper gradient layer 160 may also comprise material with a refractive index from about 1.38 to 1.7 and an engineered hardness, such as, but not limited to, $Al_2O_3$, $Si_uAl_vO_x$, $Si_uAl_vO_xN_y$, $Si_vO_xN_y$, or $Al_vO_xN_y$. High hardness and low refractive index may be desirable at the anti-reflective surface 122. FIG. 26 depicts an example refractive index profile of an optical coating 120 of FIG. 25. The substrate 110, lower gradient layer 170, scratch-resistant layer 150, and upper gradient layer 160 are marked in their corresponding portions on the refractive index profile of FIG. 26.

In one or more embodiments, the refractive index of the lower gradient layer 170 at the substrate 110 may be within 0.2 (such as within 0.15, 0.1, 0.05, 0.02, or 0.01) of the refractive index of the substrate 110. The refractive index of the lower gradient layer 170 at the scratch-resistant layer may be within 0.2 (such as within 0.15, 0.1, 0.05, 0.02, or 0.01) of the refractive index of the scratch-resistant layer 150. The refractive index of the upper gradient layer 160 at the scratch-resistant layer 150 may be within 0.2 (such as within 0.15, 0.1, 0.05, 0.02, or 0.01) of the refractive index of the scratch-resistant layer 150. The refractive index of the upper gradient layer 160 at the anti-reflective surface 122 may be from about 1.38 to about 1.55. In embodiments, the refractive index of the scratch-resistant layer 150 may be at least about 1.75, 1.8, or even 1.9.

Figure 27:
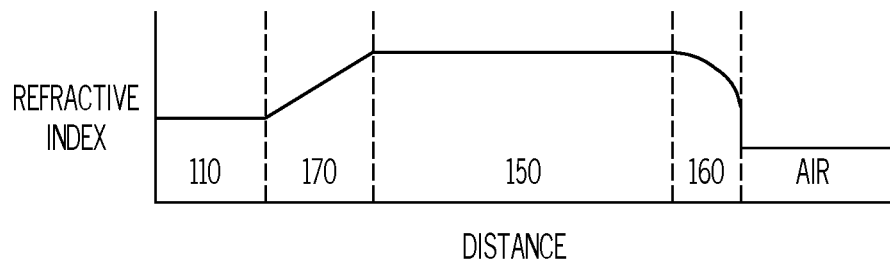
FIG. 27 schematically depicts a refractive index profile for a coated article with gradient layers, according to one or more embodiments described herein.
Figure 28:
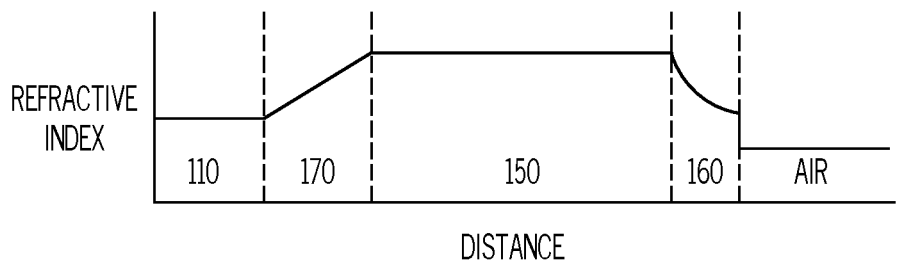
FIG. 28 schematically depicts a refractive index profile for a coated article with gradient layers, according to one or more embodiments described herein.

In one or more embodiments, the lower gradient layer 170, the upper gradient layer 160, or both, may have a non-linear concentration profile (resulting in a non-linear refractive index profile). For example, FIGS. 27 and 28 depict non-linear upper gradient layers 160. Such non-linear upper gradient layers 160 may be quantified by a morph parameter, as will be described in the examples which follow. A morph parameter of 1 corresponds to a linear refractive index profile. A morph parameter of less than 1 refers to a non-linear refractive index profile where the refractive index of the gradient layer at its geometric midpoint is greater than the average of the refractive indices at the upper and lower surfaces of the gradient layer. FIG. 27 shows the upper gradient layer 160 with a morph parameter of less than 1. A morph parameter of greater than 1 refers to a non-linear refractive index profile where the refractive index of the gradient layer at its midpoint is less than the average of the refractive indices at the upper and lower surfaces of the gradient layer. FIG. 28 shows the upper gradient layer 160 with a morph parameter of greater than 1. Coated articles 100 with morph parameters of less than 1 may have increased hardness due to the higher concentration of hard materials throughout the gradient layer.

According to one or more embodiments, the coated article 100 may include a structure that is a hybrid between the gradient-including structure of FIG. 26 and the alternating high RI/low RI-including structure of FIG. 7. For example, in FIG. 7 the scratch-resistant layer is sandwiched by two anti-reflective coatings 130 which have alternating high RI/low RI layers, and FIG. 26 replaces those alternating high RI/low RI layers with gradient layers. A hybrid coating may include a gradient layer below the scratch-resistant layer and an alternating high RI/low RI coating over the scratch-resistant layer. In an alternative embodiment, a hybrid coating may include a gradient layer over the scratch-resistant layer and an alternating high RI/low RI coating below the scratch-resistant layer. It should be understood that the teaching presented herein regarding gradient layer-including embodiments and alternating high RI/low RI layer coating embodiments (sometimes referred to as anti-reflective coating embodiments) may be combined and interchanged to produce hybrids of the two designs.

The optical coating 120 and/or the coated article 100 may be described in terms of a hardness measured by a Berkovich Indenter Hardness Test. As used herein, the "Berkovich Indenter Hardness Test" includes measuring the hardness of a material on a surface thereof by indenting the surface with a diamond Berkovich indenter. The Berkovich Indenter Hardness Test includes indenting the anti-reflective surface 122 of the coated article 100 or the surface of any one or more of the layers in the optical coating 120 with the diamond Berkovich indenter to form an indent to an indentation depth in the range from about 50 nm to about 1000 nm (or the entire thickness of the optical coating 120 or layer thereof, whichever is less) and measuring the maximum hardness from this indentation along the entire indentation depth range or a segment of this indentation depth (e.g., in the range from about 100 nm to about 600 nm), generally using the methods set forth in Oliver, W. C.; Pharr, G. M. An improved technique for determining hardness and elastic modulus using load and displacement sensing indentation experiments. *J. Mater. Res.*, Vol. 7, No. 6, 1992, 1564-1583; and Oliver, W. C.; Pharr, G. M. Measurement of Hardness and Elastic Modulus by Instrument Indentation: Advances in Understanding and Refinements to Methodology. *J. Mater. Res.*, Vol. 19, No. 1, 2004, 3-20. As used herein, hardness refers to a maximum hardness, and not an average hardness.

Typically, in nanoindentation measurement methods (such as by using a Berkovich indenter) of a coating that is harder than the underlying substrate, the measured hardness may appear to increase initially due to development of the plastic zone at shallow indentation depths and then increases and reaches a maximum value or plateau at deeper indentation depths. Thereafter, hardness begins to decrease at even deeper indentation depths due to the effect of the underlying substrate. Where a substrate having an increased hardness compared to the coating is utilized, the same effect can be seen; however, the hardness increases at deeper indentation depths due to the effect of the underlying substrate.

The indentation depth range and the hardness values at certain indentation depth range(s) can be selected to identify a particular hardness response of the optical film structures and layers thereof, described herein, without the effect of the underlying substrate. When measuring hardness of the optical film structure (when disposed on a substrate) with a Berkovich indenter, the region of permanent deformation (plastic zone) of a material is associated with the hardness of the material. During indentation, an elastic stress field extends well beyond this region of permanent deformation. As indentation depth increases, the apparent hardness and modulus are influenced by stress field interactions with the underlying substrate. The substrate influence on hardness occurs at deeper indentation depths (i.e., typically at depths greater than about 10% of the optical film structure or layer thickness). Moreover, a further complication is that the hardness response requires a certain minimum load to develop full plasticity during the indentation process. Prior to that certain minimum load, the hardness shows a generally increasing trend.

At small indentation depths (which also may be characterized as small loads) (e.g., up to about 50 nm), the apparent hardness of a material appears to increase dramatically versus indentation depth. This small indentation depth regime does not represent a true metric of hardness but instead, reflects the development of the aforementioned plastic zone, which is related to the finite radius of curvature of the indenter. At intermediate indentation depths, the apparent hardness approaches maximum levels. At deeper indentation depths, the influence of the substrate becomes more pronounced as the indentation depths increase. Hardness may begin to drop dramatically once the indentation depth exceeds about 30% of the optical coating 120 thickness or the layer thickness.

In some embodiments, the coated article 100 may exhibit a hardness of about 8 GPa or greater, about 10 GPa or greater, or about 12 GPa or greater (e.g., about 14 GPa or greater, about 16 GPa or greater, about 18 GPa or greater, or about 20 GPa or greater) when measured at the anti-reflective surface 122. The hardness of the coated article 100 may even be up to about 20 GPa or 30 GPa. Such measured hardness values may be exhibited by the optical coating 120 and/or the coated article 100 along an indentation depth of about 50 nm or greater or about 100 nm or greater (e.g., from about 50 nm to about 300 nm, from about 50 nm to about 400 nm, from about 50 nm to about 500 nm, from about 50 nm to about 600 nm, from about 200 nm to about 300 nm, from about 200 nm to about 400 nm, from about 200 nm to about 500 nm, or from about 200 nm to about 600 nm). In one or more embodiments, the article exhibits a hardness that is greater than the hardness of the substrate (which can be measured on the opposite surface from the anti-reflective surface).

According to embodiments, the hardness may be measured at different portions of the coated article 100. For example, the coated article may exhibit a hardness of at least 8 GPa or greater at an indentation depth of at least about 50 nm or greater at the anti-reflective surface 122 at the first portion 113 and at the second portion 115. For example, the hardness at the first portion 113 and at second portion 115 may be about 8 GPa or greater, about 10 GPa or greater, or about 12 GPa or greater (e.g., about 14 GPa or greater, about 16 GPa or greater, about 18 GPa or greater, or about 20 GPa or greater).

According to embodiments, the coated articles described herein may have desirable optical properties (such as low reflectance and neutral color) at various portions of the coated article 100, such as the first portion 113 and the second portion 115. For example, light reflectance may be relatively low (and transmittance may be relatively high) at the first portion 113 and at the second portion 115 when each is viewed at an incident illumination angle near normal to the respective portions. In another embodiment, when each portion is viewed at a near normal incident illumination angle, the difference in color between the two portions may be insignificant to the naked eye. In another embodiment, when the portions are viewed at incident illumination angles that have the same direction, the color may be insignificant to the naked eye and there may be relatively low reflectance at each portion (i.e., the incident illumination angles relative to the surfaces of each portion are different because the portions are at an angle to one another, but the illumination direction is the same. Optical properties may include average light transmittance, average light reflectance, photopic reflectance, photopic transmittance, reflected color (i.e., in L*a*b* color coordinates), and transmitted color (i.e., in L*a*b* color coordinates).

As used herein, the term "transmittance" is defined as the percentage of incident optical power within a given wavelength range transmitted through a material (e.g., the article, the substrate or the optical film or portions thereof). The term "reflectance" is similarly defined as the percentage of incident optical power within a given wavelength range that is reflected from a material (e.g., the article, the substrate, or the optical film or portions thereof). Reflectance may be measured as a single side reflectance when measured at the anti-reflective surface 122 only (e.g., when removing the reflections from an uncoated back surface (e.g., 114 in FIG. 1) of the article, such as through using index-matching oils on the back surface coupled to an absorber, or other known methods). In one or more embodiments, the spectral resolution of the characterization of the transmittance and reflectance is less than 5 nm or 0.02 eV. The color may be more pronounced in reflection. The angular color shifts in reflection with viewing angle due to a shift in the spectral reflectance oscillations with incident illumination angle. Angular color shifts in transmittance with viewing angle are also due to the same shift in the spectral transmittance oscillation with incident illumination angle. The observed color and angular color shifts with incident illumination angle are often distracting or objectionable to device users, particularly under illumination with sharp spectral features such as fluorescent lighting and some LED lighting. Angular color shifts in transmission may also play a factor in color shift in reflection and vice versa. Factors in angular color shifts in transmission and/or reflection may also include angular color shifts due to viewing angle or angular color shifts away from a certain white point that may be caused by material absorption (somewhat independent of angle) defined by a particular illuminant or test system.

The average light reflectance and average light transmittance may be measured over a wavelength regime of from about 400 nm to about 800 nm. In additional embodiments, the optical wavelength regime may comprise wavelength ranges such as from about 450 nm to about 650 nm, from about 420 nm to about 680 nm, from about 420 nm to about 700 nm, from about 420 nm to about 740 nm, from about 420 nm to about 850 nm, or from about 420 nm to about 950 nm.

The coated article 100 may also be characterized by is photopic transmittance and reflectance at various portions. As used herein, photopic reflectance mimics the response of the human eye by weighting the reflectance versus wavelength spectrum according to the human eye's sensitivity. Photopic reflectance may also be defined as the luminance, or tristimulus Y value of reflected light, according to known conventions such as CIE color space conventions. The average photopic reflectance is defined in the below equation as the spectral reflectance, $R(\lambda)$ multiplied by the illuminant spectrum, $I(\lambda)$ and the CIE's color matching function $\bar{y}(\lambda)$, related to the eye's spectral response:

$$\langle R_p \rangle = \int_{380\,nm}^{720\,nm} R(\lambda) \times I(\lambda) \times \bar{y}(\lambda) d\lambda$$

The average photopic transmittance is defined in the below equation as the spectral transmittance, $T(\lambda)$ multiplied by the illuminant spectrum, $I(\lambda)$ and the CIE's color matching function $\bar{y}(\lambda)$, related to the eye's spectral response:

$$\langle T_p \rangle = \int_{380\,nm}^{720\,nm} T(\lambda) \times I(\lambda) \times \bar{y}(\lambda) d\lambda$$

According to one embodiment, the coated article 100 may exhibit a single side average light reflectance as measured at the anti-reflective surface 122 at the first portion 113 of the substrate 110 of about 8% or less, wherein the single side average light reflectance of the first portion 113 is measured at a first incident illumination angle $\theta_1$ relative to $n_1$, and wherein the first incident illumination angle $\theta_1$ comprises an angle in the range from about 0 degrees to about 60 degrees from the $n_1$. In additional embodiments, the first incident illumination angle $\theta_1$ may comprise angles in the range from about 0 degrees to about 60, from about 0 degrees to about 50, from about 0 degrees to about 40, from about 0 degrees to about 30, from about 0 degrees to about 20, or from about 0 degrees to about 10 from $n_1$. In additional embodiments, the coated article 100 may exhibit a single side average light reflectance as measured at the anti-reflective surface 122 at the first portion 113 of the substrate 110 of about 8% or less for all incident illumination angles $\theta_1$ in a range from about 0 degrees to about 60 degrees, from about 0 degrees to about 50, from about 0 degrees to about 40, from about 0 degrees to about 30, from about 0 degrees to about 20, or from about 0 degrees to about 10 from $n_1$. In additional embodiments, given any of the described ranges of incident illumination angles $\theta_1$, the single side average light reflectance as measured at the anti-reflective surface 122 at the first portion 113 of the substrate 110 may be about 10% or less, about 9% or less, about 8% or less, about 7% or less, about 6% or less, about 5% or less, about 4% or less, about 3% or less, about 2% or less, about 1% or less, or about 0.8% or less over the optical wavelength regime. For example, the single side average light reflectance may be in the range from about 0.4% to about 9%, from about 0.4% to about 8%, from about 0.4% to about 7%, from about 0.4% to about 6%, or from about 0.4% to about 5% and all ranges therebetween.

According to one embodiment, the coated article 100 may exhibit a single side average light reflectance as measured at the anti-reflective surface 122 at the second portion 115 of the substrate 110 of about 8% or less, wherein the single side average light reflectance of the second portion 115 is measured at a first incident illumination angle $\theta_2$ relative to $n_2$, and wherein the first incident illumination angle $\theta_2$ comprises an angle in the range from about 0 degrees to about 60 degrees from the $n_2$. In additional embodiments, the first incident illumination angle $\theta_2$ may comprise angles in the range from about 0 degrees to about 60, from about 0 degrees to about 50, from about 0 degrees to about 40, from about 0 degrees to about 30, from about 0 degrees to about 20, or from about 0 degrees to about 10 from $n_2$. In additional embodiments, the coated article 100 may exhibit a single side average light reflectance as measured at the anti-reflective surface 122 at the second portion 115 of the substrate 110 of about 8% or less for all incident illumination angles $\theta_2$ in a range from about 0 degrees to about 60 degrees, from about 0 degrees to about 50, from about 0 degrees to about 40, from about 0 degrees to about 30, from about 0 degrees to about 20, or from about 0 degrees to about 10 from $n_2$. In additional embodiments, given any of the described ranges of incident illumination angles $\theta_2$, the single side average light reflectance as measured at the anti-reflective surface 122 at the second portion 115 of the substrate 110 may be about 10% or less, about 9% or less, about 8% or less, about 7% or less, about 6% or less, about 5% or less, about 4% or less, about 3% or less, about 2% or less, about 1% or less, or about 0.8% or less over the optical wavelength regime. For example, the single side average light reflectance may be in the range from about 0.4% to about 9%, from about 0.4% to about 8%, from about 0.4% to about 7%, from about 0.4% to about 6%, or from about 0.4% to about 5% and all ranges therebetween.

In another embodiment, the difference between the single side average light reflectance as measured at the anti-reflective surface 122 at the first portion 113 of the substrate 110, over any of the disclosed angular ranges, and the single side average light reflectance as measured at the anti-reflective surface 122 at the second portion 115 of the substrate 110, over any of the disclosed angular ranges, is 5% or less, 4% or less, 3% or less, 2% or less, or even 1% or less.

In another embodiment, the photopic reflectance at the first portion 113 and/or the second portion 115 is in a range disclosed with regards to the single-side average light reflectance over an angular range disclosed.

According to one embodiment, the coated article 100 may exhibit an average light transmittance as measured at the anti-reflective surface 122 at the first portion 113 of the substrate 110 of about 8% or less, wherein the average light transmittance of the first portion 113 is measured at a first incident illumination angle $\theta_1$ relative to $n_1$, and wherein the first incident illumination angle $\theta_1$ comprises an angle in the range from about 0 degrees to about 60 degrees from the $n_1$. In additional embodiments, the first incident illumination angle $\theta_1$ may comprise angles in the range from about 0 degrees to about 60, from about 0 degrees to about 50, from about 0 degrees to about 40, from about 0 degrees to about 30, from about 0 degrees to about 20, or from about 0 degrees to about 10 from $n_1$. In additional embodiments, the coated article 100 may exhibit an average light transmittance as measured at the anti-reflective surface 122 at the first portion 113 of the substrate 110 of about 8% or less for all incident illumination angles $\theta_1$ in a range from about 0 degrees to about 60 degrees, from about 0 degrees to about 50, from about 0 degrees to about 40, from about 0 degrees to about 30, from about 0 degrees to about 20, or from about 0 degrees to about 10 from $n_1$. In additional embodiments, given any of the described ranges of incident illumination angles $\theta_1$, the average light transmittance as measured at the anti-reflective surface 122 at the first portion 113 of the substrate 110 may be about 90% or greater, 91% or greater, 92% or greater, 93% or greater, 94% or greater, 95% or greater, 96% or greater, 97% or greater, or 98% or greater, over the optical wavelength regime. For example, the average light transmittance may be in the range from about 90% to about 95.5%, from about 91% to about 95.5%, from about 92% to about 95.5%, from about 93% to about 95.5%, from about 94% to about 95.5%, from about 95% to about 95.5%, from about 96% to about 95.5%, and all ranges therebetween.

According to one embodiment, the coated article 100 may exhibit an average light transmittance as measured at the anti-reflective surface 122 at the second portion 115 of the substrate 110 of about 8% or less, wherein the average light transmittance of the second portion 115 is measured at a first incident illumination angle $\theta_2$ relative to $n_2$, and wherein the first incident illumination angle $\theta_2$ comprises an angle in the range from about 0 degrees to about 60 degrees from the $n_2$. In additional embodiments, the first incident illumination angle $\theta_2$ may comprise angles in the range from about 0 degrees to about 60, from about 0 degrees to about 50, from about 0 degrees to about 40, from about 0 degrees to about 30, from about 0 degrees to about 20, or from about 0 degrees to about 10 from $n_2$. In additional embodiments, the coated article 100 may exhibit an average light transmittance as measured at the anti-reflective surface 122 at the second portion 115 of the substrate 110 of about 8% or less for all incident illumination angles $\theta_2$ in a range from about 0 degrees to about 60 degrees, from about 0 degrees to about 50, from about 0 degrees to about 40, from about 0 degrees to about 30, from about 0 degrees to about 20, or from about 0 degrees to about 10 from $n_2$. In additional embodiments, given any of the described ranges of incident illumination angles $\theta_2$, the average light transmittance as measured at the anti-reflective surface 122 at the second portion 115 of the substrate 110 may be about 90% or greater, 91% or greater, 92% or greater, 93% or greater, 94% or greater, 95% or greater, 96% or greater, 97% or greater, or 98% or greater, over the optical wavelength regime. For example, the average light transmittance may be in the range from about 90% to about 95.5%, from about 91% to about 95.5%, from about 92% to about 95.5%, from about 93% to about 95.5%, from about 94% to about 95.5%, from about 95% to about 95.5%, from about 96% to about 95.5%, and all ranges therebetween.

In another embodiment, the difference between the average light transmittance as measured at the anti-reflective surface 122 at the first portion 113 of the substrate 110, over any of the disclosed angular ranges, and the average light transmittance as measured at the anti-reflective surface 122 at the second portion 115 of the substrate 110, over any of the disclosed angular ranges, is 5% or less, 4% or less, 3% or less, 2% or less, or even 1% or less.

In another embodiment, the photopic transmittance at the first portion 113 and/or the second portion 115 is in a range disclosed with regards to the average light transmittance over an angular range disclosed.

According to another embodiment, one or more of the single side average light reflectance, the average light transmittance, the photopic reflectance, the photopic transmittance, reflected color, and transmitted color may be measured at the first portion 113 and at the second portion 115, wherein the first incident illumination angle $\theta_1$ comprises an angle in the range from about 0 degrees to about 60 degrees from $n_1$, the given optical at the second portion 115 is measured at a second incident illumination angle $\theta_2$, wherein the second incident illumination angle $\theta_2$ is in a direction equal to the direction $v_1$ of the first incident illumination angle such that the optical property at the first portion 113 and at the second portion 115 are measured in the same viewing direction (i.e., $v_1$ is equal to $v_2$, but $\theta_1$ is not equal to $\theta_2$ because $n_1$ does not equal $n_2$).

Optical interference between reflected waves from the optical coating 120/air interface and the optical coating 120/substrate 110 interface can lead to spectral reflectance and/or transmittance oscillations that create apparent color in the coated article 100. In one or more embodiments, the coated article 100 at the first portion 113 may exhibit an angular color shift in reflectance and/or transmittance of about 10 or less when measured between normal $n_1$ to the viewing direction $v_1$ at the incident illumination angle of $\theta_1$. Additionally, in one or more embodiments, the coated article 100 at the second portion 115 may exhibit an angular color shift in reflectance and/or transmittance of about 10 or less when measured between normal $n_2$ to the viewing direction $v_2$ at the incident illumination angle of $\theta_2$.

According to one or more embodiments, the reference point color at the first portion 113 and at the second portion 115 may be less than about 10 (such as about 9 or less, about 8 or less, about 7 or less, about 6 or less, about 5 or less, about 4 or less, about 3 or less, or even about 2 or less). As used herein, the phrase "reference point color" refers to the a* and b*, under the CIE L*, a*, b* colorimetry system in reflectance and/or transmittance with respect to a reference color. The reference color may be (a*,b*)=(0,0), (−2,−2), (−4,−4), or the color coordinates of the substrate 110. The reference point color may be measured at varying incident illumination angles $\theta_1$ and $\theta_2$. At (0,0) reference, the reference point color is defined as $\sqrt{(a^*_{article})^2 + (b^* article)^2}$, at (−2,−2) reference, the reference point color is defined as $\sqrt{((a^*_{article}+2)^2 + (b^*_{article}+2)^2)}$, at (−4,−4) reference, the reference point color is defined as $\sqrt{((a^*_{article}+4)^2 + (b^*_{article}+4)^2)}$, at reference as the color of the substrate 110, the reference point color is defines as $\sqrt{((a^*_{article}-a^*_{substrate})^2 + (b^*_{article}-b^*_{substrate})^2)}$. In embodiments, the reference point color may be measured at over angular ranges, such that the incident illumination angles $\theta_1$ and $\theta_2$ may comprise angles in the range from about 0 degrees to about 60, from about 0 degrees to about 50, from about 0 degrees to about 40, from about 0 degrees to about 30, from about 0 degrees to about 20, or from about 0 degrees to about 10 from $n_1$ or $n_2$. In another embodiment, for any of the disclosed incident illumination angle ranges, at the first portion 113, and the second portion 115, or both, a* may be about 2 or less and b* may be about 2 or less.

As used herein, the phrase "angular color shift" refers to the change in both a* and b*, under the CIE L*, a*, b* colorimetry system in reflectance and/or transmittance with shifting incident illumination angles. It should be understood that unless otherwise noted, the L* coordinate of the articles described herein are the same at any angle or reference point and do not influence color shift. For example, angular color shift may be determined at a particular location of the coated substrate 100 using the following equation:

$$\sqrt{((a^*_v - a^*_n)^2 + (b^*_v - b^*_n)^2)}$$

with $a^*_v$, and $b^*_v$ representing the a* and b* coordinates of the article when viewed at incidence illumination angle and $a^*_n$, and $b^*_n$ representing the a* and b* coordinates of the article when viewed at or near normal.

In one or more embodiments, the angular color shift at the first portion 113 may be about 10 or less, about 9 or less, about 8 or less, about 7 or less, about 6 or less, about 5 or less, about 4 or less, about 3 or less, or even about 2 or less. Likewise, the angular color shift at the second portion 115 may be about 10 or less, about 9 or less, about 8 or less, about 7 or less, about 6 or less, about 5 or less, about 4 or less, about 3 or less, or even about 2 or less. The respective incident illumination angles $\theta$ and $\theta_2$ may comprise angles in the range from about 0 degrees to about 60, from about 0 degrees to about 50, from about 0 degrees to about 40, from about 0 degrees to about 30, from about 0 degrees to about 20, or from about 0 degrees to about 10 from $n_1$ or $n_2$. In additional embodiments, the coated article 100 may a reflective or transmittance color shift at the first portion 113 and at the second portion 115 of the substrate 110 of about 10 or less for all incident illumination angles $\theta$ in a range from about 0 degrees to about 60 degrees, from about 0 degrees to about 50, from about 0 degrees to about 40, from about 0 degrees to about 30, from about 0 degrees to about 20, or from about 0 degrees to about 10 from $n_1$. In some embodiments, the angular color shift may be about 0.

The illuminant can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting).

In another embodiment, the difference in reflected color of the coated article 100 between the first portion 113 of the substrate 110 and the second portion 115 of the substrate 110 is less than or equal to about 10 (such all about 9 or less, about 8 or less, about 7 or less, about 6 or less, about 5 or less, about 4 or less, about 3 or less, about 2 or less, or even about 1 or less, wherein the difference in reflected color is defined as:

$$\sqrt{((a^*_{first\ portion} - a^*_{second\ portion})^2 + (b^*_{first\ portion} - b^*_{second\ portion})^2)},$$

and wherein the reflected color at the first portion 113 is measured at a first incident illumination angle $\theta_1$ relative to $n_1$, and the reflected color at the second portion 115 is measured at a second incident illumination angle $\theta_2$ measured relative to $n_2$. The respective incident illumination angles $\theta_1$ and $\theta_2$ may comprise angles in the range from about 0 degrees to about 60, from about 0 degrees to about 50, from about 0 degrees to about 40, from about 0 degrees to about 30, from about 0 degrees to about 20, or from about 0 degrees to about 10 from $n_1$ or $n_2$. In another embodiment, the difference in reflected color as defined by $\sqrt{((a^*_{first\ portion} - a^*_{second\ portion})^2 + (b^*_{first\ portion} - b^*_{second\ portion})^2)}$ may be measured such that the second incident illumination angle $\theta_2$ is in a direction equal to the direction $v_1$ of the first incident illumination angle such that the optical property at the first portion 113 and at the second portion 115 are measured in the same viewing direction (i.e., $v_1$ is equal to $v_2$, but $\theta_1$ is not equal to $\theta_2$ because $n_1$ does not equal $n_2$).

The substrate 110 may include an inorganic material and may include an amorphous substrate, a crystalline substrate, or a combination thereof. The substrate 110 may be formed from man-made materials and/or naturally occurring materials (e.g., quartz and polymers). For example, in some instances, the substrate 110 may be characterized as organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In some specific embodiments, the substrate 110 may specifically exclude polymeric, plastic and/or metal materials. The substrate 110 may be characterized as alkali-including substrates (i.e., the substrate includes one or more alkalis). In one or more embodiments, the substrate 110 exhibits a refractive index in the range from about 1.45 to about 1.55. In specific embodiments, the substrate 110 may exhibit an average strain-to-failure at a surface on one or more opposing major surfaces that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using ball-on-ring testing using at least 5, at least 10, at least 15, or at least 20 samples. In specific embodiments, the substrate 110 may exhibit an average strain-to-failure at its surface on one or more opposing major surfaces of about 1.2%, about 1.4%, about 1.6%, about 1.8%, about 2.2%, about 2.4%, about 2.6%, about 2.8%, or about 3% or greater.

Suitable substrates 110 may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In one or more embodiments, the amorphous substrate may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of Lithia. In one or more alternative embodiments, the substrate 110 may include crystalline substrates such as glass ceramic substrates (which may be strengthened or non-strengthened) or may include a single crystal structure, such as sapphire. In one or more specific embodiments, the substrate 110 includes an amorphous base (e.g., glass) and a crystalline cladding (e.g., sapphire layer, a polycrystalline alumina layer and/or or a spinel ($MgAl_2O_4$) layer).

The substrate 110 of one or more embodiments may have a hardness that is less than the hardness of the overall coated article 100 (as measured by the Berkovich Indenter Hardness Test described herein). The hardness of the substrate 110 may be measured using known methods in the art, including but not limited to the Berkovich Indenter Hardness Test or Vickers hardness test.

The substrate 110 may be substantially optically clear, transparent and free from light scattering elements. In such embodiments, the substrate may exhibit an average light transmittance over the optical wavelength regime of about 85% or greater, about 86% or greater, about 87% or greater, about 88% or greater, about 89% or greater, about 90% or greater, about 91% or greater, or about 92% or greater. In one or more alternative embodiments, the substrate 110 may be opaque or exhibit an average light transmittance over the optical wavelength regime of less than about 10%, less than about 9%, less than about 8%, less than about 7%, less than about 6%, less than about 5%, less than about 4%, less than about 3%, less than about 2%, less than about 1%, or less than about 0.5%. In some embodiments, these light reflectance and transmittance values may be a total reflectance or total transmittance (taking into account reflectance or transmittance on both major surfaces of the substrate) or may be observed on a single side of the substrate (i.e., on the anti-reflective surface 122 only, without taking into account the opposite surface). Unless otherwise specified, the average reflectance or transmittance of the substrate alone is measured at an incident illumination angle of 0 degrees relative to the substrate major surface 112 (however, such measurements may be provided at incident illumination angles of 45 degrees or 60 degrees). The substrate 110 may optionally exhibit a color, such as white, black, red, blue, green, yellow, orange etc.

Additionally or alternatively, the physical thickness of the substrate 110 may vary along one or more of its dimensions for aesthetic and/or functional reasons. For example, the edges of the substrate 110 may be thicker as compared to more central regions of the substrate 110. The length, width and physical thickness dimensions of the substrate 110 may also vary according to the application or use of the coated article 100.

The substrate 110 may be provided using a variety of different processes. For instance, where the substrate 110 includes an amorphous substrate such as glass, various forming methods can include float glass processes and down-draw processes such as fusion draw and slot draw.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate 110 is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer DOL, or depth of compression DOC) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

The degree of chemical strengthening achieved by ion exchange may be quantified based on the parameters of central tension (CT), surface CS, and depth of compression (DOC). Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. Maximum CT values are measured using a scattered light polariscope (SCALP) technique known in the art. As used herein, DOC means the depth at which the stress in the chemically strengthened alkali aluminosilicate glass article described herein changes from compressive to tensile. DOC may be measured by FSM or SCALP depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

In one embodiment, a substrate 110 can have a surface CS of 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened substrate may have a DOC (formerly DOL) of 10 µm or greater, 15 µm or greater, 20 µm or greater (e.g., 25 µm, 30 µm, 35 µm, 40 µm, 45 µm, 50 µm or greater) and/or a CT of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more embodiments, the strengthened substrate has one or more of the following: a surface CS greater than 500 MPa, a DOC (formerly DOL) greater than 15 µm, and a CT greater than 18 MPa.

Example glasses that may be used in the substrate 110 may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol. % SiO2; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate 110 comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. %≤($Li_2O+Na_2O+K_2O$)≤20 mol. % and 0 mol. %≤(MgO+CaO)≤10 mol. %.

A still further example glass composition suitable for the substrate 110 comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. %≤($Li_2O+Na_2O+K_2O$)≤18 mol. % and 2 mol. %≤(MgO+CaO)≤7 mol. %.

In a particular embodiment, an alkali aluminosilicate glass composition suitable for the substrate 110 comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio ($Al_2O_3+B_2O_3$)/Σmodifiers (i.e., sum of modifiers) is greater than 1, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio ($Al_2O_3+B_2O_3$)/Σmodifiers (i.e., sum of modifiers) is greater than 1.

In still another embodiment, the substrate 110 may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. %≤$SiO_2$+$B_2O_3$+CaO≤69 mol. %; $Na_2O+K_2O+B_2O_3$+MgO+CaO+SrO>10 mol. %; 5 mol. %≤MgO+CaO+SrO≤8 mol. %; ($Na_2O+B_2O_3$)–$Al_2O_3$≤2 mol. %; 2 mol. %≤$Na_2O$–$Al_2O_3$≤6 mol. %; and 4 mol. %≤($Na_2O+K_2O$)–$Al_2O_3$≤10 mol. %.

In an alternative embodiment, the substrate 110 may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate 110 includes a crystalline substrate, the substrate may include a single crystal, which may include $Al_2O_3$. Such single crystal substrates are referred to as sapphire. Other suitable materials for a crystalline substrate include polycrystalline alumina layer and/or spinel ($MgAl_2O_4$).

Optionally, the substrate 110 may be crystalline and include a glass ceramic substrate, which may be strengthened or non-strengthened. Examples of suitable glass ceramics may include $Li_2O$—$Al_2O_3$—$SiO_2$ system (i.e. LAS-System) glass ceramics, MgO—$Al_2O_3$—$SiO_2$ system (i.e. MAS-System) glass ceramics, and/or glass ceramics that include a predominant crystal phase including β-quartz solid solution, β-spodumene ss, cordierite, and lithium disilicate. The glass ceramic substrates may be strengthened using the chemical strengthening processes disclosed herein. In one or more embodiments, MAS-System glass ceramic substrates may be strengthened in $Li_2SO_4$ molten salt, whereby an exchange of 2$Li^+$ for $Mg^{2+}$ can occur.

The substrate 110 according to one or more embodiments can have a physical thickness ranging from about 100 μm to about 5 mm in various portions of the substrate 110. Example substrate 110 physical thicknesses range from about 100 μm to about 500 μm (e.g., 100, 200, 300, 400 or 500 μm). Further example substrate 110 physical thicknesses range from about 500 μm to about 1000 μm (e.g., 500, 600, 700, 800, 900 or 1000 μm). The substrate 110 may have a physical thickness greater than about 1 mm (e.g., about 2, 3, 4, or 5 mm). In one or more specific embodiments, the substrate 110 may have a physical thickness of 2 mm or less, or less than 1 mm. The substrate 110 may be acid polished or otherwise treated to remove or reduce the effect of surface flaws.

Figure 43A:
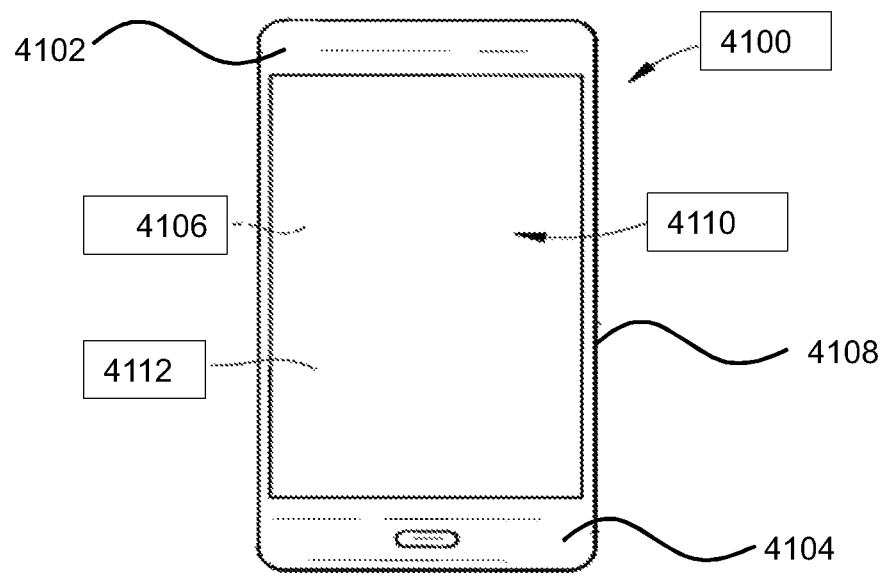
FIG. 43A a plan view of an exemplary electronic device incorporating any of the coated articles disclosed herein.
Figure 43B:
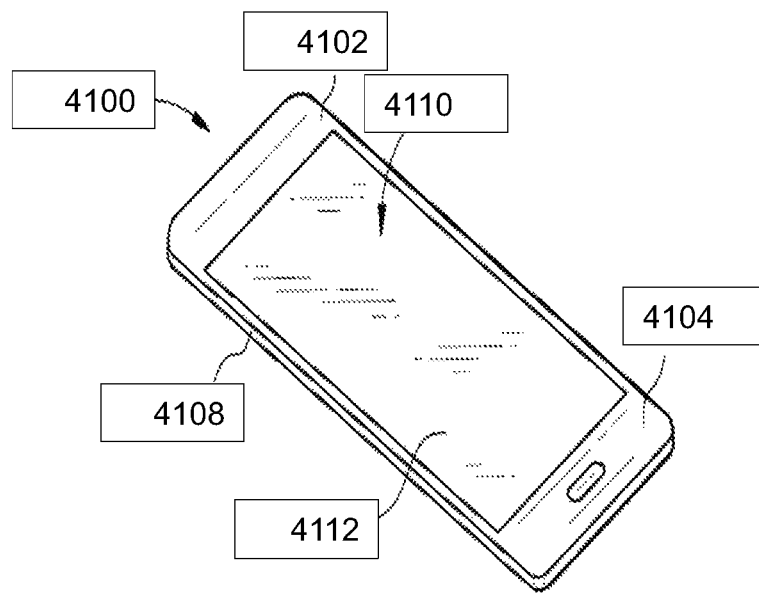
FIG. 43B is a perspective view of the exemplary electronic device of FIG. 43A.

The coated articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the coated articles disclosed herein is shown in FIGS. 43A and 43B. Specifically, FIGS. 43A and 43B show a consumer electronic device 4100 including a housing 4102 having front 4104, back 4106, and side surfaces 4108; electrical components (not shown) that are at least partially inside or entirely within the housing and including at least a controller, a memory, and a display 4110 at or adjacent to the front surface of the housing; and a cover substrate 4112 at or over the front surface of the housing such that it is over the display. In some embodiments, at least one of the cover substrate 4112 or a portion of housing 102 may include any of the coated articles disclosed herein.

EXAMPLES

Various embodiments will be further clarified by the following examples. The optical properties of the examples were modeled using a computation. The computation was carried out using the thin-film design program "Essential Macleod" available from Thin Film Center, Inc. of Tucson Ariz. The spectral transmittance was computed on a 1 nm interval for a selected wavelength range. Transmittance at each wavelength of a given coated article was calculated based on inputted layer thicknesses and refractive indices of each layer. Refractive index values for materials of the coatings were experimentally derived or found in available literature. To experimentally determine the refractive index of a material, dispersion curves for the materials of the coating materials were prepared. Layers of each coating material were formed onto silicon wafers by DC, RF or RF superimposed DC reactive sputtering from a silicon, aluminum, silicon and aluminum combined or co-sputtered, or magnesium fluoride target (respectively) at a temperature of about 50° C. using ion assist. The wafer was heated to 200° C. during deposition of some layers and targets having a 3 inch diameter were used. Reactive gases used included nitrogen, fluorine and oxygen; argon was used as the inert gas. The RF power was supplied to the silicon target at 13.56 Mhz and DC power was supplied to the Si target, Al target and other targets.

The refractive indices (as a function of wavelength) of each of the formed layers and the glass substrate were measured using spectroscopic ellipsometry. The refractive indices thus measured were then used to calculate reflectance spectra for the examples. The examples use a single refractive index value in their descriptive tables for convenience, which corresponds to a point selected from the dispersion curves at about 550 nm wavelength.

Comparative examples are supplied to compare the performance of coatings described herein with conventional coatings which may have inferior optical performance when deposited on a non-planar substrate.

Comparative Example A

Figure 9:
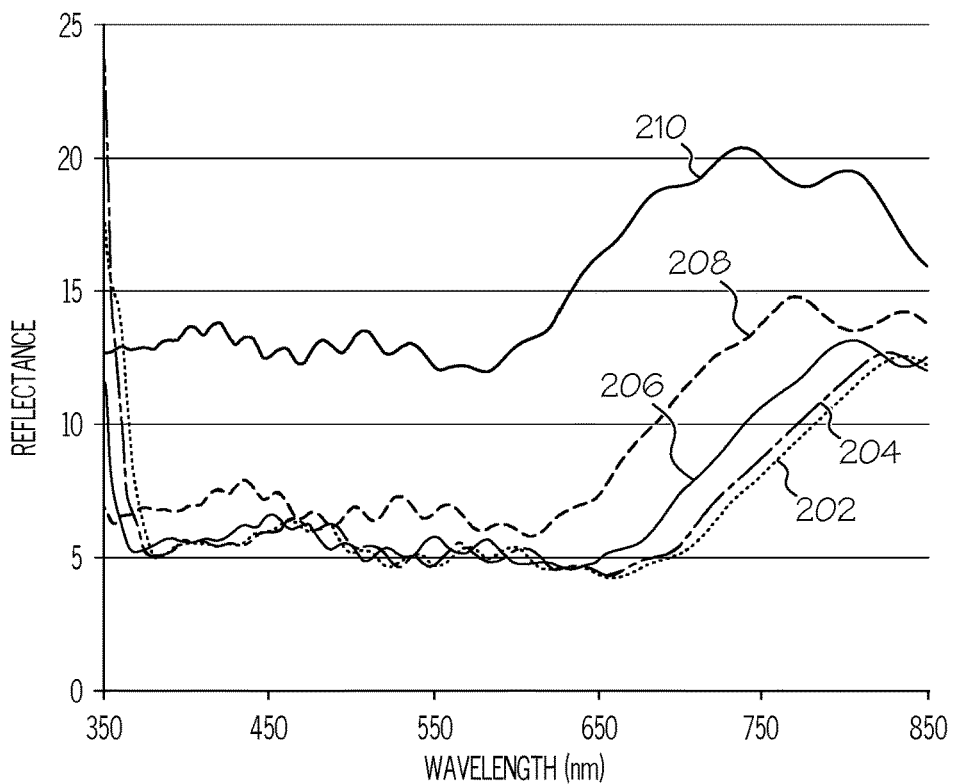
FIG. 9 depicts a graph of reflectance as a function of wavelength for the optical coating of Comparative Example A with changing viewing angles relative to normal, according to one or more embodiments described herein.
Figure 10:
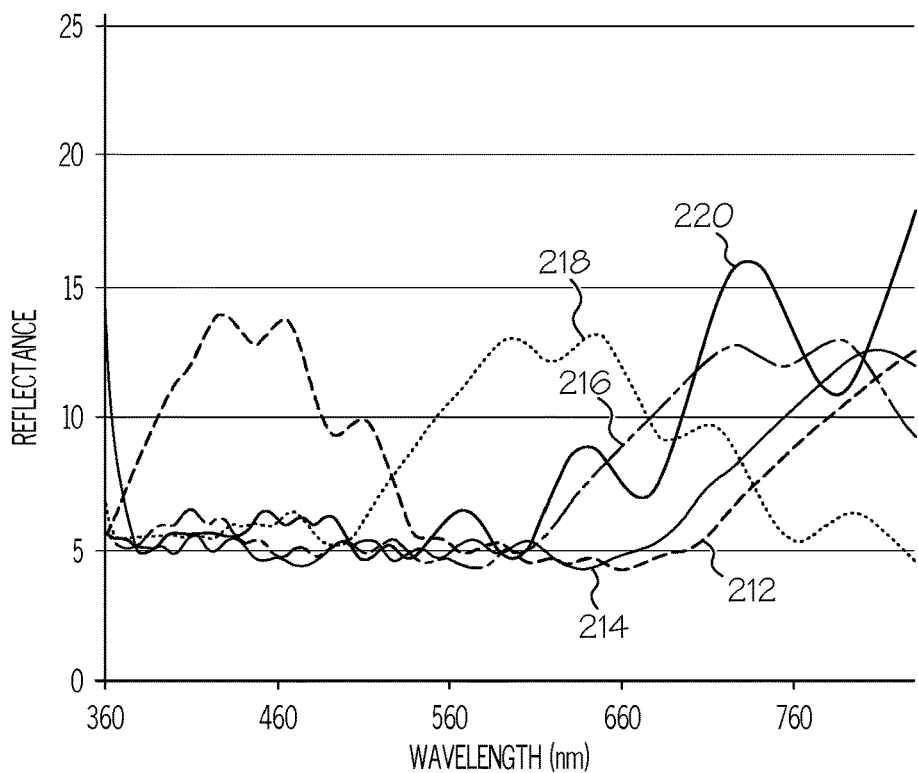
FIG. 10 depicts a graph of reflectance as a function of wavelength for the optical coating of Comparative Example A with changing layer thicknesses as observed at a normal viewing angle, according to one or more embodiments described herein.

A planar glass substrate was coated with the coating of Table 1. FIG. 9 depicts a graph of reflectance as a function of wavelength for the optical coating of Table 1 with changing viewing angles relative to a normal angle of incidence. Line 202 corresponds to an angle of incidence of 0 degrees, line 204 corresponds to an angle of incidence of 15 degrees, line 206 corresponds to an angle of incidence of 30 degrees, line 208 corresponds to an angle of incidence of 45 degrees, line 210 corresponds to an angle of incidence of 60 degrees. As can be seen from FIG. 9, as viewing angle was changed, reflectance (especially from about 650 nm and greater) increased. Therefore, this coating may have observable optical differences relative to different positions on a substrate when coated on a non-planar substrate. Additionally, the coating of Table 1 was modeled where each of its layers was thinned by a scalar of cosine of various deposition angles. For example, to model a 15 degree deposition angle, each layer thickness was multiplied by cosine of 15 degrees. FIG. 10 depicts a graph of reflectance as a function of wavelength for the optical coating of Table 1 with changing layer thicknesses as observed at a normal viewing angle. Line 212 corresponds to a 0 degrees deposition angle (identical to coating of Table 1), line 214 corresponds to a 15 degrees deposition angle, line 216 corresponds to a 30 degrees deposition angle, line 218 corresponds to a 45 degrees deposition angle, and line 220 corresponds to a 60 degrees deposition angle. As is seen in FIG. 10, reflectance increased over portions of the visible spectrum when deposition angle was increased from 0 degrees.

TABLE 1

| Material | Refractive Index | Thickness (nm) |
|---|---|---|
| Glass | 1.505 | N/A |
| SiNx | 1.878 | 9.6 |
| SiO2 | 1.480 | 47.7 |
| SiNx | 1.878 | 28.4 |
| SiO2 | 1.480 | 28.3 |
| SiNx | 1.878 | 47.2 |
| SiO2 | 1.480 | 8.3 |
| SiNx | 1.878 | 2000 |
| SiO2 | 1.480 | 27.4 |
| SiNx | 1.878 | 29.7 |
| SiO2 | 1.480 | 62.3 |
| SiNx | 1.878 | 30.8 |
| SiO2 | 1.480 | 27.5 |
| SiNx | 1.878 | 105.8 |
| SiO2 | 1.480 | 7 |
| SiNx | 1.878 | 153.7 |
| SiO2 | 1.480 | 87.1 |
| air | 1 | N/A |

Comparative Example B

Figure 11:
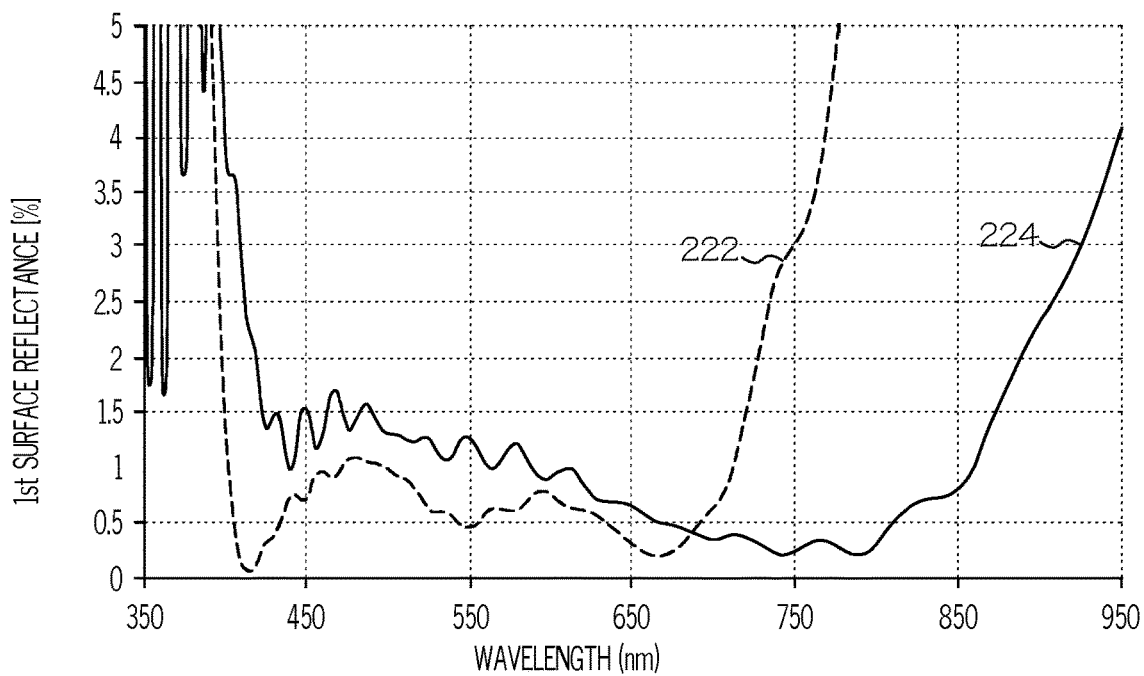
FIG. 11 depicts a graph of reflectance as a function of wavelength for the optical coatings of Example 1 and Comparative Example B at an 8 degree viewing angle relative to normal, according to one or more embodiments described herein.

A planar glass substrate was coated with the coating of Table 2. In FIG. 11, line 222 depicts a graph of reflectance as a function of wavelength for the optical coating of Comparative Example B (coating of Table 2) at an 8 degree viewing angle relative to normal.

TABLE 2

| Material | Refractive Index | Thickness (nm) |
|---|---|---|
| glass | 1.505 | N/A |
| AlON | 2.006 | 8.2 |
| SiO2 | 1.481 | 64.8 |
| AlON | 2.006 | 23 |
| SiO2 | 1.481 | 47.8 |
| AlON | 2.006 | 39.3 |
| SiO2 | 1.481 | 25.5 |
| AlON | 2.006 | 42.85 |
| SiO2 | 1.481 | 8.79 |
| AlON | 2.006 | 2000 |
| SiO2 | 1.481 | 198.18 |
| AlON | 2.006 | 40.02 |
| SiO2 | 1.481 | 41.36 |
| AlON | 2.006 | 44.79 |
| SiO2 | 1.481 | 20.08 |
| AlON | 2.006 | 95.49 |
| SiO2 | 1.481 | 10.2 |
| AlON | 2.006 | 158.86 |
| SiO2 | 1.481 | 88.58 |
| air | 1 | N/A |

Example 1

A planar glass substrate was coated with the coating of Table 3. FIG. 11, line 224, depicts a graph of reflectance as a function of wavelength for the optical coating of Example 1 at an 8 degree viewing angle relative to normal. As can be seen in FIG. 11, the coating of Example 1 had reduced first surface reflectance as compared to the coating of Comparative Example B at wavelengths over 700 nm.

TABLE 3

| Material | Refractive Index | Thickness (nm) | Thickness with 35 degree deposition angle |
|---|---|---|---|
| glass | 1.505 | N/A | N/A |
| AlON | 2.006 | 8.2 | 6.7 |
| SiO2 | 1.481 | 64.8 | 53.1 |
| AlON | 2.006 | 23 | 18.8 |
| SiO2 | 1.481 | 47.8 | 39.2 |
| AlON | 2.006 | 39.3 | 32.2 |
| SiO2 | 1.481 | 25.5 | 20.9 |
| AlON | 2.006 | 54.5 | 44.6 |
| SiO2 | 1.481 | 8 | 6.6 |
| AlON | 2.006 | 2000 | 1638.3 |
| SiO2 | 1.481 | 12.2 | 10.0 |
| AlON | 2.006 | 43.6 | 35.7 |
| SiO2 | 1.481 | 40.3 | 33.0 |
| AlON | 2.006 | 22.4 | 18.3 |
| SiO2 | 1.481 | 70 | 57.3 |
| AlON | 2.006 | 20 | 16.4 |
| SiO2 | 1.481 | 39.4 | 32.3 |
| AlON | 2.006 | 137.4 | 112.6 |
| SiO2 | 1.481 | 98.6 | 80.8 |
| air | 1 | N/A | N/A |

Figure 12:
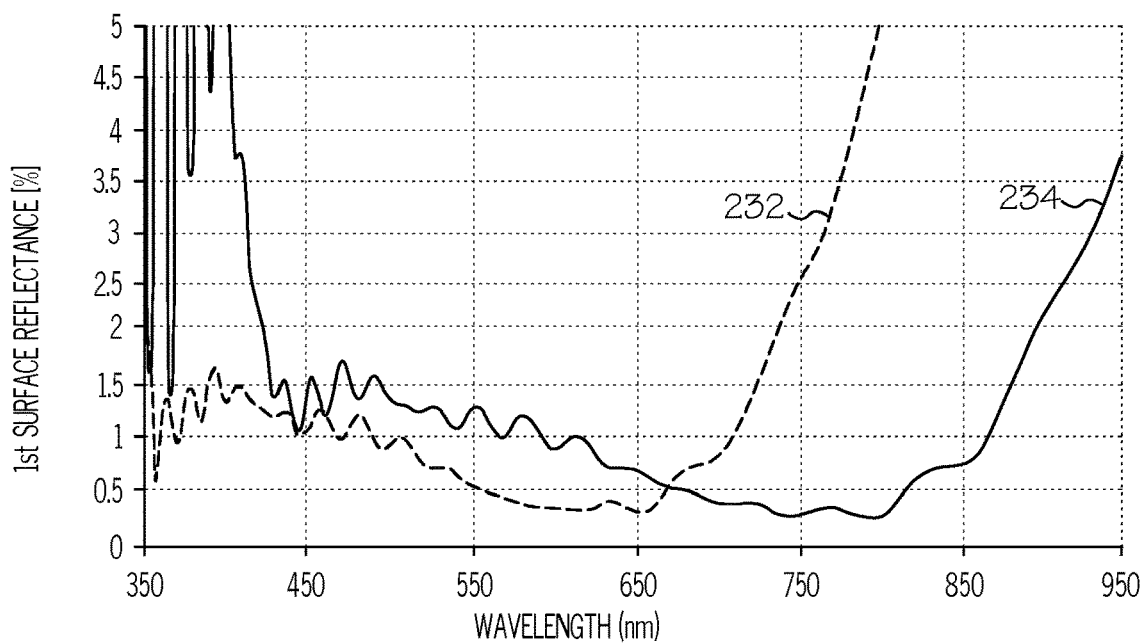
FIG. 12 depicts a graph of reflectance as a function of wavelength for the optical coating of Example 1 as designed and the optical coating of Example 1 with reduced layer thickness representative of a deposition angle of 35 degrees, as viewed at a normal angle of incidence, according to one or more embodiments described herein.

FIG. 12 depicts a graph of reflectance as a function of wavelength for the optical coating of Example 1 as designed and the optical coating of Example 1 with reduced layer thickness representative of a deposition angle of 35 degrees, as viewed at a normal angle of incidence. As can be seen from FIG. 12, the modeled deposition angle of 35 degrees caused increased reflectance at wavelengths greater than about 700 nm. However, reflectance over the visible spectrum was relatively low.

Figure 13:
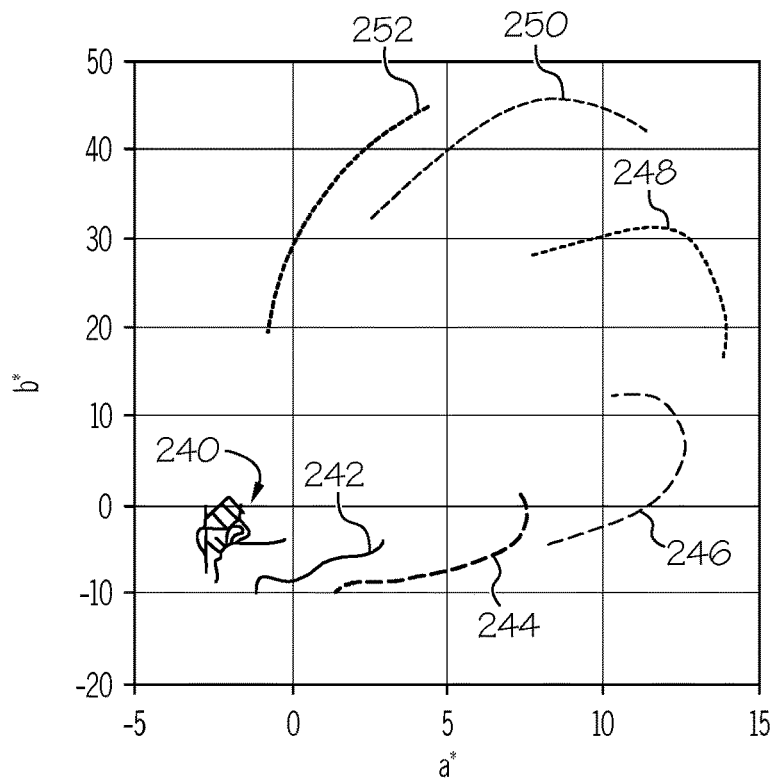
FIG. 13 depicts a graph of a* versus b* in reflectance for L*a*b* color space for the optical coating of Example 1 as designed and with reduced layer thickness representative of an increasing deposition angles, as viewed from a normal angle of incidence to 60 degrees, according to one or more embodiments described herein.

FIG. 13 depicts a graph of a* versus b* in reflectance for L*a*b* color space for the optical coating of Example 1 as designed and with reduced layer thickness representative of an increasing deposition angles, as viewed from a normal angle of incidence to 60 degrees.

The lines marked by 240 represent modeled deposition angles of 0 degrees to 30 degrees. There was little color change in the coating as a result of deposition angle up to 30 degrees. Line 242 corresponds to a deposition angle of 35 degrees, line 244 corresponds to a deposition angle of 40 degrees, line 246 corresponds to a deposition angle of 45 degrees, line 248 corresponds to a deposition angle of 50 degrees, line 250 corresponds to a deposition angle of 55 degrees, and line 252 corresponds to a deposition angle of 60 degrees. As modeled, b* is in a range of from 10 to 1 and a* is in a range from −5 to 0 for viewing angles of incidence of 0 degrees to 30 degrees. Also, b* is less than 2 for deposition angles from 0 degrees to 40 degrees when viewed from 0 degrees to 60 degrees.

Example 2

A planar glass substrate was coated with an optical coating having a lower gradient layer, a scratch-resistant layer, and an upper gradient layer. The lower gradient layer was formed on the glass substrate. Gradient layers were deposited in a Plasma-Therm Versaline HDPCVD chamber using $SiO_2$—$SiON$—$SiN_x$ compositions deposited from silane, argon, oxygen, and nitrogen. Gradients were formed by breaking the transition into a large number of short steps where the silane flow, oxygen, nitrogen, pressure, argon, coil RF power, and RF bias power are varied between steps by a morph parameter where a morph parameter of 1 was a linear curve while increasing above 1 formed an increasingly concave down curve and morph parameters below 1 formed increasingly concave up curves. The scratch-resistant layer was made of $SiN_x$, and oxygen was added to achieve the gradient in the upper and lower gradient layers.

Figure 29:
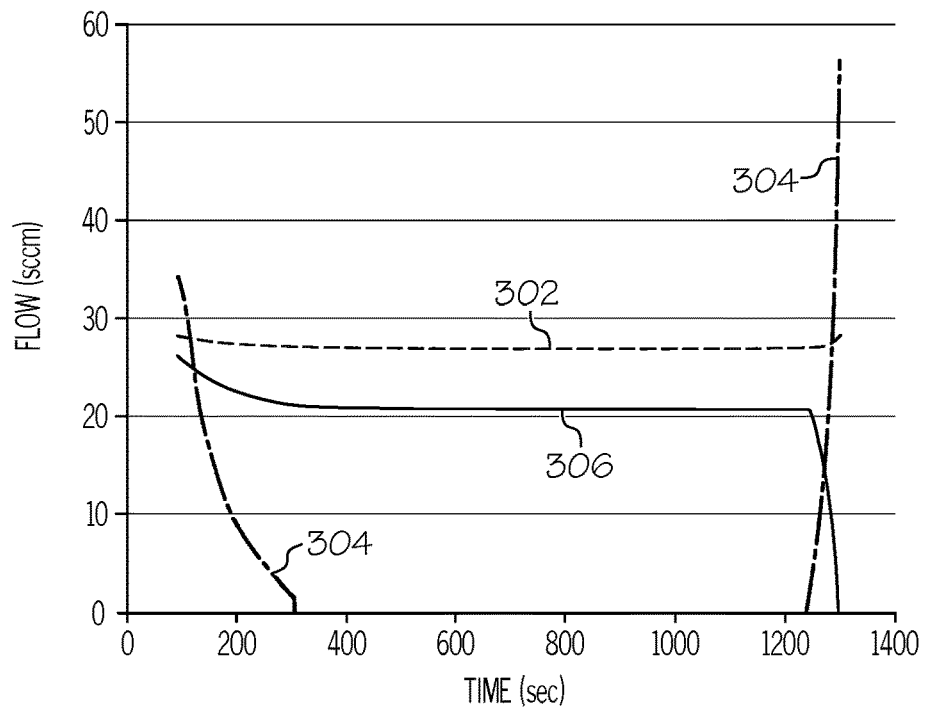
FIG. 29 graphically depicts the flow rate of various components as a function of time for an embodiment of Example 2, according to one or more embodiments described herein.
Figure 30:
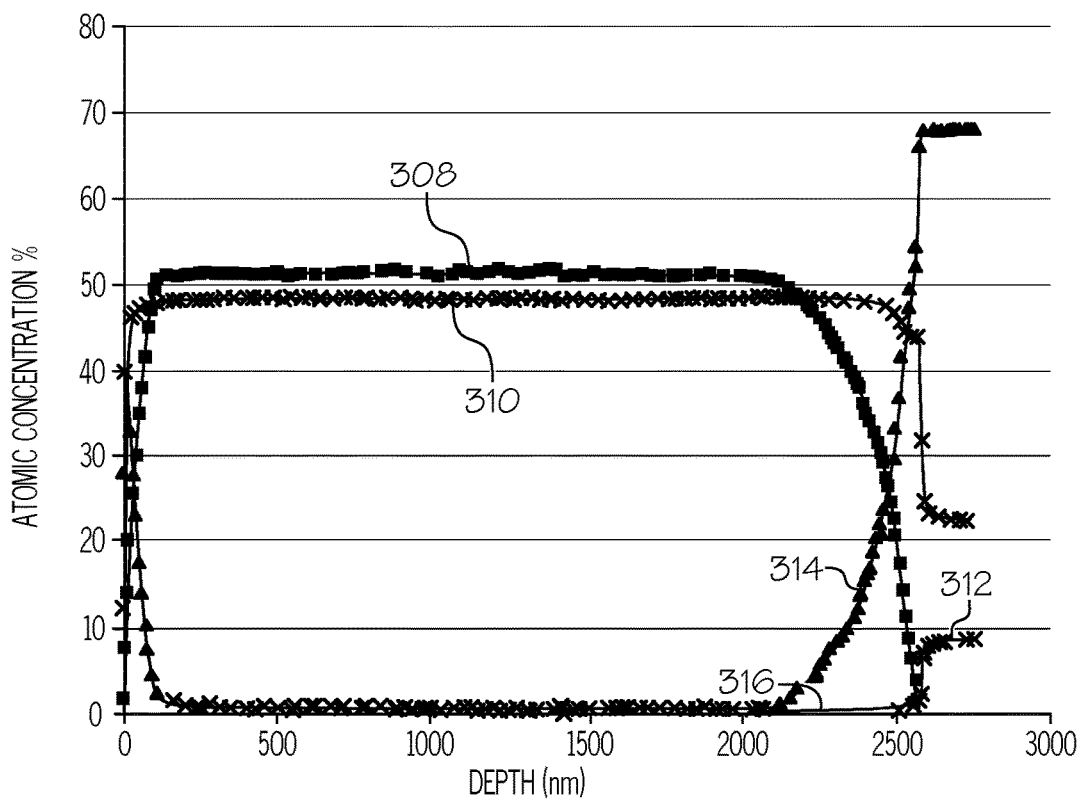
FIG. 30 graphically depicts an XPS composition profile for the coating of FIG. 29, according to one or more embodiments described herein.
Figure 31:
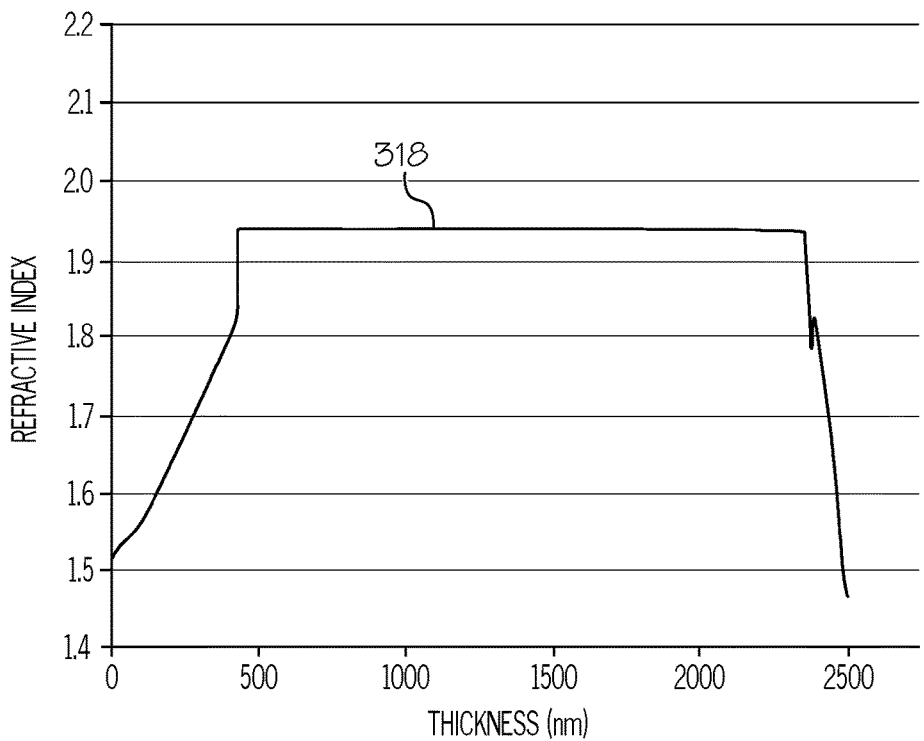
FIG. 31 graphically depicts the calculated refractive index of the coating of FIG. 29, according to one or more embodiments described herein.

FIG. 29 depicts the flow rates of $N_2$ (shown as reference number 306), $O_2$ (shown as reference number 304), and $SiH_4$ (shown as reference number 302) as a function of time that were utilized to deposit the coating. The deposition scheme of FIG. 29 was utilized to create an optical coating with a 500 nm lower gradient layer (morph=3), a 1800 nm scratch-resistant layer, and a 126 nm upper gradient layer. FIG. 30 depicts the XPS composition profile formed by the conditions of FIG. 29, where reference number 308 represents nitrogen, reference number 310 represents silicon, reference number 312 represents aluminum, reference number 314 represents oxygen, and reference number 316 represents fluorine. It should be noted that in FIG. 29, the lower gradient layer is on the left-hand portion of the figure, and the upper gradient layer is on the right-hand side of the figure, whereas in FIG. 29, the lower gradient layer is on the right-hand portion of the figure, and the upper gradient layer is on the left-hand side of the figure. FIG. 31 depicts the calculated refractive index for the coating by the deposition conditions of FIG. 29. The refractive index was calculated from MFC flows to a fit in index versus gas flows obtained from intermediate compositions from the hard $SiN_x$ layer to silica. It should be understood that the deposition as shown in FIG. 29 is the base case for Example 2, and if not specifically stated otherwise, when one parameter of the coating of Example 2 is modified, all other parameters are held consistent with the coating of FIG. 29.

Figure 14:
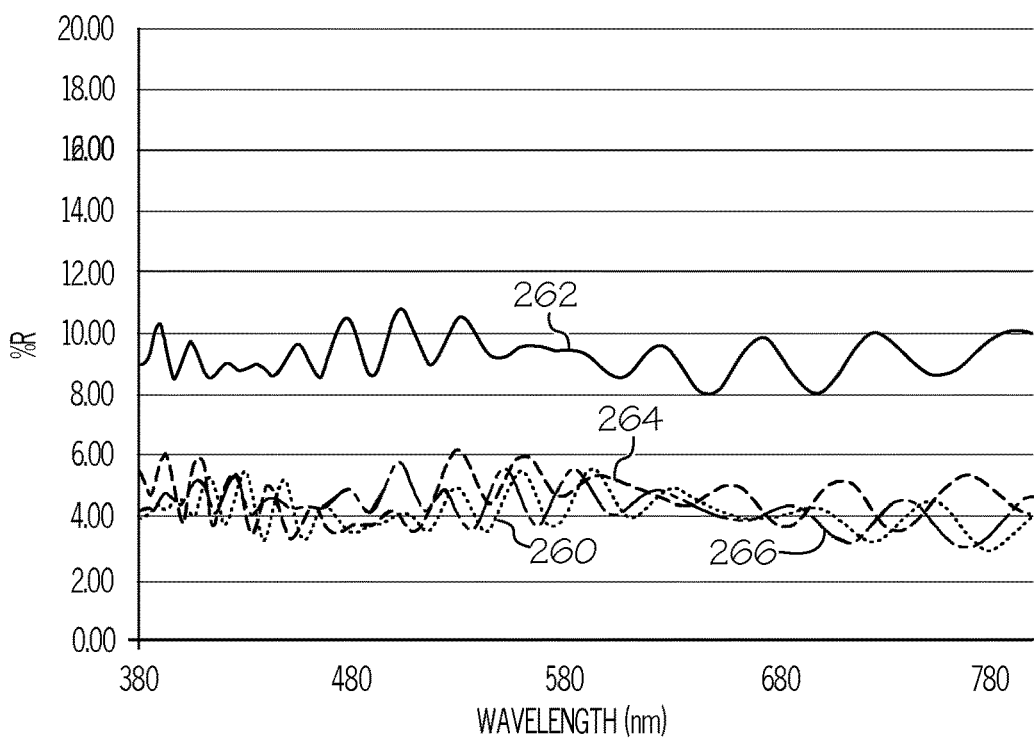
FIG. 14 depicts a graph of first surface reflectance for the optical coating of Example 2 for varying viewing angles, according to one or more embodiments described herein.

FIG. 14 depicts a graph of first surface reflectance for the optical coating of Example 2 (as deposited by the conditions of FIG. 29) for varying viewing angles, where line 260 represents reflection at a 6 degree angle of incidence, line 262 represents reflection at a 20 degree angle of incidence, line 264 represents reflection at a 40 degree angle of incidence, and line 266 represents reflection at a 60 degree angle of incidence. It can be observed that the gradient structure produces a relatively featureless reflectivity curve which looks very similar to bare glass in both intensity of reflectance and shape of the reflectivity as a function of wavelength. Also noted is the small variation of reflectivity as a function of viewing angle. Unlike non-gradient dielectric stack designs, there is no shift in pass-band to change color with viewing angle. The ~2% ripple in the reflectance is believed to result from the step change in refractive index at the gradient/hard layer interfaces. This step change can be eliminated by many methods, most obvious of which is additional oxygen mass flow controllers to span the range of flow required.

Figure 32:
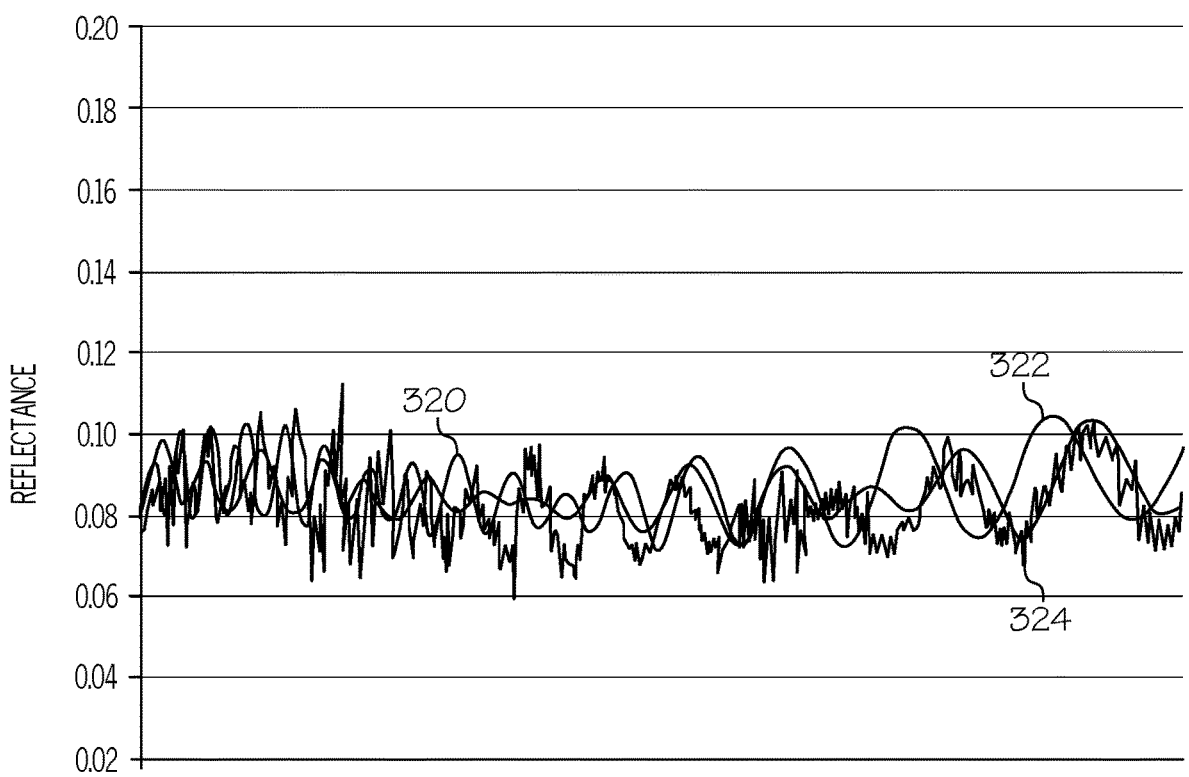
FIG. 32 graphically depicts reflectance as a function of wavelength for varying lower gradient layer thickness, according to one or more embodiments described herein.

Samples were prepared with varying lower gradient layer thickness, where the scratch resistant layer was maintained at 1800 nm and the upper gradient layer was maintained at 126 nm. FIG. 32 depicts reflectance as a function of wavelength, where reference number 320 represents a 750 nm lower gradient layer, reference number 324 represents a 500 nm lower gradient layer, and reference number 322 represents a 250 nm lower gradient layer. Little change in reflectance or ripple is observed changing the impedance match gradient thickness from 250 to 750 nm.

Figure 33:
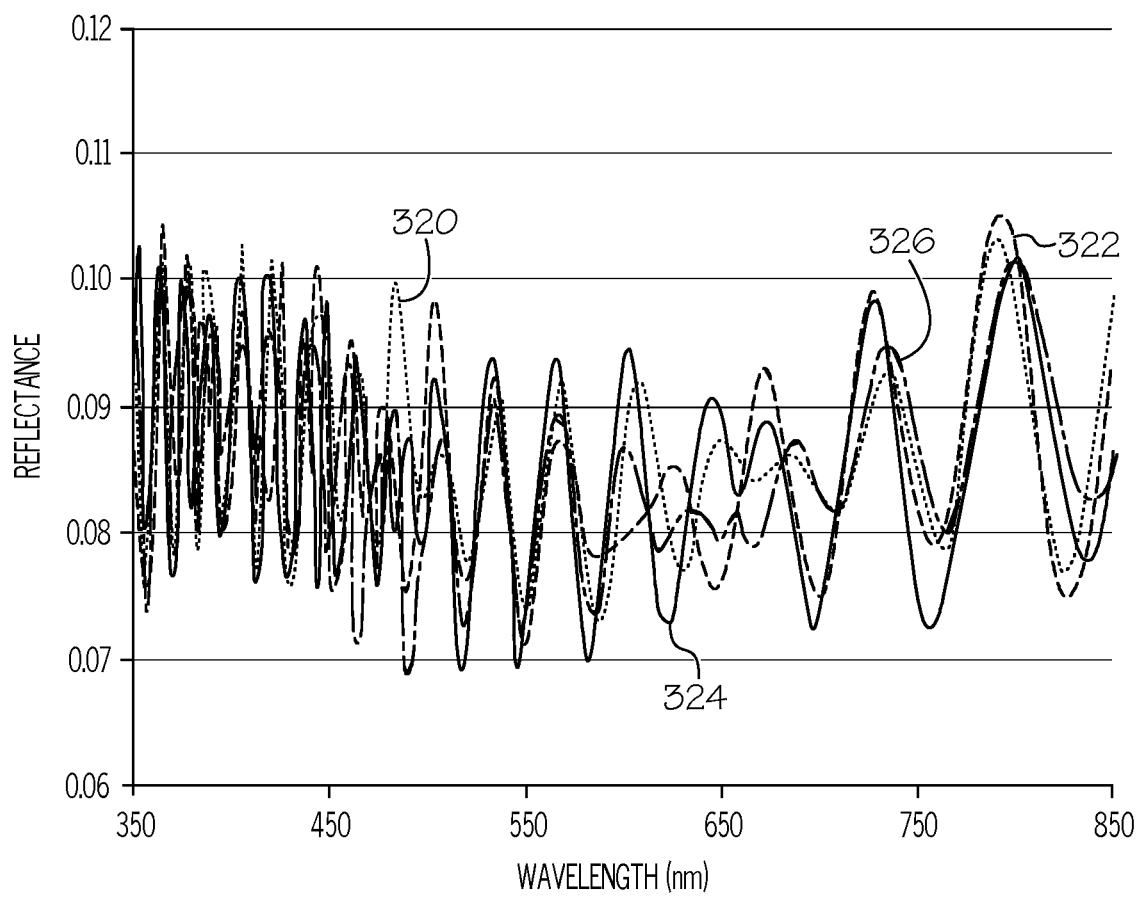
FIG. 33 graphically depicts reflectance as a function of wavelength for varying lower gradient layer profile shapes, according to one or more embodiments described herein.

Optimum gradient structures typically use a quantic profile resembling a sigmoid function. Sigmoid-like index profiles in the impedance match gradient were generated by appending two power law gradients with inverse morph parameters. Samples were prepared with varying gradient curves for a lower gradient layer of 500 nm. FIG. 33 shows reflectance as a function of wavelength, where reference number 326 represents a third order polynomial fit gradient, reference number 324 represents a 2-step sigmoid-like shape produced by appending the power law profile with a second order curve, reference number 322 represents a 2-step sigmoid-like shape produced by appending the power law profile with a third order curve, reference number 320 represents a 2-step sigmoid-like shape produced by appending the power law profile with a fifth order curve. The various gradient shapes produces relatively similar reflectance.

Figure 15:
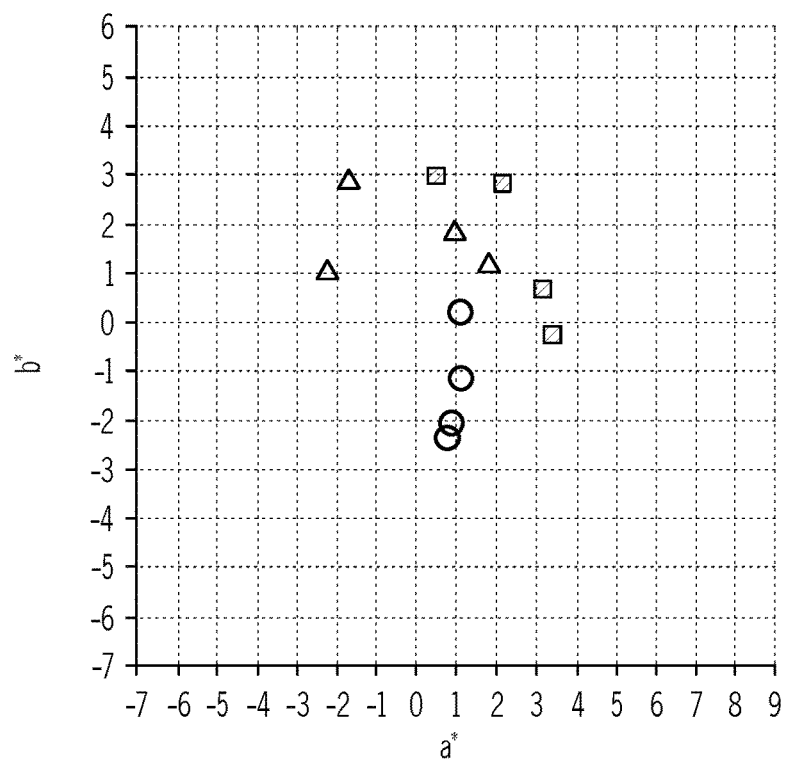
FIG. 15 depicts a graph of a* versus b* of reflected D65 color in L*a*b* color space for the optical coatings of Example 2 having varying top gradient coating thicknesses at different viewing angles, according to one or more embodiments described herein.
Figure 16:
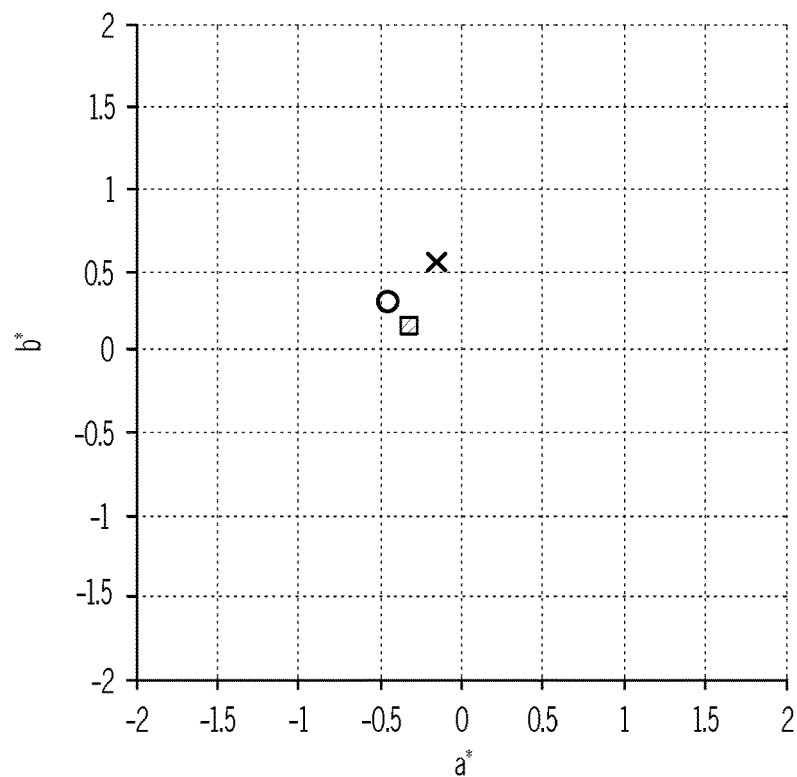
FIG. 16 depicts a graph of a* versus b* of transmitted D65 color in L*a*b* color space for the optical coatings of Example 2 having varying top gradient coating thicknesses at a normal viewing angle, according to one or more embodiments described herein.
Figure 34A:
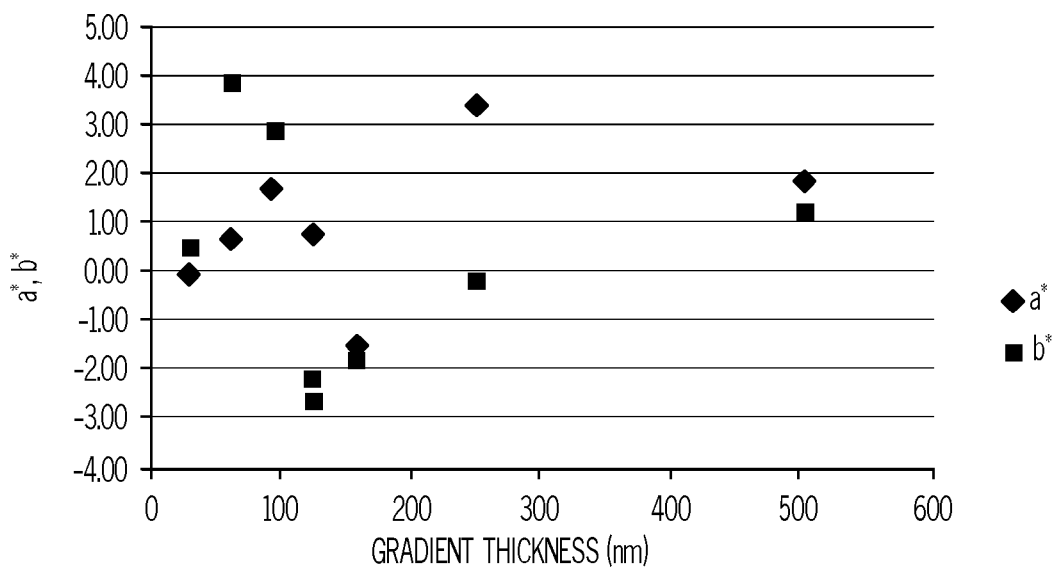
FIGS. 34A and 34B graphically depict reflectance color and transmission color, respectively, as a function of varying upper gradient layer thickness, according to one or more embodiments described herein.
Figure 34B:
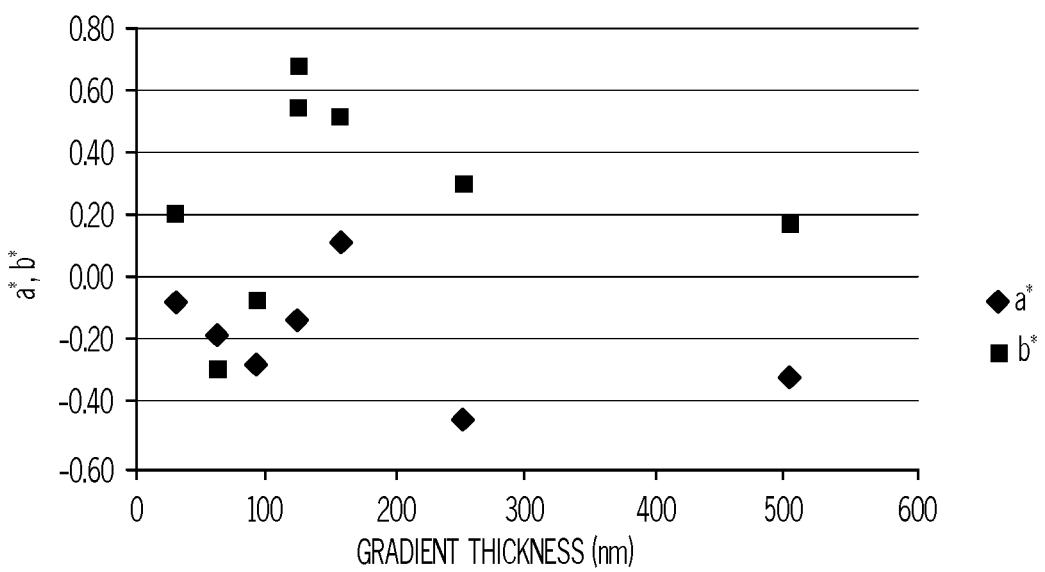
Figure 35:
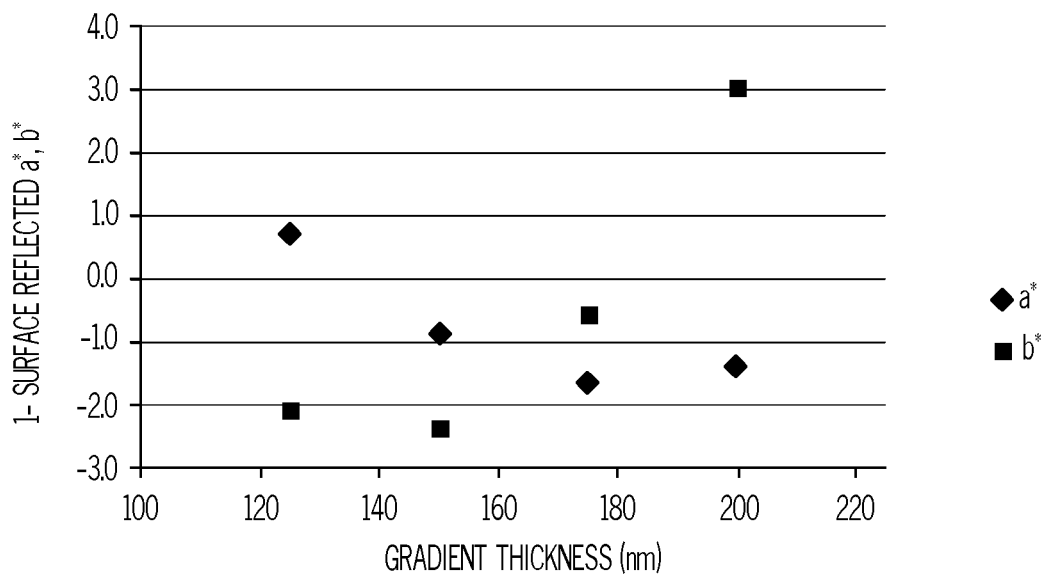
FIG. 35 graphically depicts the 1-surface reflected color of a coating as a function of top gradient thickness, according to one or more embodiments described herein.
Figure 36:
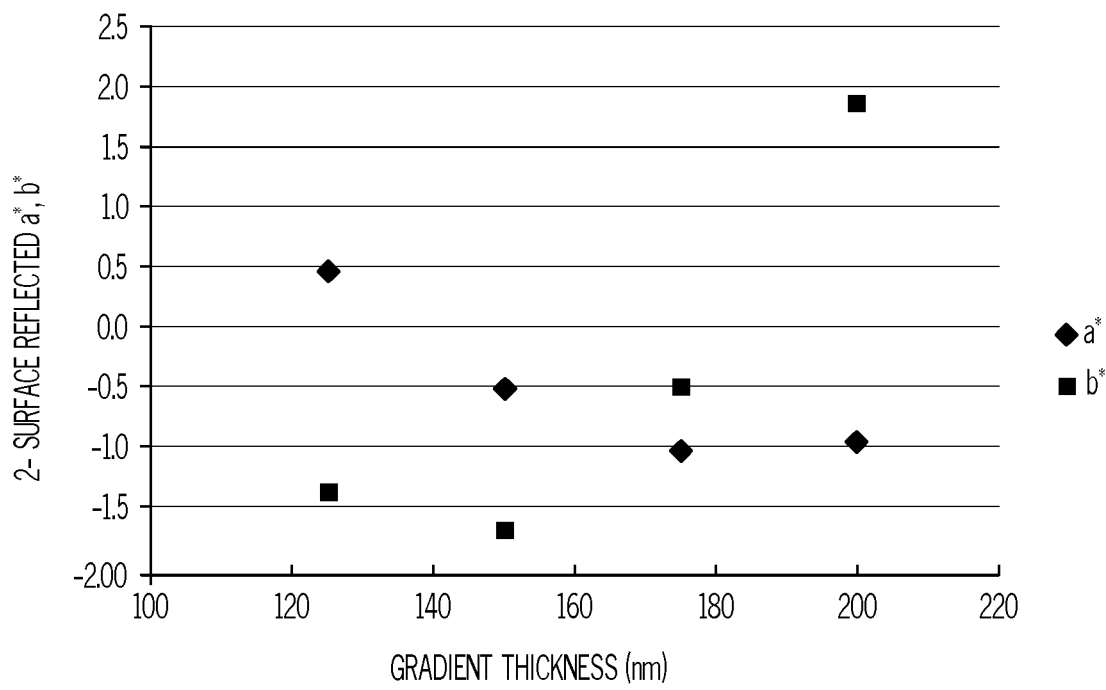
FIG. 36 graphically depicts the 2-surface reflected color of a coating as a function of top gradient thickness, according to one or more embodiments described herein.
Figure 37:
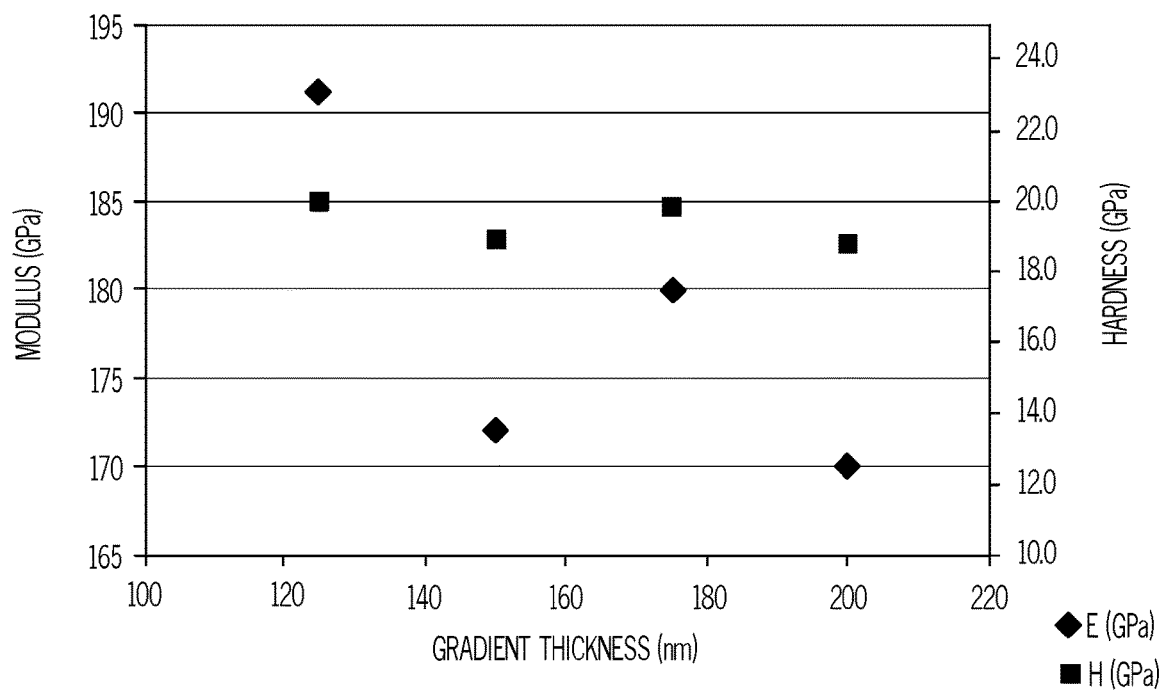
FIG. 37 graphically depicts the modulus and hardness of a coating as a function of top gradient thickness, according to one or more embodiments described herein.
Figure 38:
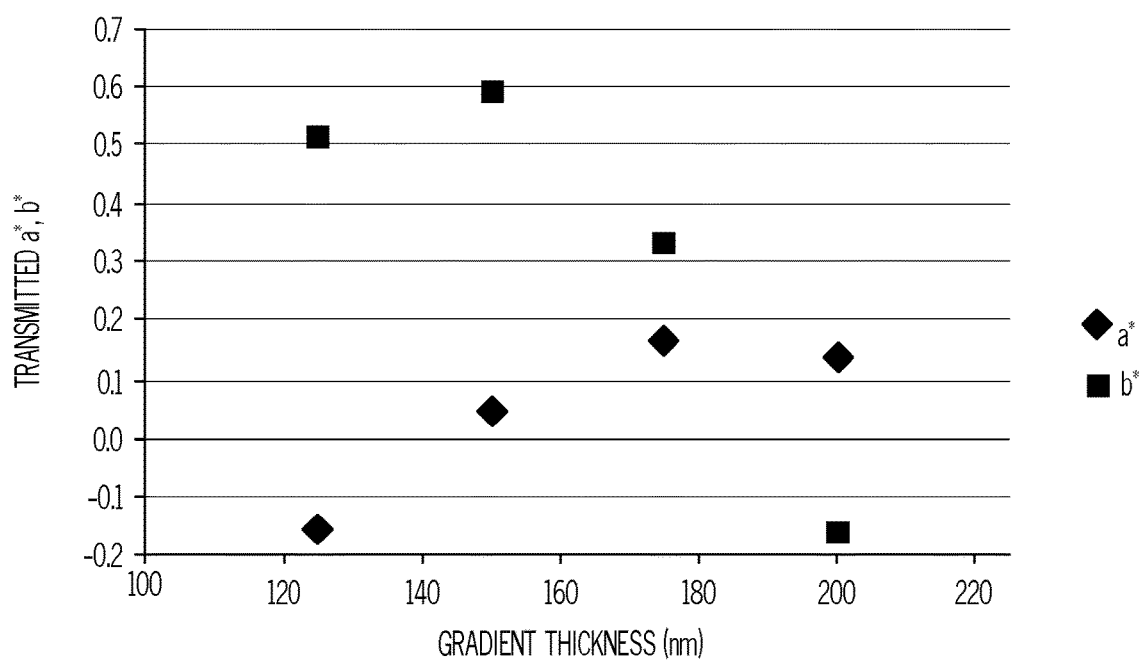
FIG. 38 graphically depicts the transmitted color of a coating as a function of top gradient thickness, according to one or more embodiments described herein.

FIG. 15 depicts a graph of a* versus b* of reflected D65 color in L*a*b* color space for the optical coatings of Example 2 having varying top gradient coating thicknesses at different viewing angles. The open circles represent the samples having a 126 nm upper gradient layer, the squares represent samples having a 256 nm upper gradient layer, and the triangles represent samples having a 504 nm thickness. Each circle, triangle, or square represents a different viewing angle (i.e., 6 degrees, 20 degrees, 40 degrees, or 60 degrees). FIG. 16 depicts a graph of a* versus b* of transmitted D65 color in L*a*b* color space for the optical coatings of Example 2 having varying top gradient coating thicknesses at a normal viewing angle. The "x" represent the samples having a 126 nm upper gradient layer, the diamond represent samples having a 256 nm upper gradient layer, and the square represent samples having a 504 nm thickness. Thinner upper gradient layers resulted in more color neutral coatings in several samples. FIGS. 34A and 34B show first surface reflectance color and transmission color, respectively, for varying gradient thickness. The overall variation in b* is larger than a*. The most neutral color points are obtained with the thinner top coating gradient layers.

FIGS. 35-38 depict the 1-surface reflected color, 2-surface reflected color, modulus and hardness, and transmitted color as a function of top coating gradient thickness, respectively.

It can be seen that if a target of −2≤a*≤0; −4≤b*≤0 for 1-surface reflectance, and −0.4≤a*≤0.4; 0≤b*≤0.5 for transmittance is desired, a upper gradient layer thickness of about 160-180 nm may achieve these optical parameters.

Figure 17:
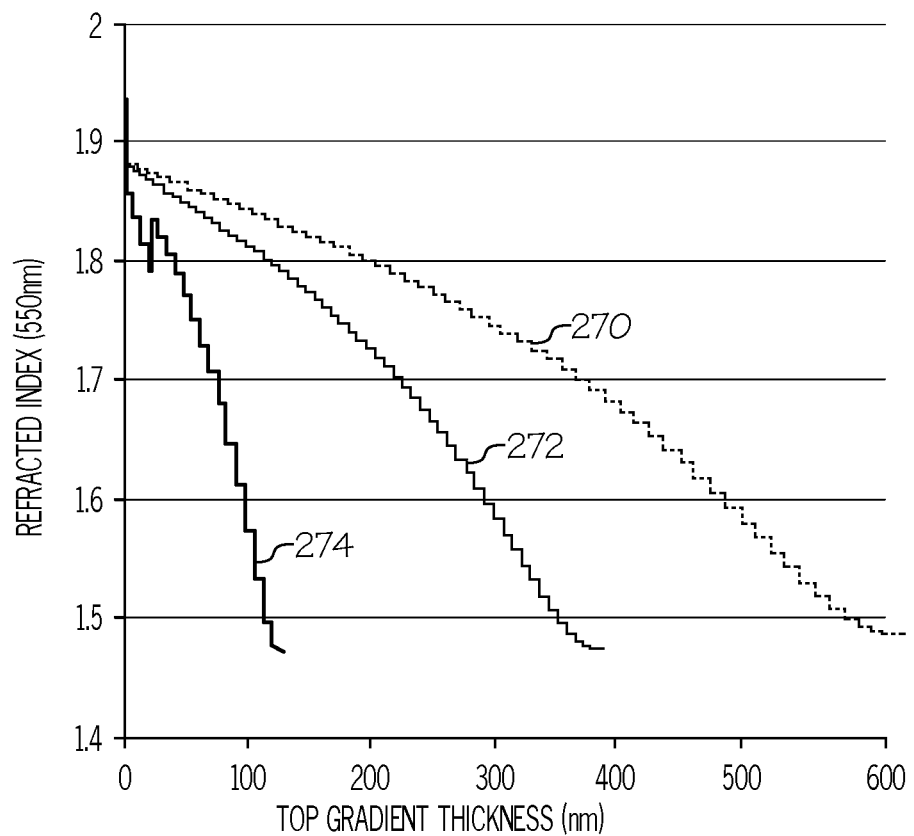
FIG. 17 depicts a graph of the upper gradient layer profiles for the coating of Example 2, according to one or more embodiments described herein.

FIG. 17 shows calculated refractive index of the upper gradient layer as a function of thickness for a 126 nm thickness (reference number 274), a 256 nm thickness (reference number 272), and a 504 nm thickness (reference number 270).

Figure 18:
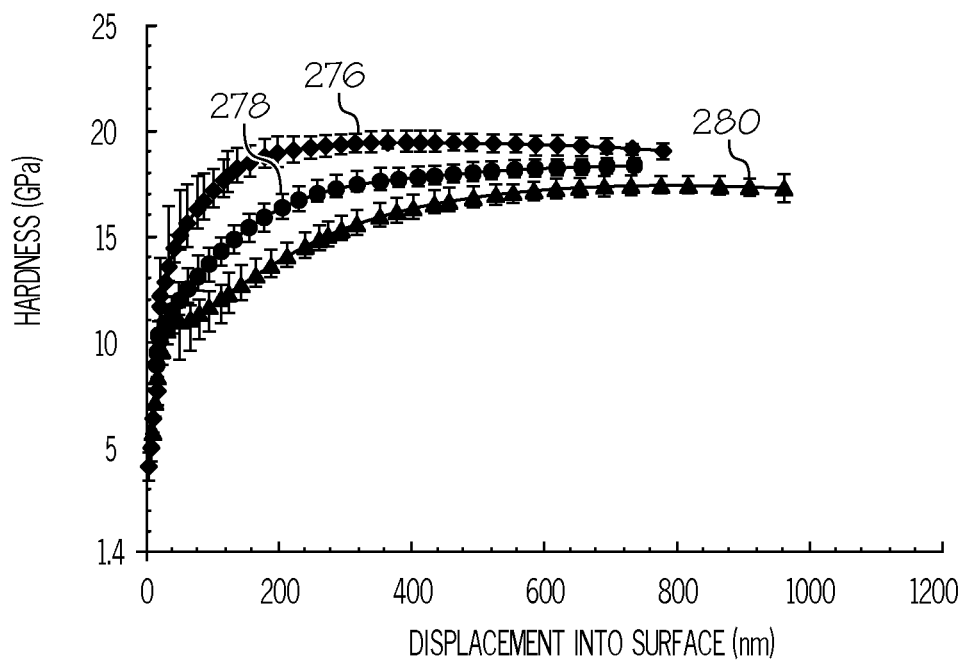
FIG. 18 depicts the hardness profiles of samples prepared as Example 2 with varying upper gradient layer thickness, according to one or more embodiments described herein.

FIG. 18 depicts the Berkovich hardness profiles of samples prepared with varying upper gradient layer thickness. Line 276 represents the hardness profile for a sample with a 126 nm upper gradient layer, line 278 represents the hardness profile for a sample with a 256 nm upper gradient layer, and line 280 represents the hardness profile for a sample with a 504 nm upper gradient layer. Thinner upper gradient layers resulted in increased hardness. Table 4 shows the modulus and hardness as a function of changing upper gradient layer thickness.

TABLE 4

| Upper gradient layer Thickness (nm) | Modulus (GPa) | Hardness (GPa) |
| --- | --- | --- |
| 32 | 189 | 19.8 |
| 63 | 189 | 19.9 |
| 94 | 189 | 19.7 |
| 126 | 180 | 19.6 |
| 158 | 171 | 19.1 |
| 252 | 164 | 18.4 |
| 504 | 153 | 17.5 |

Figure 19:
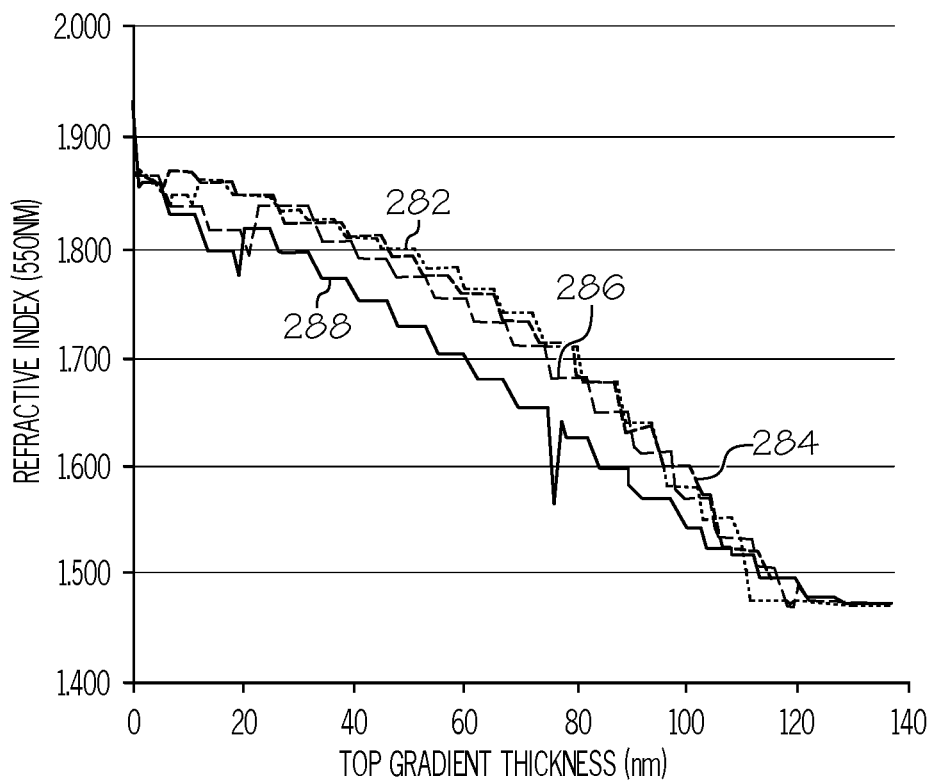
FIG. 19 depicts a graph of the upper gradient layer profiles for the coating of Example 2 with varying morph parameter, according to one or more embodiments described herein.
Figure 20:
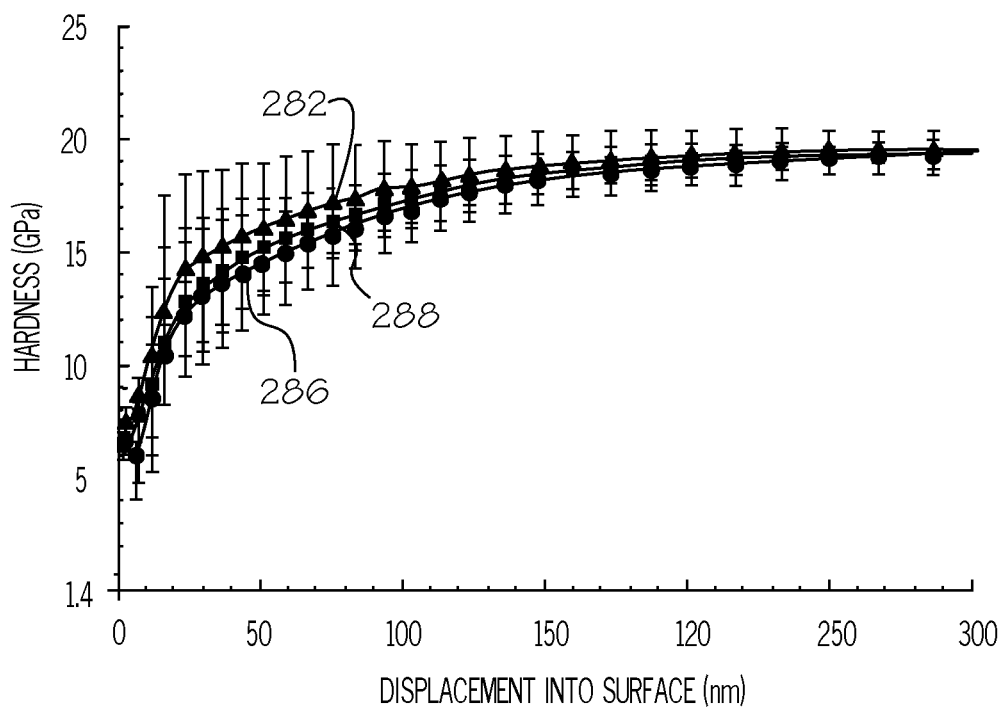
FIG. 20 depicts the hardness profiles of samples prepared as Example 2 with varying upper gradient layer morph parameters, according to one or more embodiments described herein.

Samples were produced with coatings described above with 126 nm upper gradient layers having varying morph parameters. FIG. 19 depicts a graph of the upper gradient layer profiles for the coating of Example 2 with varying morph parameter, and FIG. 20 depicts the hardness profiles of samples prepared as Example 2 with varying upper gradient layer morph parameters. In FIGS. 19 and 20, lines marked 282 represent a morph parameter of 0.2, lines marked 284 represent a morph parameter of 0.5, lines marked 286 represent a morph parameter of 0.3, lines marked 288 represent a morph parameter of 0.5. Less linear morph parameters resulted generally in increased hardness. Table 5 shows the modulus and hardness as a function of changing morph parameter.

TABLE 5

| Morph parameter | Modulus (GPa) | Max Berkovich Hardness (GPa) |
| --- | --- | --- |
| 0.2 | 182 | 19.4 |
| 0.25 | 178 | 19.4 |
| 0.3 | 182 | 19.6 |
| 0.5 | 174 | 19 |

Figure 21:
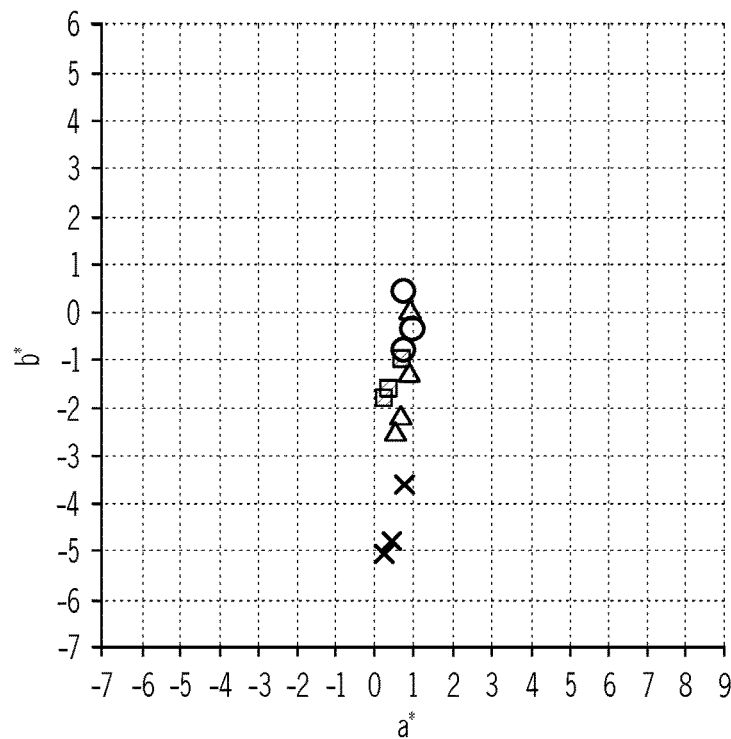
FIG. 21 depicts a graph of a* versus b* of reflected D65 color in L*a*b* color space for the optical coatings of Example 2 having varying top gradient morph parameters at different viewing angles, according to one or more embodiments described herein.
Figure 22:
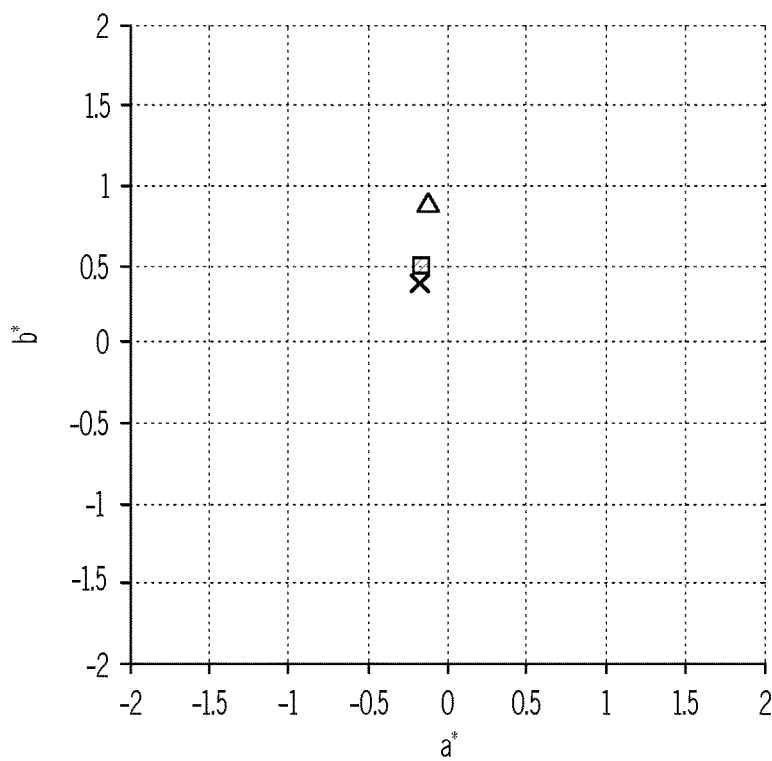
FIG. 22 depicts a graph of a* versus b* of transmitted D65 color in L*a*b* color space for the optical coatings of Example 2 having varying top gradient coating morph parameters at a normal viewing angle, according to one or more embodiments described herein.

FIG. 21 depicts a graph of a* versus b* of reflected D65 color in L*a*b* color space for the optical coatings of Example 2 having varying top gradient morph parameters at different viewing angles, and FIG. 22 depicts a graph of a* versus b* of transmitted D65 color in L*a*b* color space for the optical coatings of Example 2 having varying top gradient coating morph parameters at a normal viewing angle, according to one or more embodiments described herein. In FIG. 21, the open circles represent a morph parameter of 0.2, the squares represent a morph parameter of 0.25, the triangles represent a morph parameter of 0.3, and the "x" represents a morph parameter of 0.5. In FIG. 22, the "x" represents a morph parameter of 0.2, the diamond represents a morph parameter of 0.25, the square represents a morph parameter of 0.3, and the triangle represents a morph parameter of 0.5.

Figure 23:
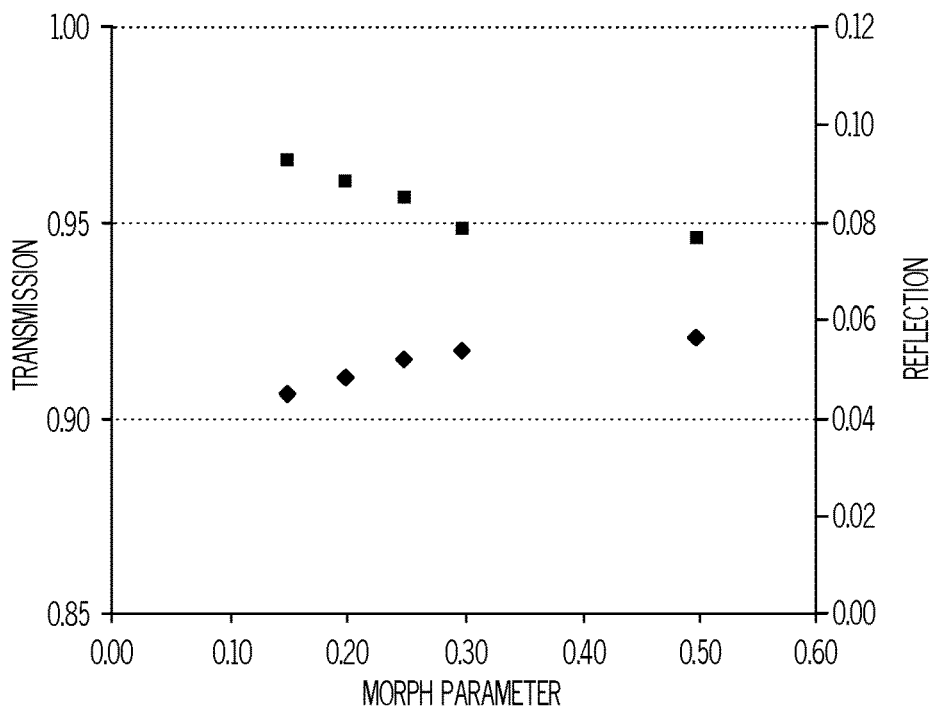
FIG. 23 graphically depicts the average photopic transmittance and the average photopic reflection for the coatings of Example 2 having varying upper gradient layer MORPH parameters, according to one or more embodiments described herein.
Figure 24:
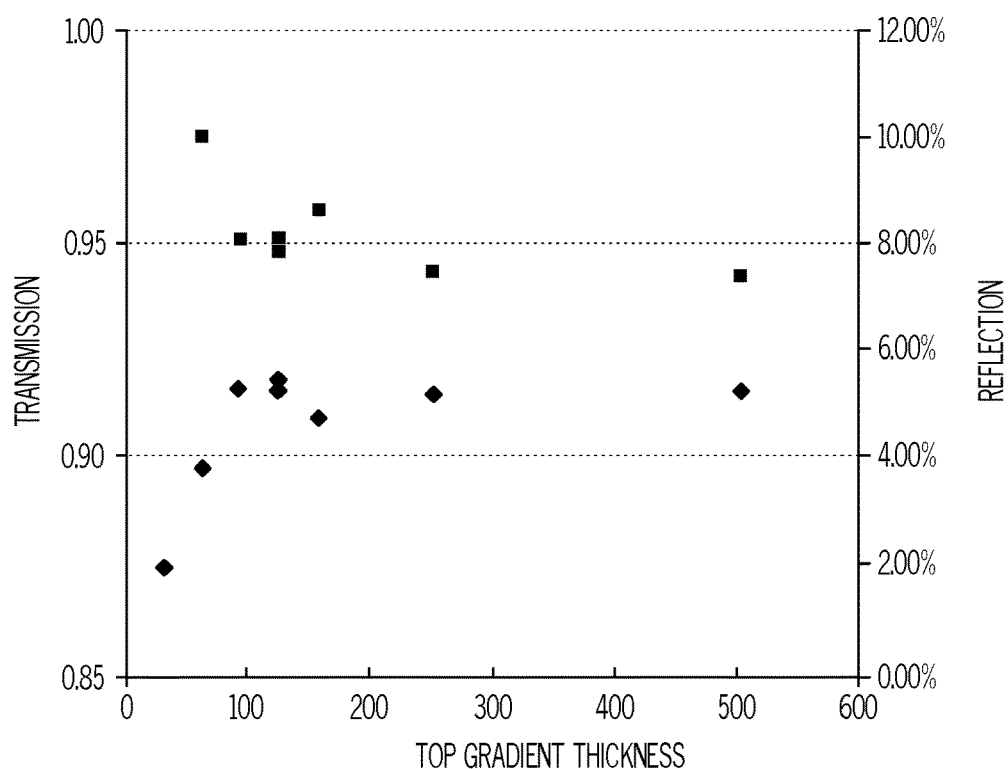
FIG. 24 graphically depicts the average photopic transmittance and the average photopic reflection for the coatings of Example 2 having varying upper gradient layer thicknesses, according to one or more embodiments described herein.
Figure 39:
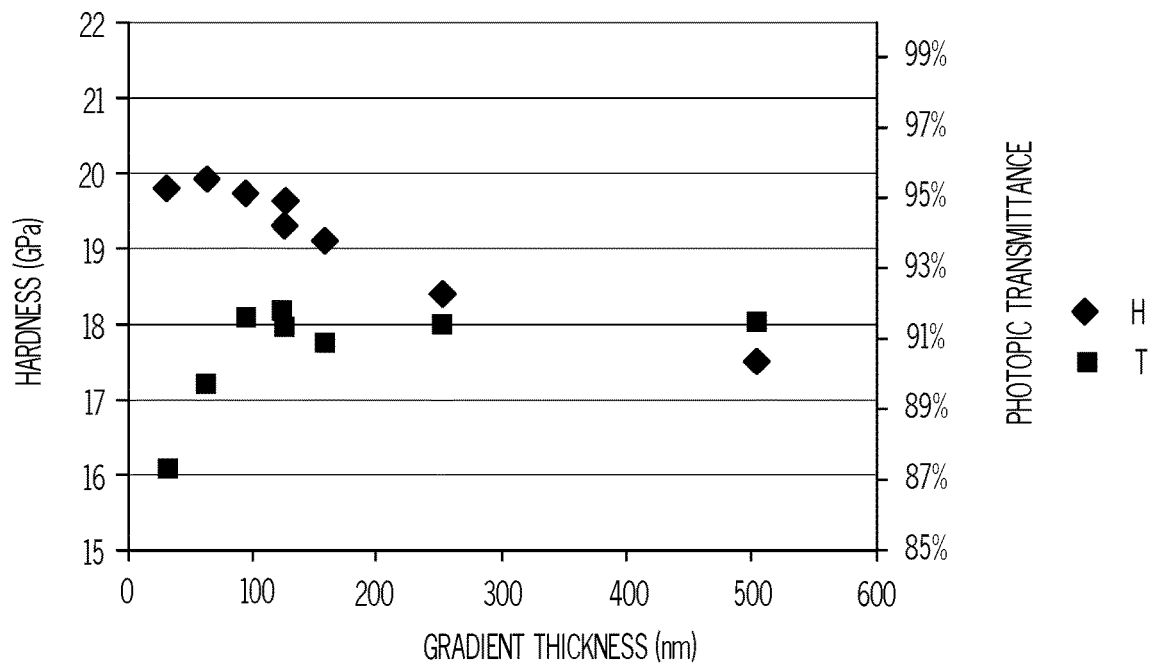
FIG. 39 graphically depicts the hardness and photopic transmittance of the coated article of Example 2

FIG. 23 graphically depicts the average photopic transmittance and the average photopic reflection for the coatings of Example 2 having varying upper gradient layer morph parameters, and FIG. 24 graphically depicts the average photopic transmittance and the average photopic reflection for the coatings of Example 2 having varying upper gradient layer thicknesses. In both FIGS. 23 and 24, squares represent average photopic reflectance over a 400 nm to 780 nm spectrum, and diamonds represent average photopic transmittance over a 400 nm to 780 nm spectrum. Additionally, FIG. 39 graphically depicts the hardness and 2-surface photopic transmittance of the coatings of Example 2 as a function of changing top gradient thickness. As shown in FIG. 39, certain embodiments have hardness of near 20 GPa (more than twice that of some ion-exchanged glass substrates) while having photopic transmittance of over 90%, near that of bare glass.

Example 3

A coating was deposited onto a glass substrate which contained a six layer impedance match stack, a 2000 nm scratch-resistant coating, and a 126 nm upper gradient layer. Thus, the coating of Example 3 was similar to that of Example 2 with the exception that the lower gradient layer of Example 2 was replaced with a discrete layer stack in Example 3. The coating of Example 3 is shown in Table 6. The coating was deposited by a sputtering technique.

TABLE 6

| Material | refractive index at 550 nm | thickness (nm) |
| --- | --- | --- |
| Glass | 1.505 | N/A |
| SiAlON | 2.007 | 6.8 |
| SiO$_2$ | 1.49 | 53.7 |
| SiAlON | 2.007 | 22.6 |
| SiO$_2$ | 1.49 | 29.6 |
| SiAlON | 2.007 | 40.5 |
| SiO$_2$ | 1.49 | 8.5 |
| SiAlON | 2.007 | 2000 |
| SiAlON → SiO$_2$ | gradient | 126 |
| air | 1 | N/A |

Figure 40:
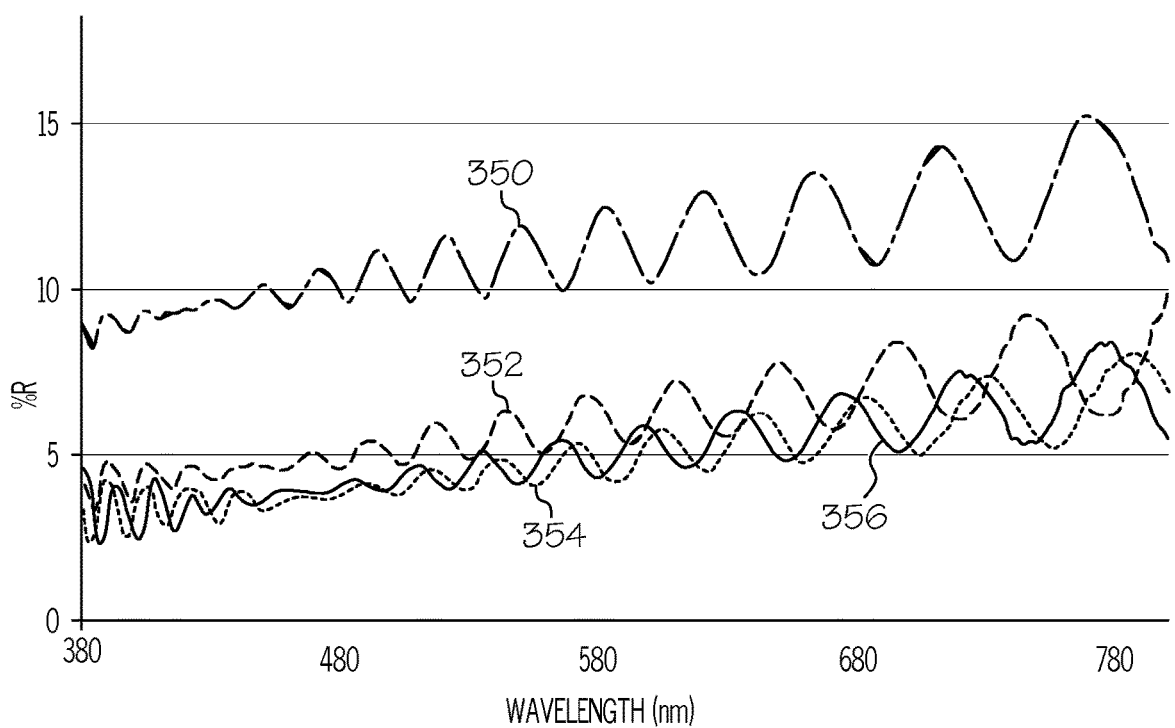
FIG. 40 depicts a graph of reflectance as a function of wavelength for the optical coating of Example 3 with changing viewing angles relative to normal, according to one or more embodiments described herein.
Figure 42:
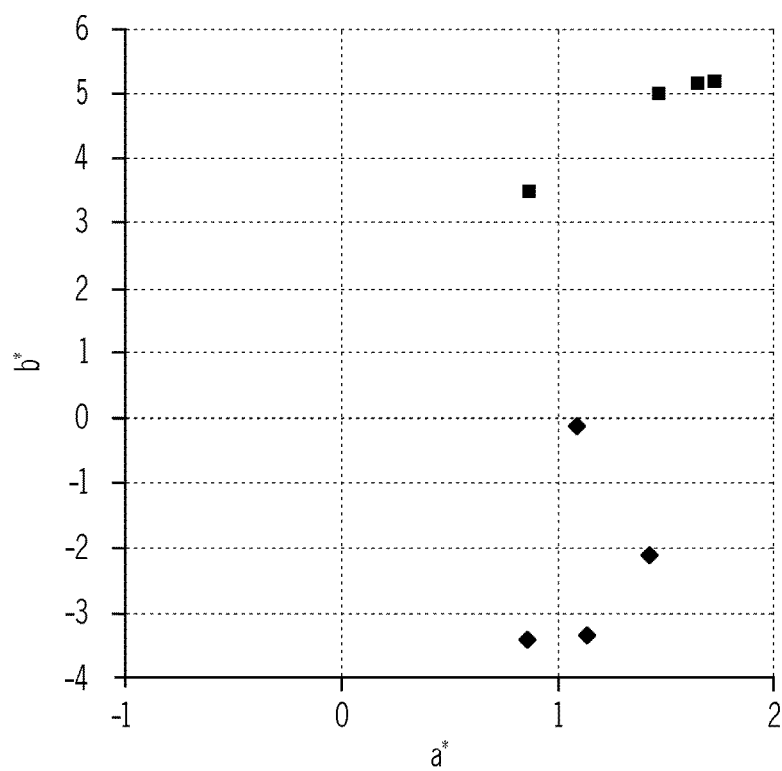
FIG. 42 graphically depicts a* and b* with varying viewing angles of incidence for the coating of Examples 3 and 4, according to one or more embodiments described herein.

FIG. 40 depicts the reflectance of the coating of Example 3 as a function of wavelengths at varying viewing angles of incidence, where reference number 354 represents a 6 degree angle of incidence, reference number 356 represents a 20 degree angle of incidence, reference number 352 represents a 40 degree angle of incidence, and reference number 350 represents a 60 degree angle of incidence. FIG. 42 shows the a* and b* first surface reflective color coordinates (as squares) for the coated article of Example 34 at 6 degrees, 20 degrees, 40 degrees and 60 degrees angle of incidence. The coated article of Example 3 had a transmitted color coordinate of about a*=−0.25 and b*=−0.25.

Example 4

A coating was deposited onto a glass substrate which contained a six layer impedance match stack, a 2000 nm scratch-resistant coating, and a 126 nm upper gradient layer. Thus, the coating of Example 4 was similar to that of Example 2 with the exception that the lower gradient layer of Example 2 was replaced with a discrete layer stack in Example 4. Additionally, the coating of Example 4 is similar to that of Example 3 with the exception of the utilized coating materials. The coating of Example 4 is shown in Table 7. The coating was deposited by PECVD.

TABLE 7

| Material | refractive index at 550 nm | thickness (nm) |
| --- | --- | --- |
| Glass | 1.505 | N/A |
| $SiN_x$ | 1.878 | 6.8 |
| $SiO_2$ | 1.49 | 53.7 |
| $SiN_x$ | 1.878 | 22.6 |
| $SiO_2$ | 1.49 | 29.6 |
| $SiN_x$ | 1.878 | 40.5 |
| $SiO_2$ | 1.49 | 8.5 |
| $SiN_x$ | 1.878 | 2000 |
| $SiN_x \rightarrow SiO_2$ | gradient | 126 |
| air | 1 | N/A |

Figure 41:
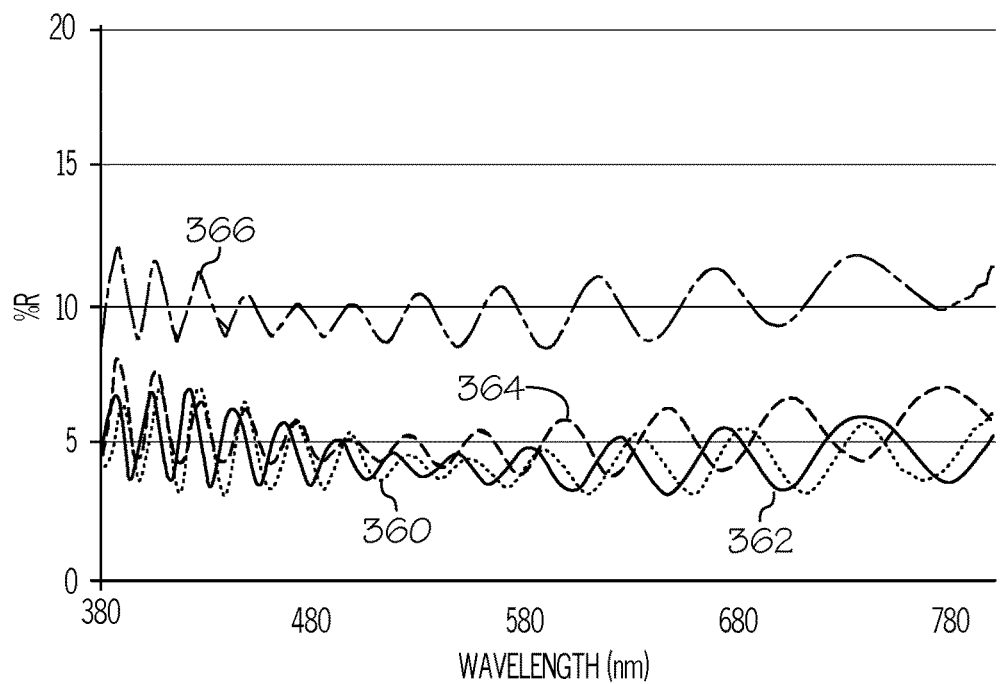
FIG. 41 graphically depicts reflectance as a function of wavelength for the optical coating of Example 4 with changing viewing angles relative to normal, according to one or more embodiments described herein.

FIG. 41 depicts the reflectance of the coating of Example 4 as a function of wavelengths at varying viewing angles of incidence, where reference number 360 represents a 6 degree angle of incidence, reference number 362 represents a 20 degree angle of incidence, reference number 364 represents a 40 degree angle of incidence, and reference number 366 represents a 60 degree angle of incidence. FIG. 42 shows the a* and b* first surface color coordinates (as diamonds) for the coated article of Example 4 at 6 degrees, 20 degrees, 40 degrees and 60 degrees angle of incidence. The coated article of Example 4 had a transmitted color coordinate of about a*=−0.2 and b*=0.7.

Table 8 reports hardness, modulus, photopic transmittance, and photopic reflectance for the coated articles of three sample coatings. Sample Coatings A and B have a conventional 6-layer impedance match stack, 2 micron hard coating, and ~125 nm thick AR gradient. Coating sample A was deposited by CVD on the Plasma-Therm HDPCVD with SiO2-SiON—SiNx material system. Coating sample B was deposited by sputtering on the AJA using SiAlON—SiO2 material system. Coating sample C has a 250 nm thick impedance match gradient, 2 um hard coating, and 125 nm thick AR gradient. was deposited by CVD on the Plasma-Therm HDPCVD with SiO2-SiON—SiNx material system. Performance was nearly identical.

TABLE 8

| Coating Sample | E(GPa) | H(GPa) | T(%) | R(%) |
| --- | --- | --- | --- | --- |
| A | 180 | 19 | 0.914 | 0/081 |
| B | 206 | 18.9 | 0.919 | 0.777 |
| C | 176 | 19.4 | 0.918 | 0.079 |

The various features described in the specification may be combined in any and all combinations, for example, as listed in the following embodiments.

Embodiment 1. A Coated Article Comprising:

a substrate having a major surface, the major surface comprising a first portion and a second portion, wherein a first direction that is normal to the first portion of the major surface is not equal to a second direction that is normal to the second portion of the major surface, and the angle between the first direction and the second direction is in a range of from about 10 degrees to about 180 degrees; and an optical coating disposed on at least the first portion and the second portion of the major surface, the optical coating forming an anti-reflective surface, wherein:

the coated article exhibits at the first portion of the substrate and at the second portion of the substrate hardness of about 8 GPa or greater at an indentation depth of about 50 nm or greater as measured on the anti-reflective surface by a Berkovich Indenter Hardness Test;

the coated article exhibits a single side average light reflectance as measured at the anti-reflective surface at the first portion of the substrate of about 8% or less, wherein the single side average light reflectance of the first portion is measured at a first incident illumination angle relative to the first direction, wherein the first incident illumination angle comprises an angle in the range from about 0 degrees to about 60 degrees from the first direction;

the coated article exhibits a single-side average light reflectance as measured at the anti-reflective surface at the second portion of the substrate of about 8% or less, wherein the single side average light reflectance of the second portion is measured at a second incident illumination angle relative to the second direction, wherein the second incident illumination angle comprises an angle in the range from about 0 degrees to about 60 degrees from the second direction; and the single side average light reflectance at the first portion and at the second portion is measured over an optical wavelength regime in a range of from about 400 nm to about 800 nm.

Embodiment 2. The coated article of embodiment 1, wherein the angle between the first direction normal to the first portion and the second direction normal to the second portion is in a range of from about 10 degrees to about 90 degrees.

Embodiment 3. The coated article of embodiment 1 or embodiment 2, wherein:

the first incident illumination angle comprises an angle in the range from about 0 degrees to about 10 degrees from the first direction; and the second incident illumination angle comprises an angle in a range from about 0 degrees to about 10 degrees from the second direction.

Embodiment 4. The coated article of any one of embodiments 1-3, wherein:

the coated article exhibits a single side average light reflectance as measured at the anti-reflective surface at the first portion of the substrate of about 8% or less for all angles in the range from about 0 degrees to about 60 degrees; and the coated article exhibits a single-side average light reflectance as measured at the anti-reflective surface at the second portion of the substrate of about 8% or less for all angles in the range from about 0 degrees to about 60 degrees.

Embodiment 5. The coated article of any one of embodiments 1-4, wherein the coated article exhibits a single side average light reflectance as measured at the anti-reflective surface at the first portion of the substrate of about 5% or less; and the coated article exhibits a single-side average light reflectance as measured at the anti-reflective surface at the second portion of the substrate of about 5% or less.

Embodiment 6. A coated article comprising:

a substrate having a major surface, the major surface comprising a first portion and a second portion, wherein a first direction that is normal to the first portion of the major surface is not equal to a second direction that is normal to the second portion of the major surface, and the angle between the first direction and the second direction is in a range of from about 10 degrees to about 180 degrees; and an optical coating disposed on at least the first portion and the second portion of the major surface, the optical coating forming an anti-reflective surface, wherein:

the coated article exhibits at the first portion of the substrate and at the second portion of the substrate hardness of about 8 GPa or greater at an indentation depth of about 50 nm or greater as measured on the anti-reflective surface by a Berkovich Indenter Hardness Test; and the difference in reflected color of the coated article between the first portion of the substrate and the second portion of the substrate is less than or equal to about 10 as measured by the reflectance color coordinates in the (L*, a*, b*) colorimetry system under an International Commission on Illumination illuminant, wherein the difference in reflected color is defined as $\sqrt{((a^*\text{first portion}-a^*\text{second portion})2+(b^*\text{first portion}-b^*\text{second portion})2)}$, and wherein the reflected color at the first portion is measured at a first incident illumination angle relative to the first direction, wherein the first incident illumination angle comprises an angle in the range from about 0 degrees to about 60 degrees from the first direction, and the reflected color at the second portion is measured at a second incident illumination angle relative to the second direction, wherein the second incident illumination angle comprises an angle in a range from about 0 degrees to about 60 degrees from the second direction.

Embodiment 7. The coated article of embodiment 6, wherein the difference in reflected color of the coated article between the first portion of the substrate and the second portion of the substrate is less than or equal to about 5.

Embodiment 8. The coated article of embodiment 6 or embodiment 7, wherein the angle between the first direction and the second direction is in a range of from about 10 degrees to about 90 degrees Embodiment 9. The coated article of any one of embodiments 6-8, wherein:

the first incident illumination angle comprises an angle in the range from about 0 degrees to about 10 degrees from the first direction; and the second incident illumination angle comprises an angle in a range from about 0 degrees to about 10 degrees from the second direction.

Embodiment 10. The coated article of any one of embodiments 6-9, wherein the difference in reflected color of the coated article between the first portion of the substrate and the second portion of the substrate is less than or equal to about 10 for all first incident illumination angles in the range from about 0 degrees to 60 degrees and for all second incident illumination angles in the range from about 0 degrees to about 60 degrees.

Embodiment 11. The coated article of any one of embodiments 6-10, wherein the reference point color at the first portion is about 10 or less and the reference point color at the second portion is about 10 or less, wherein the reference point color at the first portion is measured at the first incident illumination angle and at the second portion is measured at the second incident illumination angle, and wherein the reference point is (a*,b*)=(0,0), (−2,−2), or (−4,−4).

Embodiment 12. The coated article of any one of embodiments 6-10, wherein the reference point color at the first portion is about 5 or less and the reference point color at the second portion is about 5 or less, wherein the reference point color at the first portion is measured at the first incident illumination angle and at the second portion is measured at the second incident illumination angle, and wherein the reference point is (a*,b*)=(0,0), (−2,−2), or (−4,−4).

Embodiment 13. A coated article comprising:

a substrate having a major surface, the major surface comprising a first portion and a second portion, wherein a first direction that is normal to the first portion of the major surface is not equal to a second direction that is normal to the second portion of the major surface, and the angle between the first direction and the second direction is in a range of from about 10 degrees to about 180 degrees; and an optical coating disposed on at least the first portion and the second portion of the major surface, the optical coating forming an anti-reflective surface, wherein:

the coated article exhibits at the first portion of the substrate and at the second portion of the substrate hardness of about 8 GPa or greater at an indentation depth of about 50 nm or greater as measured on the anti-reflective surface by a Berkovich Indenter Hardness Test; and the difference in reflected color of the coated article between the first portion of the substrate and the second portion of the substrate is less than or equal to about 10 as measured by the reflectance color coordinates in the (L*, a*, b*) colorimetry system under an International Commission on Illumination illuminant, wherein the difference in reflected color is defined as $\sqrt{((a^*\text{first portion}-a^*\text{second portion})2+(b^*\text{first portion}-b^*\text{second portion})2)}$, and wherein the reflected color at the first portion is measured at a first incident illumination angle relative to the first direction, wherein the first incident illumination angle comprises an angle in the range from about 0 degrees to about 60 degrees from the first direction, and the reflected color at the second portion is measured at a second incident illumination angle, wherein the second incident illumination angle is in a direction equal to the direction of the first incident illumination angle such that the reflected color at the first portion and at the second portion are measured in the same viewing direction.

Embodiment 14. The coated article of any of embodiments 1-13, wherein the first incident illumination angle comprises an angle in the range from about 0 degrees to 10 degrees from the first direction.

Embodiment 15. The coated article of any of embodiments 1-14, wherein the substrate comprises an amorphous substrate or a crystalline substrate.

Embodiment 16. The coated article of any of embodiments 1-15, wherein the optical coating comprises a first gradient layer in contact with the substrate, a scratch-resistant layer over the first gradient layer, and a second gradient layer over the scratch-resistant layer which defines the anti-reflective surface, wherein:

the refractive index of the first gradient layer at the substrate is within 0.2 of the refractive index of the substrate;

the refractive index of the first gradient layer at the scratch-resistant layer is within 0.2 of the refractive index of the scratch-resistant layer;

the refractive index of the second gradient layer at the scratch-resistant layer is within 0.2 of the refractive index of the scratch-resistant layer; and the refractive index of the second gradient layer at the anti-reflective surface is from about 1.35 to about 1.7.

Embodiment 17. The coated article of any of embodiments 1-15, wherein the optical coating comprises a first anti-reflective coating, a scratch-resistant layer over the first anti-reflective coating, and a second anti-reflective coating over the scratch-resistant layer which defines the anti-reflective surface, wherein the first anti-reflective coating comprises at least a low RI layer and a high RI layer, and the second anti-reflective coating comprises at least a low RI layer and a high RI layer.

Embodiment 18. The coated article of any of embodiments 1-15, wherein the optical coating comprises a gradient layer in contact with the substrate, a scratch-resistant layer over the gradient layer, and an anti-reflective coating over the scratch-resistant layer which defines the anti-reflective surface, wherein:

the refractive index of the gradient layer at the substrate is within 0.2 of the refractive index of the substrate;

the refractive index of the gradient layer at the scratch-resistant layer is within 0.2 of the refractive index of the scratch-resistant layer; and the anti-reflective coating comprises at least a low RI layer and a high RI layer.

Embodiment 19. The coated article of any of embodiments 1-15, wherein the optical coating comprises an anti-reflective coating in contact with the substrate, a scratch-resistant layer over the anti-reflective coating, and a gradient layer over the scratch-resistant layer which defines the anti-reflective surface, wherein:

the anti-reflective coating comprises at least a low RI layer and a high RI layer;

the refractive index of the anti-reflective coating at the scratch-resistant layer is within 0.2 of the refractive index of the scratch-resistant layer; and the refractive index of the gradient layer at the anti-reflective surface is from about 1.35 to about 1.7.

What is claimed is:

1. A coated article comprising:
a substrate having a major surface, the major surface comprising a first portion and a second portion, wherein a first direction that is normal to the first portion of the major surface is not equal to a second direction that is normal to the second portion of the major surface, and the angle between the first direction and the second direction is in a range of from about 10 degrees to about 180 degrees; and
an optical coating disposed on at least the first portion and the second portion of the major surface, the optical coating forming an anti-reflective surface, wherein:
the coated article exhibits at the first portion of the major surface and at the second portion of the major surface a hardness of about 8 GPa or greater;
the coated article exhibits a photopic reflectance as measured at the anti-reflective surface at the first portion of the major surface of about 2% or less, wherein the photopic reflectance of the first portion is measured at a first incident illumination angle relative to the first direction, wherein the first incident illumination angle comprises an angle in a range from about 0 degrees to about 60 degrees from the first direction;
the coated article exhibits a photopic reflectance as measured at the anti-reflective surface at the second portion of the major surface of about 2% or less, wherein the photopic reflectance of the second portion is measured at a second incident illumination angle relative to the second direction, wherein the second incident illumination angle comprises an angle in a range from about 0 degrees to ab out 60 degrees from the second direction;
the photopic reflectance at the first portion and at the second portion is measured over an optical wavelength regime in a range of from about 400 nm to ab out 800 nm; and
wherein:

the first incident illumination angle comprises an angle in a range from about 0 degrees to about 10 degrees from the first direction; and
the second incident illumination angle comprises an angle in a range from about 0 degrees to about 10 degrees from the second direction.

2. The coated article of claim 1, further comprising:
a difference in reflected color of the coated article between the first portion of the major surface and the second portion of the major surface is less than or equal to about 5 as measured by the reflectance color coordinates in the (L*, a*, b*) colorimetry system under an International Commission on Illumination illuminant, wherein the difference in reflected color is defined as $\sqrt{((a^*_{first\ portion} - a^*_{second\ portion})^2 + (b^*_{first\ portion} - b^*_{second\ portion})^2)}$, and wherein the reflected color at the first portion is measured at a first incident illumination angle relative to the first direction, wherein the first incident illumination angle comprises an angle in a range from about 0 degrees to about 60 degrees from the first direction, and the reflected color at the second portion is measured at a second incident illumination angle, wherein the second incident illumination angle is in a direction equal to the direction of the first incident illumination angle such that the reflected color at the first portion and at the second portion are measured in the same viewing direction.

3. The coated article of claim 1, wherein the angle between the first direction and the second direction is in a range of from about 30 degrees to ab out 180 degrees.

4. The coated article of claim 1, wherein the angle between the first direction and the second direction is in a range of from about 40 degrees to ab out 180 degrees.

5. The coated article of claim 1, wherein the angle between the first direction and the second direction is in a range of from about 50 degrees to ab out 180 degrees.

6. The coated article of claim 1, wherein:
the photopic reflectance as measured at the anti-reflective surface at the first portion of the major surface is about 1% or less; and,
the photopic reflectance as measured at the anti-reflective surface at the second portion of the major surface is about 1% or less.

7. The coated article of claim 6, further comprising:
a difference in reflected color of the coated article between the first portion of the major surface and the second portion of the major surface is less than or equal to about 3 as measured by the reflectance color coordinates in the (L*, a*, b*) colorimetry system under an International Commission on Illumination illuminant, wherein the difference in reflected color is defined as $\sqrt{((a^*_{first\ portion} - a^*_{second\ portion})^2 + (b^*_{first\ portion} - b^*_{second\ portion})^2)}$, and wherein the reflected color at the first portion is measured at a first incident illumination angle relative to the first direction, wherein the first incident illumination angle comprises an angle in a range from about 0 degrees to about 60 degrees from the first direction, and the reflected color at the second portion is measured at a second incident illumination angle relative to the second direction, wherein the second incident illumination angle comprises an angle in a range from about 0 degrees to about 60 degrees from the second direction.

8. The coated article of claim 6, further comprising:
a difference in reflected color of the coated article between the first portion of the major surface and the second portion of the major surface is less than or equal to about 3 as measured by the reflectance color coordinates in the (L*, a*, b*) colorimetry system under an International Commission on Illumination illuminant, wherein the difference in reflected color is defined as $\sqrt{((a^*_{first\ portion}-a^*_{second\ portion})^2+(b^*_{first\ portion}-b^*_{second\ portion})^2)}$, and wherein the reflected color at the first portion is measured at a first incident illumination angle relative to the first direction, wherein the first incident illumination angle comprises an angle in a range from about 0 degrees to about 60 degrees from the first direction, and the reflected color at the second portion is measured at a second incident illumination angle, wherein the second incident illumination angle is in a direction equal to the direction of the first incident illumination angle such that the reflected color at the first portion and at the second portion are measured in the same viewing direction.

9. The coated article of claim 1, wherein the optical coating comprises a first anti-reflective coating, a scratch-resistant layer over the first anti-reflective coating, and a second anti-reflective coating over the scratch-resistant layer which defines the anti-reflective surface, wherein the first anti-reflective coating comprises at least a low RI layer and a high RI layer, and the second anti-reflective coating comprises at least a low RI layer and a high RI layer.

10. The coated article of claim 9, wherein the total thickness of the optical coating is from about 1 µm to about 5 µm, wherein the total thickness of the first anti-reflective coating and the second anti-reflective coating is from about 200 nm to about 800 nm, and further wherein the optical coating comprises a capping layer over the second anti-reflective coating, the capping layer comprising a low RI material.

11. The coated article of claim 9, wherein the total thickness of the at least a low RI layer in the second anti-reflective coating is less than 500 nm, and wherein the total thickness of the at least a high RI layer in the first and the second anti-reflective coating is about 200 nm or greater, and further wherein the total thickness of the second anti-reflective coating is less than or equal to about 1000 nm.

12. The coated article of claim 9, wherein the at least a low RI layer in each of the first and the second anti-reflective coatings comprises silicon oxide, wherein the at least a high RI layer in the first anti-reflective coating comprises silicon oxynitride, wherein the at least a high RI layer in the second anti-reflective coating comprises silicon nitride, and further wherein the scratch-resistant layer comprises silicon oxynitride.

13. The coated article of claim 9, wherein the coated article exhibits a photopic reflectance as measured at the anti-reflective surface at the first portion of the major surface of about 2% or less, wherein the photopic reflectance of the first portion is measured at a first incident illumination angle relative to the first direction, wherein the first incident illumination angle comprises an angle in a range from about 0 degrees to about 60 degrees from the first direction.

14. A coated article comprising:
a substrate having a major surface, the major surface comprising a first portion and a second portion, wherein a first direction that is normal to the first portion of the major surface is not equal to a second direction that is normal to the second portion of the major surface, and the angle between the first direction and the second direction is in a range of from about 10 degrees to about 180 degrees; and an optical coating disposed on at least the first portion and the second portion of the major surface, the optical coating forming an anti-reflective surface, wherein:
the coated article exhibits at the first portion of the major surface and at the second portion of the major surface a hardness of about 8 GPa or greater;
the coated article exhibits a photopic reflectance as measured at the anti-reflective surface at the first portion of the major surface of about 2% or less, wherein the photopic reflectance of the first portion is measured at a first incident illuminati on angle relative to the first direction, wherein the first incident illumination angle comprises an angle in a range from about 0 degrees to about 60 degrees from the first direction;
the coated article exhibits a photopic reflectance as measured at the anti-reflective surface at the second portion of the major surface of about 2% or less, wherein the photopic reflectance of the second portion is measured at a second incident illumination angle relative to the second direction, wherein the second incident illumination angle comprises an angle in a range from about 0 degrees to about 60 degrees from the second direction;
the photopic reflectance at the first portion and at the second portion is measured over an optical wavelength regime in a range of from about 400 nm to about 800 nm; and
the coated article further comprising:
a difference in reflected color of the coated article between the first portion of the major surface and the second portion of the major surface is less than or equal to about 5 as measured by the reflectance color coordinates in the (L*, a*, b*) colorimetry system under an International Commission on Illumination illuminant, wherein the difference in reflected color is defined as $\sqrt{((a^*_{first\ portion}-a^*_{second\ portion})^2+(b^*_{first\ portion}-b^*_{second\ portion})^2)}$, and wherein the reflected color at the first portion is measured at a first incident illumination angle relative to the first direction, wherein the first incident illumination angle comprises an angle in a range from about 0 degrees to about 60 degrees from the first direction, and the reflected color at the second portion is measured at a second incident illumination angle relative to the second direction, wherein the second incident illumination angle comprises an angle in a range from about 0 degrees to about 60 degrees from the second direction.

15. A coated article comprising:
a substrate having a major surface, the major surface comprising a first portion and a second portion, wherein a first direction that is normal to the first portion of the major surface is not equal to a second direction that is normal to the second portion of the major surface, and the angle between the first direction and the second direction is in a range of from about 10 degrees to about 180 degrees; and
an optical coating disposed on at least the first portion and the second portion of the major surface, the optical coating forming an anti-reflective surface, wherein:
the coated article exhibits at the first portion of the major surface and at the second portion of the major surface a hardness of about 8 GPa or greater;
the coated article exhibits a photopic reflectance as measured at the anti-reflective surface at the first portion of the major surface of about 2% or less, wherein the photopic reflectance of the first portion is measured at a first incident illuminati on angle relative to the first direction, wherein the first incident illumination angle comprises an angle in a range from about 0 degrees to about 60 degrees from the first direction;

the coated article exhibits a photopic reflectance as measured at the anti-reflective surface at the second portion of the major surface of about 2% or less, wherein the photopic reflectance of the second portion is measured at a second incident illumination angle relative to the second direction, wherein the second incident illumination angle comprises an angle in a range from about 0 degrees to about 60 degrees from the second direction;

the photopic reflectance at the first portion and at the second portion is measured over an optical wavelength regime in a range of from about 400 nm to about 800 nm; and the optical coating comprises a first gradient layer in contact with the substrate, a scratch-resistant layer over the first gradient layer, and a second gradient layer over the scratch-resistant layer which defines the anti-reflective surface, wherein:

the refractive index of the first gradient layer at the substrate is within 0.2 of the refractive index of the substrate;

the refractive index of the first gradient layer at the scratch-resistant layer is within 0.2 of the refractive index of the scratch-resistant layer;

the refractive index of the second gradient layer at the scratch-resistant layer is within 0.2 of the refractive index of the scratch-resistant layer; and the refractive index of the second gradient layer at the anti-reflective surface is from about 1.35 to about 1.7.

16. A coated article comprising:

a substrate having a major surface, the major surface comprising a first portion and a second portion, wherein a first direction that is normal to the first portion of the major surface is not equal to a second direction that is normal to the second portion of the major surface, and the angle between the first direction and the second direction is in a range of from about 10 degrees to about 180 degrees; and an optical coating disposed on at least the first portion and the second portion of the major surface, the optical coating forming an anti-reflective surface, wherein:

the coated article exhibits at the first portion of the major surface and at the second portion of the major surface a hardness of about 8 GPa or greater;

the coated article exhibits a photopic reflectance as measured at the anti-reflective surface at the first portion of the major surface of about 2% or less, wherein the photopic reflectance of the first portion is measured at a first incident illumination angle relative to the first direction, wherein the first incident illumination angle comprises an angle in a range from about 0 degrees to about 60 degrees from the first direction;

the coated article exhibits a photopic reflectance as measured at the anti-reflective surface at the second portion of the major surface of about 2% or less, wherein the photopic reflectance of the second portion is measured at a second incident illumination angle relative to the second direction, wherein the second incident illumination angle comprises an angle in a range from about 0 degrees to about 60 degrees from the second direction;

the photopic reflectance at the first portion and at the second portion is measured over an optical wavelength regime in a range of from about 400 nm to about 800 nm; and the optical coating comprises a gradient layer in contact with the substrate, a scratch-resistant layer over the gradient layer, and an anti-reflective coating over the scratch-resistant layer which defines the anti-reflective surface, wherein:

the refractive index of the gradient layer at the substrate is within 0.2 of the refractive index of the substrate;

the refractive index of the gradient layer at the scratch-resistant layer is within 0.2 of the refractive index of the scratch-resistant layer; and the anti-reflective coating comprises at least a low RI layer and a high RI layer.

17. A coated article comprising:

a substrate having a major surface, the major surface comprising a first portion and a second portion, wherein a first direction that is normal to the first portion of the major surface is not equal to a second direction that is normal to the second portion of the major surface, and the angle between the first direction and the second direction is in a range of from about 10 degrees to about 180 degrees; and an optical coating disposed on at least the first portion and the second portion of the major surface, the optical coating forming an anti-reflective surface, wherein:

the coated article exhibits at the first portion of the major surface and at the second portion of the major surface a hardness of about 8 GPa or greater;

the coated article exhibits a photopic reflectance as measured at the anti-reflective surface at the first portion of the major surface of about 2% or less, wherein the photopic reflectance of the first portion is measured at a first incident illuminati on angle relative to the first direction, wherein the first incident illumination angle comprises an angle in a range from about 0 degrees to about 60 degrees from the first direction;

the coated article exhibits a photopic reflectance as measured at the anti-reflective surface at the second portion of the major surface of about 2% or less, wherein the photopic reflectance of the second portion is measured at a second incident illumination angle relative to the second direction, wherein the second incident illumination angle comprises an angle in a range from about 0 degrees to about 60 degrees from the second direction;

the photopic reflectance at the first portion and at the second portion is measured over an optical wavelength regime in a range of from about 400 nm to about 800 nm; and the optical coating comprises an anti-reflective coating in contact with the substrate, a scratch-resistant layer over the anti-reflective coating, and a gradient layer over the scratch-resistant layer which defines the anti-reflective surface, wherein:

the anti-reflective coating comprises at least a low RI layer and a high RI layer;

the refractive index of the anti-reflective coating at the scratch-resistant layer is within 0.2 of the refractive index of the scratch-resistant layer; and the refractive index of the gradient layer at the anti-reflective surface is from about 1.35 to about 1.7.

18. A consumer electronic product, comprising:

a housing having a front surface, a back surface and side surfaces;

electrical components at least partially within the housing, the electrical components including at least a controller, a memory, and a display, the display at or adjacent the front surface of the housing; and a cover substrate disposed over the display, wherein at least one of a portion of the housing or the cover substrate comprises the coated article of claim 1.

\* \* \* \* \*